(12) United States Patent
Sato et al.

(10) Patent No.: US 9,059,420 B2
(45) Date of Patent: Jun. 16, 2015

(54) ORGANIC EL ELEMENT WITH LIGHT EXTRACTION AND LIGHT EMISSION EFFICIENCY

(71) Applicant: JX NIPPON OIL & ENERGY CORPORATION, Tokyo (JP)

(72) Inventors: Yusuke Sato, Tokyo (JP); Suzushi Nishimura, Tokyo (JP); Soon Moon Jeong, Tokyo (JP)

(73) Assignee: JX Nippon Oil & Energy Corporation, Tokyo (JP)

( * ) Notice: Subject to any disclaimer, the term of this patent is extended or adjusted under 35 U.S.C. 154(b) by 0 days.

(21) Appl. No.: 14/359,086

(22) PCT Filed: Nov. 7, 2012

(86) PCT No.: PCT/JP2012/078865
§ 371 (c)(1),
(2) Date: May 16, 2014

(87) PCT Pub. No.: WO2013/073434
PCT Pub. Date: May 23, 2013

(65) Prior Publication Data
US 2014/0306213 A1 Oct. 16, 2014

(30) Foreign Application Priority Data

Nov. 18, 2011 (JP) ................................. 2011-253284
Dec. 16, 2011 (JP) ................................. 2011-276059

(51) Int. Cl.
*H01L 51/00* (2006.01)
*H01L 51/50* (2006.01)
(Continued)

(52) U.S. Cl.
CPC ........ *H01L 51/5016* (2013.01); *H01L 51/5275* (2013.01); *G02B 5/1866* (2013.01); *H01L 51/5056* (2013.01); *H01L 51/5072* (2013.01)

(58) Field of Classification Search
None
See application file for complete search history.

(56) References Cited

U.S. PATENT DOCUMENTS

2001/0019242 A1 9/2001 Tada et al.
2006/0065904 A1 3/2006 Uemura et al.
(Continued)

FOREIGN PATENT DOCUMENTS

| JP | 2001-230069 A | 8/2001 |
|----|---------------|--------|
| JP | 2002-324676 A | 11/2002 |
| JP | 2005-063840 A | 3/2005 |
| JP | 2006-528421 A | 12/2006 |

(Continued)

OTHER PUBLICATIONS

International Search Report dated Feb. 12, 2013, issued in International Application PCT/JP2012/078865.
(Continued)

*Primary Examiner* — Scott B Geyer
(74) *Attorney, Agent, or Firm* — Fitch, Even, Tabin & Flannery LLP

(57) ABSTRACT

An organic EL element includes a transparent supporting substrate; a diffraction grating having a concavity and convexity layer with first concavities and convexities formed on a surface thereof, disposed on the transparent supporting substrate; and a transparent electrode, an organic layer having at least a light emitting layer, and a metal electrode having second concavities and convexities on a surface facing organic layer, which are stacked in this order on the diffraction grating and formed into such shapes such that a shape of the first concavities and convexities is maintained, wherein conditions (A), (B) and (C) respectively relating to a Fourier transformed, standard deviations pertaining to depth distributions for first and second concavities and convexities, and a ratio of the change in standard deviation of depth distribution of the second concavities and convexities relative to depth distributions of the first concavities and convexities are satisfied.

14 Claims, 12 Drawing Sheets

(51) Int. Cl.
　　　*H01L 51/52*　　　(2006.01)
　　　*G02B 5/18*　　　(2006.01)

(56) References Cited

U.S. PATENT DOCUMENTS

2006/0159951 A1　　7/2006　Falcou et al.
2011/0278548 A1　11/2011　Takezoe et al.
2012/0132897 A1*　5/2012　Seki et al. .................... 257/40
2014/0042426 A1*　2/2014　Nishimura et al. ............ 257/40

FOREIGN PATENT DOCUMENTS

JP　　2010-205434 A　　9/2010
WO　　2011-007878 A1　　1/2011
WO　　2012-147759 A1　11/2012

OTHER PUBLICATIONS

International Preliminary Report on Patentability issued against International Application PCT/JP2012/078865 [with English translation].

* cited by examiner

[Fig. 14]

- METAL ELECTRODE/CATHODE BUFFER LAYER
- ORGANIC LAYER
- TRANSPARENT ELECTRODE
- DIFFRACTION GRATING

- METAL ELECTRODE/CATHODE BUFFER LAYER
- ORGANIC LAYER
- TRANSPARENT ELECTRODE
- DIFFRACTION GRATING

ORGANIC EL ELEMENT WITH LIGHT EXTRACTION AND LIGHT EMISSION EFFICIENCY

CROSS-REFERENCE TO RELATED APPLICATIONS

This Application is a U.S. National Stage Application filed under 35 U.S.C. §371 of International Application PCT/JP2012/078865, filed Nov. 7, 2012, designating the United States, which claims priority from Japanese Patent Application 2011-253284, filed Nov. 18, 2011, and Japanese Patent Application 2011-276059, filed Dec. 16, 2011, the complete disclosures of which are hereby incorporated herein by reference in their entirety for all purposes.

TECHNICAL FIELD

The present invention relates to an organic EL element.

BACKGROUND ART

Organic electroluminescence elements (organic EL elements) have been used as self-luminous elements for image display devices, such as displays, and for surface light sources. Such an organic EL element (organic light-emitting diode (OLED)) is generally prepared by stacking a transparent electrode serving as an anode, an organic layer, and a metal electrode serving as a cathode in this order on a transparent supporting substrate such as a glass substrate or a transparent plastic film. Thus, upon application of a voltage between the transparent electrode and the metal electrode, electrons supplied from the cathode and holes supplied from the anode are recombined at the organic layer. Then, when excitons generated by the recombination undergo transition from an excited state to a ground state, EL emission occurs. Light of the EL emission goes through the transparent electrode, and then is extracted to the outside on the transparent supporting substrate side.

However, such an organic EL element has a problem that light generated at the organic layer cannot be extracted to the outside sufficiently. Specifically, there is a problem that a large proportion of light generated at the organic layer disappears as heat during repetition of multiple reflections inside the element, or propagates inside the element and exits from end portions of the element, so that a sufficient external extraction efficiency cannot be achieved. For this reason, improvement of the external light extraction efficiency by using a diffraction grating having a concavity and convexity shape formed therein and the like have been proposed recently in the field of organic EL elements.

International Publication No. WO2011/007878 (PTL 1) discloses an example of such an organic EL element using a diffraction grating having a concavity and convexity shape formed therein. This organic EL element comprises: a transparent supporting substrate (A); a cured resin layer (B) stacked on the transparent supporting substrate; and a transparent electrode (C), an organic layer (D), and a metal electrode (E), which are stacked in this order on the cured resin layer (B), wherein the cured resin layer (B) has concavities and convexities formed on a surface thereof, and the concavities and convexities have such a shape that when a Fourier-transformed image is obtained by performing two-dimensional fast Fourier transform processing on a concavity and convexity analysis image obtained by analyzing the shape of the concavities and convexities by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 10 $\mu m^{-1}$ or less. The organic EL element described in PTL 1 has a sufficiently high light extraction efficiency, but there is a demand for development of an organic EL element which can achieve improvement in light extraction efficiency at a higher level.

Meanwhile, it is also known in the field of organic EL elements that even when light generated in an organic layer is extracted from a transparent electrode (for example, an ITO film), part of the light is repeatedly reflected in a transparent supporting substrate (for example, a glass substrate, or the like) present outside the transparent electrode, and is trapped in the transparent supporting substrate. In this respect, methods conventionally proposed for extracting such light trapped in a transparent supporting substrate include an approach in which the light is extracted by preventing the total reflection of the light at the interface between the transparent supporting substrate and the air by using a lens or the like; and the like. When an optical member such as a lens is used as described above, the light extraction efficiency is improved in conventional organic EL elements, but there is a demand for development of an organic EL element which can achieve improvement in light extraction efficiency at a higher level in a case where an optical member such as a lens is used in the same manner. Note that PTL 1 mentioned above does not describe any of the use of a lens for light extraction and the use of phosphorescent light emission for light emission of the element (an organic EL element using phosphorescent light emission).

CITATION LIST

Patent Literature

[PTL 1] International Publication No. WO2011/007878

SUMMARY OF INVENTION

Technical Problem

The present invention has been made in view of the problems of the above-described conventional technologies, and an object of the present invention is to provide an organic EL element which can achieve improvement in the light extraction efficiency thereof at a higher level and can achieve a light emission efficiency at a sufficiently high level.

Solution to Problem

The present inventors have conducted earnest study to achieve the above-described object. As a result, the present inventors have found that the light extraction efficiency of an organic EL element can be improved to a higher level, and a light emission efficiency can be achieved at a sufficiently high level, when the organic EL element comprises: a transparent supporting substrate; a diffraction grating which comprises a concavity and convexity layer having first concavities and convexities formed on a surface thereof and which is disposed on the transparent supporting substrate; and a transparent electrode, an organic layer, and a metal electrode which are stacked in this order on the diffraction grating and formed into such shapes that a shape of the first concavities and convexities formed on the surface of the diffraction grating is maintained, the organic layer comprising at least a light emitting layer, and the organic EL element satisfies the conditions (A) to (C) described later. This finding has led to the completion of the present invention.

Specifically, an organic EL element of the present invention is an organic EL element comprising:

a transparent supporting substrate;

a diffraction grating which comprises a concavity and convexity layer having first concavities and convexities formed on a surface thereof and which is disposed on the transparent supporting substrate; and a transparent electrode, an organic layer, and a metal electrode which are stacked in this order on the diffraction grating and formed into such shapes that a shape of the first concavities and convexities formed on the surface of the diffraction grating is maintained, the organic layer comprising at least a light emitting layer, wherein the organic EL element satisfies the following conditions (A) to (C):

[Condition (A)]

when a Fourier-transformed image is obtained by performing two-dimensional fast Fourier transform processing on a concavity and convexity analysis image obtained by analyzing the shape of the first concavities and convexities by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 10 $\mu m^{-1}$ or less,

[Condition (B)]

standard deviations of depth distributions of the first concavities and convexities and second concavities and convexities are each 15 to 100 nm, the second concavities and convexities being formed on a surface, on a side facing to the organic layer, of the metal electrode, each of the standard deviations being determined on the basis of a concavity and convexity analysis image obtained by analyzing a shape of the corresponding concavities and convexities by use of an atomic force microscope, and

[Condition (C)]

a ratio of a change in the standard deviation of the depth distribution of the second concavities and convexities relative to the standard deviation of the depth distribution of the first concavities and convexities is +15% to −15%. Note that the range of the standard deviations of the depth distributions of the concavities and convexities described in the condition (B) above is more preferably 15 to 50 nm.

In addition, the organic EL element of the present invention is preferably as follows: the diffraction grating is disposed on one surface side of the transparent supporting substrate, and the organic EL element further comprises an optical member disposed on another surface side of the transparent supporting substrate. In other words, the above-described organic EL element of the present invention is preferably an organic EL element comprising:

a transparent supporting substrate;

a diffraction grating which comprises a concavity and convexity layer having first concavities and convexities formed on a surface thereof and which is disposed on one surface side of the transparent supporting substrate;

a transparent electrode, an organic layer, and a metal electrode which are stacked in this order on the diffraction grating and formed into such shapes that a shape of the first concavities and convexities formed on the surface of the diffraction grating is maintained, the organic layer comprising at least a light emitting layer; and an optical member disposed on another surface side of the transparent supporting substrate, wherein the organic EL element satisfies the above-described conditions (A) to (C). Also in a case where the organic EL element of the present invention is an organic EL element of the preferred embodiment comprising: a transparent supporting substrate; a diffraction grating which comprises a concavity and convexity layer having first concavities and convexities formed on a surface thereof and which is disposed on one surface side of the transparent supporting substrate; a transparent electrode, an organic layer, and a metal electrode which are stacked in this order on the diffraction grating and formed into such shapes that a shape of the first concavities and convexities formed on the surface of the diffraction grating is maintained, the organic layer comprising at least a light emitting layer; and an optical member disposed on another surface side of the transparent supporting substrate as described above, the light extraction efficiency of the organic EL element can be improved to a higher level than that of a conventional organic EL element using an optical member, and a light emission efficiency can be achieved at a sufficiently high level, if the element satisfies the conditions (A) to (C).

Moreover, in the organic EL element of the present invention, the optical member preferably comprises a lens member.

In addition, in the organic EL element of the present invention, it is preferable that standard deviations of depth distributions of concavities and convexities formed on surfaces, on a side facing to the metal electrode, of the transparent electrode and each layer which is included in the organic layer and which has a thickness of 10 nm or more (each of the layers in the organic layer satisfying a condition that the thickness is 10 nm or more) be 15 to 100 nm (more preferably 15 to 50 nm), and that a ratio of a change in each of the standard deviations of the depth distributions of the concavities and convexities relative to the standard deviation of the depth distribution of the first concavities and convexities be +15% to −15%. Note that the condition that "each layer which is included in the organic layer and which has a thickness of 10 nm or more" herein is set, because of the following reason. Specifically, suppose a case where a layer having a thickness of less than 10 nm is stacked by a known method such as the vapor deposition method or the sputtering method with the conditions being selected as appropriate, so that the layer can be formed into such a shape that the shape of the first concavities and convexities is maintained. In such a case, basically, the layer can be stacked, while being formed into such a shape that the characteristics of the concavity and convexity shape formed on the surface of the object on which the layer is to be stacked (to-be-coated object) are sufficiently inherited, because of the small thickness of the layer. Hence, the ratios of the changes in characteristics of the concavity and convexity shape during stacking are sufficiently low. Therefore, when each layer which is included in the organic layer and has a thickness of 10 nm or more satisfies the above-described conditions, basically, it is possible to assume that all the layers in the organic layer satisfy the above-described conditions.

In addition, in the organic EL element of the present invention, it is more preferable that standard deviations of depth distributions of concavities and convexities formed on surfaces, on a side facing to the metal electrode, of the transparent electrode and each layer in the organic layer (all the layers including layers having thicknesses of less than 10 nm) be 15 to 100 nm (further preferably 15 to 50 nm), and that a ratio of a change in each of the standard deviations of the depth distributions of the concavities and convexities relative to the standard deviation of the depth distribution of the first concavities and convexities be +15% to −15%.

In the organic EL element of the present invention, a material constituting the organic layer is preferably an organic material having a glass transition temperature of 70° C. to 300° C. When the organic layer is constituted of an organic material having a glass transition temperature within the temperature range, it tends to be possible to more efficiently obtain an organic EL element satisfying the above-described conditions (A) to (C). Note that, when the light emitting layer contains a host material and a dopant material (for example, a phosphorescent material, a fluorescence material, or the like), the "material constituting the organic layer" herein includes the material (host material) forming the light emitting layer other than the dopant material, and materials forming the other layers in the organic layer.

In addition, in the organic EL element of the present invention, the constitution of the light emitting layer is not particularly limited, and, as described above, may contain a host material and a dopant material (for example, a phosphorescent material, a fluorescence material, or the like). The light emitting layer is preferably a layer containing a host material and a phosphorescent material. In addition, in the organic EL element of the present invention, it is more preferable that the organic layer further comprise a hole transporting layer and an electron transporting layer, and the light emitting layer be a layer containing a phosphorescent material and a host material. In this case, when holes accumulate between the light emitting layer and the electron transporting layer (for example, when a hole blocking layer is provided, at an interface between the light emitting layer and the hole blocking layer), or when electrons accumulate between the light emitting layer and the hole transporting layer (for example, when an electron blocking layer is provided, at an interface between the light emitting layer and the electron blocking layer), recombination of electrons and holes occurs at the interface. As a result, the triplet excited state tends to easily disappear. From the viewpoint of minimizing this tendency, it is further preferable that the light emitting layer have a two-layer structure of a first light emitting layer and a second light emitting layer, and that the first light emitting layer and the second light emitting layer contain different host materials. In addition, in a case where the organic layer further comprises a hole transporting layer and an electron transporting layer, and the light emitting layer is a layer containing a phosphorescent material and a host material as described above, it is further preferable that a material constituting the hole transporting layer and the host material of the light emitting layer be the same, from the viewpoint that substantially no interface is created between the hole transporting layer and the light emitting layer in such a case, so that decrease in light emission efficiency due to the energy barrier and the decrease in carrier mobility at the interface can be sufficiently reduced. In addition, when a hole transporting layer and an electron transporting layer are provided, the light emitting layer has a two-layer structure of a first light emitting layer and a second light emitting layer, and the first light emitting layer and the second light emitting layer contain different host materials, it is preferable that a material constituting the hole transporting layer and the host material of the first light emitting layer be the same, and that a material constituting the electron transporting layer and the host material of the second light emitting layer be the same.

In addition, in the organic EL element of the present invention, the host material constituting the light emitting layer is preferably an organic material having a glass transition temperature of 100° C. to 300° C.

Furthermore, in the organic EL element of the present invention, an average height of the concavities and convexities (first concavities and convexities) formed on the surface of the diffraction grating is preferably within a range from 20 to 400 nm (more preferably 20 to 200 nm).

In addition, in the organic EL element of the present invention, an average pitch of the concavities and convexities (first concavities and convexities) formed on the surface of the diffraction grating is preferably within a range from 100 to 1500 nm (more preferably 100 to 700 nm).

Furthermore, in the organic EL element of the present invention, the concavity and convexity layer of the diffraction grating may be a cured resin layer or an inorganic layer. Although the concave and convex layer is not particularly limited, the concave and convex layer is preferably an inorganic layer, from the viewpoint that characteristics such as heat resistance and mechanical strength are achieved at higher levels.

Note that although it is not exactly clear why the organic EL element of the present invention can achieve improvement in the light extraction efficiency thereof at a higher level and can achieve a light emission efficiency at a sufficiently high level, the present inventors presume the reason as follows. Specifically, first, a diffraction grating satisfying the condition (A) is used in the present invention. By using the diffraction grating having the concavity and convexity shape satisfying the condition (A), it is possible to suppress repeated reflection of light generated in the organic layer multiple times inside the element due to reflection at an interface of the organic layer or the like, and light reflected at the interface between the transparent supporting substrate and the air can also re-emitted by a diffraction effect. Hence, the light extraction efficiency can be improved. Moreover, in the present invention, the standard deviations of the depth distributions of the first concavities and convexities and the second concavities and convexities are each 15 to 100 nm (Condition (B)). When such standard deviations of depth distributions of the concavities and convexities are achieved, the distribution of the electric field intensity can be kept constant over the entire element, while the decrease in diffraction efficiency due to planarization of the concavities and convexities is prevented. Hence, the local electric field concentration and the generation of a leakage current are suppressed, while a sufficient diffraction effect is thus obtained. Moreover, in the present invention, the ratio of the change in the standard deviation of the depth distribution of the second concavities and convexities relative to the standard deviation of the depth distribution of the first concavities and convexities is +15% to −15% (Condition (C)). When the ratio of the change in the standard deviation between the first concavities and convexities and the second concavities and convexities is +15% to −15% as described above, the conformity of the shape of the concavities and convexities is sufficiently high between the first concavities and convexities and the second concavities and convexities. In addition, when the conformity of the shape of the concavities and convexities is high between the first concavities and convexities and the second concavities and convexities as described above, the uniformity of the distance between the surfaces of the first concavities and convexities and the second concavities and convexities is so high that the formation of portions where the distance between these layers is extremely long or extremely short is sufficiently prevented (the distance between these layers is prevented from being non-uniform). The present inventors presume that, for this reason, the local electric field concentration and the generation of a leakage current, which would otherwise occur in portions where the distance between the layers is non-uniform, are sufficiently suppressed, when the condition (C) is satisfied. As described above, in the present invention, the diffraction grating having the first concavities and convexities satisfies the condition (A), and the first concavities and convexities and the second concavities and convexities formed on the surface of the metal electrode satisfy the conditions (B) and (C). Hence, while a sufficiently high level of diffraction effect is obtained, the local electric field concentration and the generation of a leakage current can be suppressed sufficiently. The present inventors presume that, for this reason, the light extraction efficiency can be improved sufficiently stably, and hence the light emission efficiency can be improved sufficiently. In addition, in the organic EL element of the present invention, the local electric field concentration can be suppressed sufficiently. Hence, also when an element based on phosphorescence, which is preferred in the present invention, is formed (when the light emitting layer contains a host material and a phosphorescent material), the occurrence of the so-called roll-off phenomenon in which the triplet excited state of the phosphorescent material disappears because of the electric field concentration can be sufficiently suppressed. Hence, the decrease in the light emission efficiency of the phosphorescent light emission can be sufficiently suppressed. The present inventors presume that, because of the sufficient suppression of the local electric field concentration as described above, the light emission efficiency can be improved sufficiently in the organic EL element of the present invention.

In addition, in the present invention, it is preferable that the diffraction grating be disposed on one surface side of the transparent supporting substrate, and an optical member be disposed on another surface side of the transparent supporting substrate (on the surface side opposite to the surface on which the diffraction grating is disposed on the transparent supporting substrate: the light extraction surface side). The disposition of the optical member for extracting light to the outside of the element makes it possible to more efficiently extract to the outside the light, which would otherwise be repeatedly reflected inside the transparent supporting substrate present outside the diffraction grating and trapped in the substrate. Hence, in combination with the use of the diffraction grating, the disposition of the optical member makes it possible to extract light generated in the organic layer to the outside at an extremely high level. The present inventors presume that, in this manner, the light emission efficiency can be further improved sufficiently, when a diffraction grating and the like satisfying the conditions (A) to (C) are used, and an optical member for extracting light to the outside is further used on the light-extraction surface side in the present invention.

Advantageous Effects of Invention

According to the present invention, it is possible to provide an organic EL element which can achieve improvement in the light extraction efficiency thereof at a higher level and can achieve a light emission efficiency at a sufficiently high level.

DESCRIPTION OF EMBODIMENTS

Figure 1:
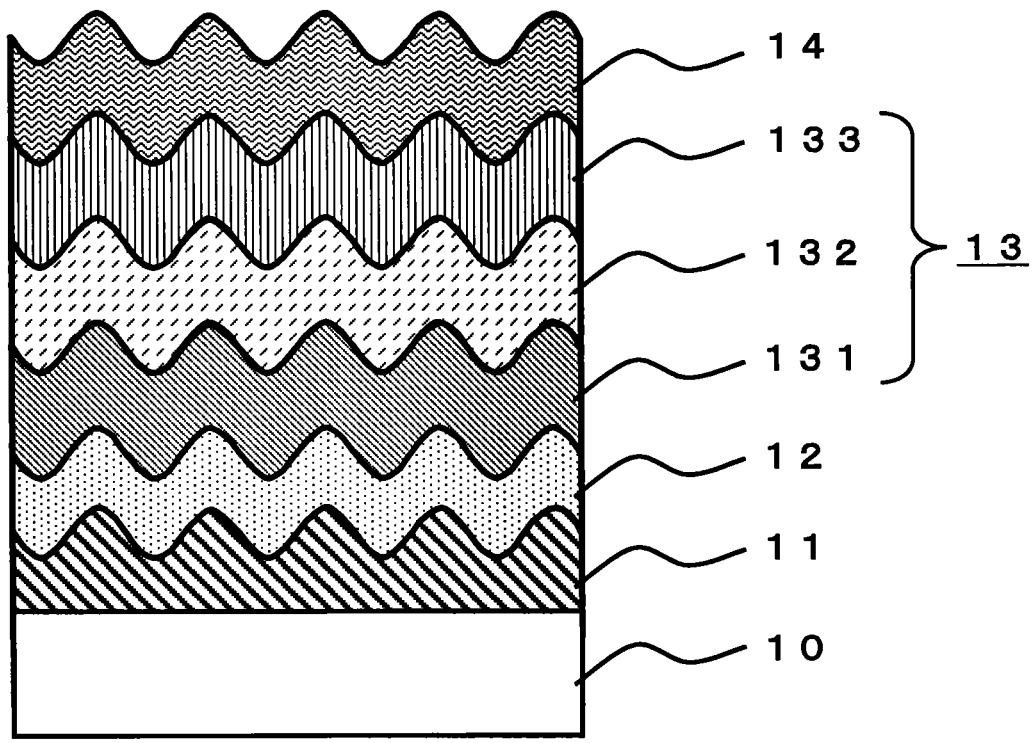
FIG. 1 is a cross-sectional view schematically showing a preferred embodiment of an organic EL element of the present invention.

Hereinafter, preferred embodiments of the present invention will be described in detail with reference to the drawings. Note that, in the following description and drawings, the same or corresponding components are denoted by the same reference numerals, and overlapping description thereof is omitted.

An organic EL element of the present invention is an organic EL element comprising:

a transparent supporting substrate;

a diffraction grating which comprises a concavity and convexity layer having first concavities and convexities formed on a surface thereof and which is disposed on the transparent supporting substrate; and a transparent electrode, an organic layer, and a metal electrode which are stacked in this order on the diffraction grating and formed into such shapes that a shape of the first concavities and convexities formed on the surface of the diffraction grating is maintained, the organic layer comprising at least a light emitting layer, wherein the organic EL element satisfies the following conditions (A) to (C):

[Condition (A)]

when a Fourier-transformed image is obtained by performing two-dimensional fast Fourier transform processing on a concavity and convexity analysis image obtained by analyzing the shape of the first concavities and convexities by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 10 $\mu m^{-1}$ or less,

[Condition (B)]

standard deviations of depth distributions of the first concavities and convexities and second concavities and convexities are each 15 to 100 nm, the second concavities and convexities being formed on a surface, on a side facing to the organic layer, of the metal electrode, each of the standard deviations being determined on the basis of a concavity and convexity analysis image obtained by analyzing a shape of the corresponding concavities and convexities by use of an atomic force microscope, and

[Condition (C)]

a ratio of a change in the standard deviation of the depth distribution of the second concavities and convexities relative to the standard deviation of the depth distribution of the first concavities and convexities is +15% to −15%.

FIG. 1 is a cross-sectional view schematically showing a preferred embodiment of the organic EL element of the present invention. The organic EL element of the embodiment shown in FIG. 1 comprises: a transparent supporting substrate 10; a diffraction grating 11 which comprises a concavity and convexity layer having concavities and convexities formed on a surface thereof and which is stacked on the transparent supporting substrate 10; and a transparent electrode 12, an organic layer 13, and a metal electrode 14 which are stacked in this order on the diffraction grating 11 and formed into such shapes that a shape of the concavities and convexities formed on the surface of the diffraction grating 11 is maintained, wherein the organic layer 13 has a layered structure comprising a hole transporting layer 131, a light emitting layer 132, and an electron transporting layer 133.

<Transparent Supporting Substrate 10>

The transparent supporting substrate 10 is not particularly limited, and a known transparent substrate usable for an organic EL element can be used as appropriate. Examples of the transparent supporting substrate 10 include substrates made of a transparent inorganic material such as glass; substrates made of a resin such as polyethylene terephthalate (PET), polyethylene terenaphthalate (PEN), polycarbonate (PC), cycloolefin polymer (COP), polymethyl methacrylate (PMMA), or polystyrene (PS); multilayer substrates each having a gas barrier layer made of an inorganic substance such as SiN, $SiO_2$, SiC, $SiO_xN_y$, $TiO_2$, or $Al_2O_3$ formed on a surface of a substrate made of any of the above-described resins; and multilayer substrates each having substrates made of any of the above-described resins and gas barrier layers made of any of the above-described inorganic substances stacked alternately on each other. In addition, the thickness of the transparent supporting substrate 10 is preferably within a range from 1 to 2000 μm.

<Diffraction Grating 11>

The diffraction grating 11 comprises a concavity and convexity layer having first concavities and convexities formed on a surface thereof. Examples of materials for forming the diffraction grating 11 (the concavity and convexity layer) include resin materials such as epoxy resins, acrylic resins, urethane resins, melamine resins, urea resins, polyester resins, phenolic resins, and cross-linking type liquid crystal resins; transparent inorganic layer formation materials (for example, when a transparent inorganic layer is formed by forming the concavity and convexity layer by a sol-gel process, examples of the materials include sols containing a metal material such as a metal alkoxide); and the like. As described above, the diffraction grating 11 (the concavity and convexity layer) may be a cured resin layer obtained by curing the resin material or an inorganic layer formed by using the transparent inorganic layer formation material, and is preferably an inorganic layer from the viewpoint that a layer having characteristics such as heat resistance and mechanical strength at higher levels can be obtained. In addition, the thickness of the diffraction grating 11 is preferably within a range from 0.01 to 500 μm. If the thickness of the diffraction grating 11 is less than the lower limit, heights of the concavities and convexities formed on the surface of the diffraction grating 11 tend to be insufficient. Meanwhile, if the thickness exceeds the upper limit, an influence of volume change which occurs during curing tends to be so large that the formation of the concavity and convexity shape tends to be poor.

In addition, in the diffraction grating 11, the first concavities and convexities satisfying the condition (A) are formed. Specifically, the diffraction grating 11 needs to be such that when a Fourier-transformed image is obtained by performing two-dimensional fast Fourier transform processing on a concavity and convexity analysis image obtained by analyzing the shape of the first concavities and convexities formed on the surface of the diffraction grating 11 by use of an atomic force microscope, the Fourier-transformed image shows a circular or annular pattern substantially centered at an origin at which an absolute value of wavenumber is 0 $\mu m^{-1}$, and the circular or annular pattern of the Fourier-transformed image of the shape of the first concavities and convexities is present within a region where an absolute value of wavenumber is within a range of 10 $\mu m^{-1}$ or less. When the Fourier-transformed image satisfies the above-described condition (A), the diffraction grating 11 has a sufficient diffraction effect with a sufficiently low wavelength dependence and a sufficiently low directivity.

In addition, the pattern of the Fourier-transformed image is more preferably annular, from the viewpoint that more advanced effects on wavelength dependence and directivity can be obtained. In addition, similarly from the viewpoint that more advanced effects on wavelength dependence and directivity can be obtained, the circular or annular pattern of the Fourier-transformed image is more preferably present within a region where an absolute value of wavenumber is within a range from 0.5 to 10 $\mu m^{-1}$ (more preferably 0.5 to 5 $\mu m^{-1}$). Note that the lower limit value of the range of the absolute value of wavenumber in the region where the circular or annular pattern of the Fourier-transformed image is present is more preferably 1.25.

Note that "the circular or annular pattern of the Fourier-transformed image" in the present invention is a pattern observed when bright spots in a Fourier-transformed image gather. Hence, the term "circular" in the present invention means that the pattern of the gathering of the bright spots looks like a substantially circular shape, and is a concept also including a case where part of a contour looks like a convex shape or a concave shape. Meanwhile, the term "annular" means that the pattern of the gathering of the bright spots looks like a substantially annular shape, and is a concept also including a case where a shape of an outer circle or inner circle of the ring looks like a substantially circular shape and further including a case where part of the contours of the outer circle and/or the inner circle of the ring looks like a convex shape or a concave shape.

Meanwhile, in the present invention, the phrase "the circular or annular pattern is present within a region where an absolute value of wavenumber is within a range of 10 µm$^{-1}$ or less (preferably from 0.5 to 10 µm$^{-1}$ and further preferably from 0.5 to 5 µm$^{-1}$)" means that 30% or more (more preferably 50% or more, furthermore preferably 80% or more, and particularly preferably 90% or more) of bright spots forming the Fourier-transformed image are present within a region where an absolute value of wavenumber is within a range of 10 µm$^{-1}$ or lees (preferably from 0.5 to 10 µm$^{-1}$ and further preferably 0.5 to 5 µm$^{-1}$).

The Fourier-transformed image can be obtained by analyzing the shape of the concavities and convexities formed on the surface of the concave and convex layer by use of an atomic force microscope, thereby obtaining a concavity and convexity analysis image, and then performing two-dimensional fast Fourier transform processing on the concavity and convexity analysis image. In addition, the concavity and convexity analysis image can be obtained by analysis using an atomic force microscope under the following analysis conditions:
Measurement mode: cantilever intermittent contact mode,
Material of cantilever: silicon,
Lever width of cantilever: 40 µm, and
Diameter of tip of cantilever chip: 10 nm.

As the atomic force microscope, commercially available ones can be used as appropriate. For example, a scanning probe microscope equipped with an environment control unit "Nanonavi II Station/E-sweep" manufactured by SII Nano-Technology Inc. can be used. In addition, it is preferable to employ a cantilever intermittent contact mode as the measurement mode of the atomic force microscope. In this respect, when the scanning probe microscope equipped with an environment control unit manufactured by SII NanoTechnology Inc. is used, the dynamic force mode (the DMF mode) can be used. Moreover, as the cantilever, one whose material is silicon, lever width is 40 µm, and diameter of a tip of a cantilever chip is 10 nm is preferably used, and SI-DF40 can be used, for example. In addition, when the analysis is conducted by use of the above-described atomic force microscope, it is preferable to observe the shape of the concavities and convexities formed on the surface of the concave and convex layer in the air at a temperature of 25° C.

The two-dimensional fast Fourier transform processing on the concavity and convexity analysis image can be easily performed by electronic image processing using a computer equipped with software for two-dimensional fast Fourier transform processing. In the two-dimensional fast Fourier transform processing, a flattening process including primary inclination correction is preferably performed on the concavity and convexity analysis image. Note that a concavity and convexity analysis image displaying an area of 3 µm square (length: 3 µm, width: 3 µm) can be used as the concavity and convexity analysis image on which the two-dimensional fast Fourier transform processing is performed.

In addition, the standard deviation (σ) of the depth distribution of the first concavities and convexities formed on the surface of the diffraction grating 11 needs to be 15 to 100 nm. If the standard deviation (σ) of the depth distribution of the first concavities and convexities is less than the lower limit, a sufficient diffraction effect cannot be obtained, so that it becomes difficult to sufficiently improve the light extraction efficiency. Meanwhile, if the standard deviation (σ) of the depth distribution of the first concavities and convexities exceeds the upper limit, many portions having short anode-cathode distances are present, so that a sufficient light emission efficiency cannot be obtained because a local electric field concentration, a leak current, or the like occurs in the obtained element. Note that when the local electric field concentration occurs, the lifetime of the element tends to be shortened because destruction of the element occurs because of heat generation due to the electric field concentration at a certain position. In addition, from the same viewpoints as those for the upper limit value and the lower limit value, the standard deviation (σ) of the depth distribution of the first concavities and convexities is preferably 17 to 80 nm and more preferably 18 to 65 nm, because a higher level of effect can be obtained. Note that the upper limit value of the range of the standard deviation (σ) of the depth distribution of the first concavities and convexities is further preferably 50 nm, particularly preferably 40 nm, and most preferably 30 nm.

Note that, in the present invention, the standard deviation of depth distribution of the concavities and convexities of the concavity and convexity shape can be determined by calculation according to the following formula (I):

[Math. 1]

$$\sigma = \sqrt{\frac{1}{N}\sum_{i=1}^{N}(x_i - m)^2} \qquad (I)$$

[in the formula (I), N represents a total number of measuring points (the number of all the pixels), $x_i$ represents the concavity and convexity depth data at the i-th measuring point, i represents any integer of 1 to N, and m represents the average value of the depth distribution of the concavities and convexities].

In addition, the average value (m) of the depth distribution of the concavities and convexities in the formula (I) is measured by the following method. Specifically, in the method for measuring the average value (m) of the depth distribution of the concavities and convexities, first, a concavity and convexity analysis image of the shape of the concavities and convexities is obtained by measurement using a scanning probe microscope (for example, one manufactured by SII Nano-Technology Inc., under the trade name of "E-sweep," or the like). In analyzing the concavities and convexities as described above, the concavity and convexity analysis image is obtained by measurement in a randomly selected measuring region of 3 µm square (length: 3 µm, width: 3 µm) under the above-described analysis conditions. Here, data of each of the heights of the concavities and convexities are determined at 16384 (128 columns×128 rows) or more measuring points in the measuring region on the nanometer scale. Note that, the total number (N) of measuring points varies depending on the kind and settings of the measuring apparatus used, and, for example, when the above-described measuring apparatus manufactured by SII NanoTechnology Inc., under the trade name of "E-sweep" is used, the total number (N) of measuring points can be set to 65536 (256 columns×256 rows) in a measuring region of 3 μm square, so that a measurement at 65536 measuring points (a measurement with a resolution of 256×256 pixels) can be conducted. Then, regarding the heights (unit: nm) of the concavities and convexities thus measured at the measuring points, first, of all the measuring points, a measuring point is determined which has the largest height from the surface of the transparent supporting substrate 10. Then, while a plane which includes the measuring point and is parallel to the surface of the transparent supporting substrate 10 is taken as a reference plane (horizontal plane), values of depths from the reference plane (in the case of the diffraction grating 11, the differences each obtained by subtracting the height from the transparent supporting substrate 10 at one of the measuring points from the value of the height from the transparent supporting substrate 10 at the measuring point which has the largest height) are determined as concavity and convexity depth data. Note that some of measuring apparatuses (for example, one manufactured by SII NanoTechnology Inc., under the trade name of "E-sweep") are capable of determining the concavity and convexity depth data by automatic calculation with software provided in the measuring apparatuses. The values determined by automatic calculation can be used as the concavity and convexity depth data. After the concavity and convexity depth data are determined at each measuring point as described above, the average value (m) of the depth distribution of the concavities and convexities can be determined by calculation according to the following formula (II):

[Math. 2]

$$m = \frac{1}{N} \sum_{i=1}^{N} x_i \qquad (II)$$

[in the formula (II), N represents a total number of measuring points (the number of all the pixels), i represents any integer of 1 to N, $x_i$ represents the concavity and convexity depth data at the i-th measuring point, and m represents the average value of the depth distribution of the concavities and convexities].

In addition, in the diffraction grating 11, the average value (m) of the depth distribution of the first concavities and convexities is preferably 30 to 400 nm, and more preferably 40 to 200 nm. In addition, the upper limit value of the range of the average value (m) of the depth distribution of the first concavities and convexities is further preferably 70 nm, and particularly preferably 60 nm. If the average value (m) of the depth distribution is less than the lower limit, the depths of the concavities and convexities are so shallow that a sufficient diffraction effect cannot be obtained, leading to a tendency that the light emission efficiency is difficult to improve sufficiently. Meanwhile, if the average value (m) of the depth distribution exceeds the upper limit, the aspect ratio of the concavities and convexities is too large. Hence, in the use for an organic EL element, not only cracks are easily formed in an electrode, but also a leakage current is more easily generated during the use, so that a case where the light emission efficiency decreases, or a case where light emission does not occur at all is caused, and the lifetime of the organic EL element tends to be shortened.

Moreover, the average value and the median of the depth distribution of the first concavities and convexities formed on the surface of the diffraction grating 11 preferably satisfy the condition represented by the following inequality (1):

$$0.95 \times Y \leq M \leq 1.05 \times Y \qquad (1)$$

[in the inequality (1), Y represents a value obtained by calculation according to the formula: Y=1.07 m−2.25 (in the formula, m represents the average value of the depth distribution of the concavities and convexities), and M represents the median of the depth distribution of the concavities and convexities]. When the median (M) and the average value (m) satisfy the above-described condition, generation of a leakage current can be suppressed sufficiently in the use for an organic EL element. Note that the median (M) of the depth distribution of the concavities and convexities in the inequality (1) can be determined as follows. Specifically, based on the concavity and convexity depth data at the measuring points for the measurement of the average value (m), the concavity and convexity depth data $x_i$ at all the first to N-th measuring points are rearranged in ascending order, and expressed as $x_{(i)}$ (in this case, the order of the heights is as follows: $x_{(1)} < x_{(2)} < x_{(3)} < \ldots < x_{(N)}$). Then, the median (M) can be determined by calculation according to one of the following formulae (III) depending on whether N is an odd number or an even number:

[Math. 3]

$$\left.\begin{array}{l} \text{(When } N \text{ is an odd number)} \\ M = x_{((N+1)/2)} \\ \text{(When } N \text{ is an even number)} \\ M = \dfrac{x_{(N/2)} + x_{((N/2)+1)}}{2} \end{array}\right\} \qquad (III)$$

[in the formulae (III), N represents a total number of measuring points (the number of all the pixels), and M represents the median of the depth distribution of the concavities and convexities].

In addition, in the diffraction grating 11, the kurtosis of the concavities and convexities formed on the surface of the diffraction grating 11 is preferably −1.2 or more, more preferably −1.2 to 1.2, further preferably −1.2 to 1, and particularly preferably −1.1 to 0.0. If the kurtosis is less than the lower limit, it tends to be difficult to sufficiently suppress the generation of a leakage current in the use for an organic EL element. Meanwhile, if the kurtosis exceeds the upper limit, almost no concavities and convexities exist in a sectional shape of the diffraction grating 11, resulting in a state where projections or dents exist sparsely. Hence, not only the light extraction efficiency, which is an advantage of the concavity and convexity structure, cannot be improved sufficiently (the diffraction effect cannot be obtained sufficiently), but also the electric field concentration is more likely to occur on the portions of the projections, so that leakage currents tend to be generated.

As a method for measuring the kurtosis, the following method is employed. Specifically, first, as in the case of the method for measuring the average value (m) of the depth distribution, concavity and convexity depth data are determined at 16384 (128 columns×128 rows) or more measuring points (65536 points in a case where, for example, an apparatus manufactured by SII NanoTechnology Inc., under the trade name of "E-sweep" is used as the measuring apparatus) in a measuring region of 3 μm square. Then, the average value (m) of the depth distribution of the concavities and convexities and the standard deviation (σ) of the depth distribution of the concavities and convexities are calculated on the basis of the concavity and convexity depth data at the measuring points and the above-described formulae (I) and (II). Subsequently, on the basis of the values of the average value (m) and the standard deviation (σ) thus determined, the kurtosis (k) can be determined by calculation according to the following formula (IV):

[Math. 4]

$$k = \frac{\frac{1}{N}\sum_{i=1}^{N}(x_i - m)^4}{\sigma^4} - 3 \qquad (IV)$$

[in the formula (IV), N represents a total number of measuring points (the number of all the pixels), $x_i$ represents the concavity and convexity depth data at the i-th measuring point, m represents the average value of the depth distribution of the concavities and convexities, and σ represents the standard deviation].

In addition, in the diffraction grating 11, the average height of the first concavities and convexities is preferably 20 to 400 nm, preferably 30 to 400 nm, more preferably 35 to 300 nm, and further preferably 40 to 200 nm. Moreover, the upper limit value of the range of the average height of the first concavities and convexities is further preferably 100 nm, and particularly preferably 80 nm. If the average height of the first concavities and convexities is less than the lower limit, the height is so small relative to the wavelengths of the visible light that necessary diffraction tends not to occur. Meanwhile, suppose a case where the average height exceeds the upper limit. In such a case, when the obtained diffraction grating is used as an optical element on the light extraction port side of an organic EL element, not only destruction and life-shortening of the element tend to occur because of heat generation which occurs when the electric field distribution in the EL layer becomes nonuniform, and hence the electric field concentrates on a certain position, but also replication of the concavities and convexities by nanoimprinting tends to be difficult. Note that "the average height of the first concavities and convexities" herein refers to an average value of heights of concavities and convexities obtained when the heights of concavities and convexities (distances between concave portions and convex portions in the depth direction) on the surface of the diffraction grating 11 are measured as follows. A value calculated as follows is employed as the average value of the heights of the concavities and convexities. Specifically, a concavity and convexity analysis image is obtained by measuring the shape of the concavities and convexities on the surface in a randomly selected measuring region (preferably a randomly selected measuring region of 3 μm square) by use of a scanning probe microscope (for example, one manufactured by SII NanoTechnology Inc., under the trade name of "E-sweep," or the like) under the above-described analysis conditions. Then, distances between randomly selected concave portions and convex portions in the depth direction are measured at 100 points or more in the concavity and convexity analysis image. Then, the average of the distances is determined.

Moreover, in the diffraction grating 11, the average pitch of the first concavities and convexities is preferably within a range from 10 to 1500 nm, more preferably a range from 100 to 1500 nm, and further preferably a range from 200 to 1500 nm. In addition, the upper limit value of the range of the average pitch of the first concavities and convexities is particularly preferably 700 nm. If the average pitch of the first concavities and convexities is less than the lower limit, the pitch is so small relative to wavelengths of the visible light that necessary diffraction tends not to occur. Meanwhile, if the average pitch of the first concavities and convexities exceeds the upper limit, the diffraction angle becomes so small that the functions as a diffraction grating tend to be lost. Note that the average pitch of the first concavities and convexities refers to an average value of pitches of the first concavities and convexities obtained when pitches of the first concavities and convexities on the surface of the diffraction grating 11 (distances between adjacent convex portions or between adjacent concave portions) are measured. In addition, a value which can be calculated as follows is employed as the average value of pitches of the first concavities and convexities. Specifically, a concavity and convexity analysis image is obtained by analyzing the concavities and convexities on the surface by use of a scanning probe microscope (for example, one manufactured by SII NanoTechnology Inc., under the trade name of "E-sweep," or the like) under the above-described analysis conditions. Then, the distances between randomly selected adjacent convex portions or between randomly selected adjacent concave portions are measured at 100 points or more in the concavity and convexity analysis image. Then, an average of the distances is determined.

Note that a method for manufacturing the diffraction grating 11 is described later. In addition, the first concavities and convexities satisfying the above-described conditions of the standard deviation (σ) of the depth distribution of the concavities and convexities, the average value (m) of the depth distribution of the concavities and convexities, the inequality (1), the average height of the concavities and convexities, and the pitch of the concavities and convexities can be formed easily by employing the method for manufacturing the diffraction grating 11 (a manufacturing method using a master block) described later.

<Transparent Electrode 12>

The transparent electrode 12 is stacked on the diffraction grating, while being formed into such a shape that the shape of the first concavities and convexities is maintained. Concavities and convexities originated from the shape of the first concavities and convexities are formed on surfaces (on the both sides) of the transparent electrode 12. In the transparent electrode 12, the standard deviation (σ) of the depth distribution of the concavities and convexities (hereinafter also referred to as "third concavities and convexities" in some cases) formed on the surface on the side facing to the metal electrode (the side opposite to the side facing to the diffraction grating) is preferably 15 to 100 nm, preferably 17 to 80 nm, and further preferably 18 to 65 nm. Note that the upper limit value of the range of the standard deviation (σ) of the depth distribution of the concavities and convexities is further preferably 50 nm, particularly preferably 40 nm, and most preferably 30 nm. If the standard deviation (σ) of the depth distribution of the third concavities and convexities is less than the lower limit, a sufficient diffraction effect cannot be obtained, so that it tends to be difficult to sufficiently improve the light extraction efficiency. Meanwhile, if the standard deviation (σ) exceeds the upper limit, many portions having short anode-cathode distances are present, so that the obtained light emission efficiency tends to be insufficient, because a local electric field concentration, a leak current, or the like occurs in the obtained element.

In addition, in the transparent electrode 12, the ratio of the change in the standard deviation of the depth distribution of the third concavities and convexities relative to the standard deviation of the depth distribution of the first concavities and convexities is preferably +15% to −15% (more preferably +10% to −10%, and further preferably +8% to −8%). If the ratio of the change exceeds the upper limit, a local electric field concentration occurs, so that leakage current and deterioration of the element tend to be more likely to occur. Meanwhile, if the ratio of the change is less than the lower limit, a local electric field concentration occurs, so that a leakage current and deterioration of the element tend to be more likely to occur. In addition, the diffraction effect achieved by the concavities and convexities decreases, so that the light extraction efficiency tends to decrease. Note that the ratio of the change can be determined by calculation according to the following formula:

[Ratio of change]={([Standard deviation of depth distribution of third concavities and convexities]−[standard deviation of depth distribution of first concavities and convexities])/[standard deviation of depth distribution of first concavities and convexities]}×100.

Note that, preferred ranges of the average height and the average pitch of the third concavities and convexities in the transparent electrode 12 are preferably the same as the preferred ranges of the average height and the average pitch of the first concavities and convexities from the same viewpoints. In addition, the kurtosis of the third concavities and convexities preferably satisfy the same condition as that of the first concavities and convexities, and preferably satisfy the inequality (1). Note that characteristics of the third concavities and convexities in the transparent electrode 12 can be determined after formation of the transparent electrode 12 by measuring the concavities and convexities on the surface of the transparent electrode 12 by employing the same methods as the methods for measuring the characteristics (characteristics such as the standard deviation (σ) of the depth distribution of the concavities and convexities) of the concavities and convexities of the diffraction grating 11.

In addition, a material for the transparent electrode is not particularly limited, and those usable for transparent electrodes of organic EL elements can be used as appropriate, For example, indium oxide, zinc oxide, tin oxide, indium-tin-oxide (ITO), which is a composite material thereof, gold, platinum, silver, copper, or the like can be used. Of these materials for the transparent electrode 12, ITO is preferable from the viewpoint of the balance between the transparency and the electrical conductivity. In addition, the thickness of the transparent electrode 12 is preferably within a range from 20 to 500 nm. If the thickness is less than the lower limit, the electrical conductivity tends to be insufficient. Meanwhile, if the thickness exceeds the upper limit, the transparency tends to be so insufficient that the generated EL light cannot be extracted to the outside sufficiently.

<Organic Layer 13>

The organic layer 13 is stacked, while being formed into such a shape that the shape of the first concavities and convexities is maintained. Concavities and convexities originated from the shape of the first concavities and convexities are formed on surfaces (on the both sides) of the organic layer 13. In addition, the organic layer 13 comprises at least a light emitting layer. In this embodiment, the organic layer 13 has a structure comprising a hole transporting layer 131, a light emitting layer 132, and an electron transporting layer 133. The organic layer 13 has concavities and convexities originated from the shape of the first concavities and convexities (concavities and convexities formed into such a shape that the shape of the first concavities and convexities is maintained) on the both sides thereof. Hence, each of the hole transporting layer 131, the light emitting layer 132, and the electron transporting layer 133 has concavities and convexities originated from the shape of the first concavities and convexities (concavities and convexities formed into such a shape that the shape of the first concavities and convexities is maintained) on the both sides thereof. Note that, in the present invention, each of the layers constituting the "organic layer" is a layer containing an organic material (an organic compound, an organometallic complex, or the like) in an amount of 50% by mass or more (more preferably 80% by mass to 100% by mass).

In the organic layer 13, the standard deviation of the depth distribution of the concavities and convexities formed on the surface, on the side facing to the metal electrode, of each of the layers which are included in the organic layer and which have thicknesses of 10 nm or more (more preferably, the concavities and convexities formed on the surface, on the side facing to the metal electrode, of each of all the layers in the organic layer) is preferably 15 to 100 nm, preferably 17 to 80 nm, and further preferably 18 to 65 nm. Note that the upper limit value of the range of each of the standard deviations (σ) of the depth distributions of the concavities and convexities is further preferably 50 nm, particularly preferably 40 nm, and most preferably 30 nm. In other words, the standard deviation (σ) of the depth distribution of the concavities and convexities formed on the surface, on the side facing to the metal electrode (the side opposite to the side facing to the diffraction grating), of each of the hole transporting layer 131, the light emitting layer 132, and the electron transporting layer 133 is more preferably 15 to 100 nm, further preferably 17 to 80 nm, and particularly preferably 18 to 65 nm (hereinafter, the concavities and convexities formed on the surface, on the side facing to the metal electrode 14, of the hole transporting layer 131 are referred to as "fourth concavities and convexities," the concavities and convexities formed on the surface, on the side facing to the metal electrode 14, of the light emitting layer 132 are referred to as "fifth concavities and convexities," and the concavities and convexities formed on the surface, on the side facing to the metal electrode 14, of the electron transporting layer 133 are referred to as "sixth concavities and convexities" in some cases) (note that the upper limit value of the range of each of the standard deviations (σ) is further preferably 50 nm, particularly preferably 40 nm, and most preferably nm). If the standard deviation (σ) of the depth distribution of any of the fourth to sixth concavities and convexities is less than the lower limit, a sufficient diffraction effect cannot be obtained, so that it tends to be difficult to sufficiently improve the light extraction efficiency. Meanwhile, if the standard deviation (σ) exceeds the upper limit, many portions having short anode-cathode distances are present, so that the obtained light emission efficiency tends to be insufficient, because a local electric field concentration, a leak current, or the like occurs in the obtained element.

In addition, in the organic layer 13, a ratio of a change in the standard deviation of the depth distribution of the concavities and convexities formed on the surface, on the side facing to the metal electrode, of each layer which is included in the organic layer and which has a thickness of 10 nm or more (more preferably the concavities and convexities formed on the surface, on the side facing to the metal electrode, of each of all the layers in the organic layer) relative to the standard deviation of the depth distribution of the first concavities and convexities is preferably +15% to −15% (more preferably +10% to −10%, and further preferably +8% to −8%). In other words, a ratio of a change in each of the standard deviations of the depth distributions of the fourth to sixth concavities and convexities formed on the surfaces, on the side facing to the metal electrode, of the hole transporting layer 131, the light emitting layer 132, and the electron transporting layer 133 relative to the standard deviation of the depth distribution of the first concavities and convexities is more preferably +15% to −15% (further preferably +10% to −10%, and particularly preferably +8% to −8%). If the ratio of the change exceeds the upper limit, a local electric field concentration tends to occur, so that a leakage current and deterioration of the element occur more easily. Meanwhile, if the ratio of the change is less than the lower limit, a local electric field concentration tends to occur, so that a leakage current and deterioration of the element occur more easily, and the diffraction effect of the concavities and convexities tends to decrease, so that the light extraction efficiency decreases. Note that the ratio of the change can be determined by calculation according to the following formula: [Ratio of change]={([Standard deviation of depth distribution of concavities and convexities (one set of fourth to sixth concavities and convexities)]−[Standard deviation of depth distribution of first concavities and convexities])/[Standard deviation of depth distribution of first concavities and convexities]}×100. In addition, preferred ranges of the average height and the average pitch of the fourth to sixth concavities and convexities are preferably the same as the preferred ranges of the average height and the average pitch of the first concavities and convexities from the similar viewpoints. Moreover, the average values (m) of the depth distributions and the kurtoses (k) of the fourth to sixth concavities and convexities preferably satisfy the same conditions as those of the first concavities and convexities, and preferably satisfy the inequality (1).

Note that characteristics of the concavities and convexities of each of the layers in the organic layer can be determined, after the layer is formed, by measuring the concavities and convexities of the layer by employing the same methods as the methods for measuring characteristics (the characteristics such as the standard deviation ($\sigma$) of the depth distribution of the concavities and convexities) of the concavities and convexities of the diffraction grating 11.

In addition, in the present invention, the materials constituting the organic layer are preferably organic materials having glass transition temperatures of 70° C. to 300° C. Here, when the light emitting layer is a layer containing a host material and a dopant material (for example, a phosphorescent material, a fluorescence material, or the like), the expression "materials constituting the organic layer" refers to materials including the material (the host material) forming the light emitting layer other than the dopant material and materials forming the other layers in the organic layer, i.e., refers to materials in the organic layer other than the dopant material. In other words, in this embodiment, each of the organic materials constituting the hole transporting layer 131, the light emitting layer 132, and the electron transporting layer 133 (when the light emitting layer is a layer containing a host material and a dopant material, the organic materials include the material constituting the hole transporting layer 131, the material (host material) constituting the light emitting layer 132 other than the dopant material, and the material constituting the electron transporting layer 133) is preferably an organic material having a glass transition temperature (Tg) of 70° C. to 300° C. Note that, as the "glass transition temperature" of a material herein, a valve measured with a DSC (differential scanning calorimeter) can be employed. In addition, suppose a case where the glass transition temperature of the material of any one of the layers in the organic layer other than the dopant material is lower than the lower limit. In such a case, when the layer is stacked by the vapor deposition method, it tends to be difficult to obtain the corresponding fourth to sixth concavities and convexities having a standard deviation ($\sigma$) and a ratio of a change in the standard deviation which are within the above-described numeric value ranges. Meanwhile, suppose a case where the glass transition temperature exceeds the upper limit. In such a case, when the layer is stacked by a physical deposition method such as a vapor deposition method, a boat on which a hole transporting material, a light emitting material, or the like is mounted tends to deteriorate because of the heat at the temperature for the vapor deposition of the material, and the lifetime of the boat tends to be shortened because of the increased load on the boat. In other words, by using organic materials having glass transition temperatures (Tg) of 70° C. to 300° C. as the materials constituting the organic layer (the materials in the organic layer other than the dopant material) as described above, concavities and convexities having a standard deviation and a ratio of a change in standard deviation which are within the above-described numeric value ranges can be formed more easily as the fourth to sixth concavities and convexities. In addition, when concavities and convexities having a standard deviation and a ratio of a change in standard deviation which are within the above-described numeric value ranges are formed as the fourth to sixth concavities and convexities, the local electric field concentration can be suppressed more efficiently, and the occurrence of the phenomenon (roll-off phenomenon) in which the light emission efficiency decreases in a high electric field region and the occurrence of a short circuit can be suppressed sufficiently. In addition, owing to the more efficient suppression of the local electric field concentration, reduction in the shortening of the lifetime of the element can also achieved. Note that, regarding the light emitting layer 132, some kinds of the dopant materials may have such low molecular weights that the glass transition temperatures (Tg) thereof are difficult to measure, and the concavity and convexity structure of the light emitting layer 132 varies mainly depending on characteristics of the "host material" serving as a material for dispersing the dopant material. For these reasons and the like, at least the host material needs to be an organic material having a glass transition temperature (Tg) within the above-described range. If the Tg of the dopant material can be measured, the Tg of the dopant material is also more preferably within the above-described temperature range.

Note that, although it is not exactly clear why the use of an organic material having a glass transition temperature (Tg) of 70° C. to 300° C. as each of the materials to constitute the organic layer (materials in the organic layer other than the dopant material in a case where the light emitting layer contains a dopant material: for example, the material constituting the hole transporting layer 131, the material (host material) constituting the light emitting layer 132 other than the dopant material, and the material constituting the electron transporting layer 133) makes it possible to more efficiently form concavities and convexities having a standard deviation ($\sigma$) and a ratio of a change in the standard deviation which are within the above-described ranges and thus to sufficiently suppress the occurrence of the roll-off phenomenon and the occurrence of a short circuit, the present inventors speculate the reason as follows. Specifically, first, it is known that when each of the layers in the organic layer is stacked by a known physical deposition method such as a vapor deposition method or a sputtering method, a substance flying onto a substrate diffuses on the surface of the substrate. If a material having a glass transition temperature (Tg) of lower than 70° C. is used in such a physical deposition method, a relatively long time is taken for the material to be solidified and immobilized after the material arrives at a to-be-coated object. When a material having a glass transition temperature (Tg) of lower than 70° C. is used as described above, dissipation of the energy takes time, so that a state in which the material has flowability is maintained for a long period after the arrival at the to-be-coated object. For this reason, when a material having a glass transition temperature (Tg) of lower than 70° C. is used, the material is diffused for a longer distance from the position on the to-be-coated object at which the material arrives. In addition, the material which is attached to the to-be-coated object, while being in a state of capable of moving for a long distance as described above easily moves to the concave portions and is deposited there because of the influence of the surface tension, and hence the concavity and convexity shape is easily smoothed (leveled). For this reason, when a material having a glass transition temperature (Tg) of lower than 70° C. is used, it is difficult to stack the organic layer in such a shape that the shape of the first concavities and convexities is sufficiently maintained. In addition, if the concavity and convexity shape is smoothed (leveled), the concavities and convexities of the layer become dull. As a result, the depths of the concave portions decrease, and the film thicknesses in portions of the concave portions increase. Hence, the film thickness becomes non-uniform, and an uneven distribution of the electric field intensity is created in the organic layer in the obtained organic EL element. For this reason, when the concavity and convexity shape is smoothed (leveled), a local electric field concentration occurs. As a result, a roll-off phenomenon in which the light emission efficiency decreases in a high electric field region (in a phosphorescence system) occurs inside the element, so that the extraction efficiency decreases. In addition, a short circuit occurs more easily. Moreover, in an organic EL element in which multiple constituent materials are used for the organic layer, the destabilization of the conductance of the current at the interfaces of the layers is a factor of inhibiting the lifetime extension. Here, when the concavities and convexities become dull, so that the depths of the concave portions decrease, and the film thickness becomes non-uniform, an electric field concentration or a short circuit occurs, which destabilizes the conductance of the current, so that the lifetime of the element tends to be short. In addition, in the organic layer, when the concavity and convexity shape is smoothed, and the concavity and convexity shape becomes dull (the depth of the concavity and convexity shape is reduced), so that the conformity to the first concavity and convexity shape decreases, the diffraction effect also decreases. As a result, a sufficient light extraction efficiency cannot be obtained.

In contrast, when each of the layers in the organic layer is stacked by employing a physical deposition method such as a vapor deposition method, the use of an organic material having a glass transition temperature (Tg) of 70° C. or above as each of the materials constituting the organic layer (the materials other than the dopant material) makes it possible to immobilize the material in a shorter time after the arrival of the material at the to-be-coated object, and thus makes it possible to stack each of the layers in a state where the shape of the first concavities and convexities is maintained more sufficiently (in a state with a sufficiently high conformity). In other words, by using organic materials having glass transition temperatures (Tg) of 70° C. to 300° C. as at least the materials constituting the organic layer other than the dopant material, concavities and convexities having a standard deviation ($\sigma$) and a ratio of a change in the standard deviation which are within the above-described ranges can be formed more easily as the concavities and convexities (fourth to sixth concavities and convexities) formed in each of the organic layers. When organic materials having glass transition temperatures (Tg) of 70° C. to 300° C. are used as the materials constituting the organic layer (in a case where the light emitting layer 132 contains a dopant material, the materials other than the dopant material) as described above, concavities and convexities having a standard deviation which is within a range from 15 to 100 nm (preferably from 15 to 50 nm) and whose ratio of a change is +15% to −15% relative to the standard deviation of the first concavities and convexities can be formed as the concavities and convexities (fourth to sixth concavities and convexities) formed in the organic layer, so that the concavities and convexities can be formed with a high conformity to the first concavities and convexities. Note that, regarding the materials of the organic layer, the above-described expression "other than the dopant material" does not intend that a material having a glass transition temperature (Tg) out of the above-described temperature range is used as the dopant material, but means that, when the materials of the light emitting layer include a dopant material and a host material, at least the host material needs to be an organic material having a glass transition temperature (Tg) within the above-described range because of the following reasons and the like. Specifically, this is because some kinds of the dopant materials have such low molecular weights that the glass transition temperatures (Tg) thereof are difficult to measure, and because the concavity and convexity structure of the light emitting layer 132 itself varies mainly depending on the characteristics of the "host material (the media for dispersing the dopant material)," which is the main component of the light emitting layer 132. Hence, if the Tg of the dopant material can be measured, the dopant material is also preferably a material having a glass transition temperature (Tg) within the above-described temperature range (70° C. to 300° C.). Thus, when organic materials having glass transition temperatures (Tg) of 70° C. to 300° C. are used as at least the materials of the organic layer other than the dopant material, the depth of the concavities and convexities does not decrease locally, but an organic layer can be formed into such a shape that the concavity and convexity structure of the first concavities and convexities is sufficiently maintained, and a sufficient diffraction effect can be obtained. Hence, the light extraction efficiency can be improved sufficiently. In addition, by forming concavities and convexities with a high conformity to the first concavities and convexities, the electric field concentration can be suppressed sufficiently, and, in turn, the occurrence of the roll-off phenomenon and the occurrence of a short circuit can be sufficiently suppressed. The present inventors presume that, for this reason, the use of materials having glass transition temperatures (Tg) of 70° C. to 300° C. as the materials of the organic layer makes it possible to achieve a light emission efficiency at a sufficiently high level and also prevent the deterioration of the element due to the electric field concentration, so that the lifetime extension of the element can also be achieved.

In addition, the lower limit value of the preferred temperature range (70° C. to 300° C.) of the glass transition temperatures (Tg) of each of the materials constituting the organic layer (the materials constituting the hole transporting layer 131, the light emitting layer 132, and the electron transporting layer 133 and, in a case where the light emitting layer 132 contains a dopant material, the materials other than the dopant material) is more preferably 90° C. and particularly preferably 110° C. from the viewpoint that a layer with a higher conformity to the shape of the first concavities and convexities can be formed. In addition, the upper limit value of the preferred temperature range (70° C. to 300° C.) of the glass transition temperature (Tg) of each of the materials constituting the layers in the organic layer (in a case where the light emitting layer 132 contains a dopant material, the materials constituting the layers in the organic layer other than the dopant material) is more preferably 200° C. and particularly preferably 160° C., from the viewpoints that a milder temperature condition can be employed in the vapor deposition, so that the power consumption during the manufacturing of the element can be reduced, and the possibility of decomposition of the material (cleavage of chemical bonds of the organic material) is reduced.

In addition, examples of the material constituting the hole transporting layer 131 include phthalocyanine derivatives, naphthalocyanine derivatives, porphyrin derivatives, aromatic diamine compounds such as N,N'-bis(3-methylphenyl)-(1,1'-biphenyl)-4,4'-diamine (TPD) and 4,4'-bis[N-(naphthyl)-N-phenyl-amino]biphenyl (α-NPD), oxazole, oxadiazole, triazole, imidazole, imidazolone, stilbene derivatives, pyrazoline derivatives, tetrahydroimidazole, polyarylalkanes, butadiene, and 4,4',4"-tris(N-(3-methylphenyl)N-phenylamino)triphenyl amine (m-MTDATA). Of these materials, organic materials having glass transition temperatures (Tg) satisfying the above-described preferred temperature range are preferable, and materials such as α-NPD (Tg: 95° C.), TCTA (Tg: 149° C.), 2-TANTA (Tg: 110° C.), m-MTDATA (Tg: 75° C.), spiro TPD (Tg: 115° C.), TAPE (Tg: 113° C.), and trinaphthylbenzene derivatives can be used preferably.

In addition, as the material constituting the hole transporting layer 131, it is preferable to use the same material as the host material of the light emitting layer 132 described later. When the material of the hole transporting layer 131 and the host material of the light emitting layer 132 are the same as described above, substantially no interface exists between the hole transporting layer and the light emitting layer, so that decrease in efficiency due to the energy barrier and the decrease in carrier mobility at the interface can be reduced.

In addition, the thickness of the hole transporting layer 131 is preferably 5 to 200 nm, and more preferably 10 to 100 nm. If the thickness is less than the lower limit, it is difficult to obtain a uniform film. Hence, an uneven in-plane distribution of the hole mobility is created in the element, so that a local current concentration occurs, which causes a lifetime shortening. Meanwhile, if the thickness exceeds the upper limit, the resistance of the element increases, so that the power efficiency tends to decrease, and also the manufacturing time increases.

Meanwhile, the light emitting layer 132 is provided for light emission by recombination of holes injected from the transparent electrode 11 with electrons injected from the metal electrode 15. Regarding a material used for forming the light emitting layer, it is possible to use anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, organometallic complexes such as aluminum quinolinol complex ($Alq_3$), tri-(p-terphenyl-4-ly)amine, 1-aryl-2,5-di(2-thienyl)pyrrole derivatives, pyran, quinacridone, rubrene, distyrylbenzene derivatives, distyrylarylene derivatives, distyrylamine derivatives, various fluorescent dyes, and the like. In addition, as a material used for the light emitting layer 132, a mixture of light emitting materials selected from the above-described compounds may be used, as appropriate. Moreover, the light emitting layer may have a constitution comprising a so-called host material and a dopant material (the above-described light emitting material (a phosphorescent material, a fluorescent dye, or the like)) introduced into the host material. When a host material having a high carrier mobility is doped with the above-described light emitting material as a dopant material (guest material) as described above, it is possible to cause light emission by utilizing the dipole-dipole interaction (Förster mechanism) or the electron exchange interaction (Dexter mechanism).

In addition, a phosphorescent material is preferably used as the dopant material, because the light emission efficiency can be improved to a great extend. Specifically, when a phosphorescent material is used as the dopant material, all singlet excitons and triplet excitons generated by electrical excitation can be used for the light emission, because all the singlet excitons undergo intersystem crossing and the light emission transition probability of the triplet excitons is sufficiently high owing to the internal heavy atom effect. Hence, the light emission efficiency tends to be improved to a great extent. Note that the "phosphorescent material" herein only needs to be a material which exhibits light emission from a spin multiplet (a phosphorescent light emitting material which undergoes phosphorescent light emission), and, for example, a known phosphorescent light emitting material such as an organometallic complex having a heavy metal as a central metal can be used as appropriate. In addition, the phosphorescent light emitting material preferably contains a heavy metal such as iridium, and, for example, $Ir(ppy)_3$ or the like can be used preferably. If the glass transition temperature (Tg) of the dopant material (a phosphorescent material or the like) can be measured, a preferred temperature range of the glass transition temperature (Tg) of the dopant material is preferably the same as the preferred temperature range of the glass transition temperatures (Tg) of the materials constituting the organic layer other than the dopant material from the same viewpoint.

In addition, a constituent material (host material) of the light emitting layer 132 for dispersing the dopant material (guest material) which can be contained in the light emitting layer 132 is preferably a material satisfying the above-described preferred temperature range of the glass transition temperature (Tg) from the viewpoint of obtaining an organic layer having a sufficiently high conformity to the shape of the first concavities and convexities, and, for example, a host material such as TCTA (Tg: 149° C.), TPBi (Tg: 124° C.), 2-TANTA (Tg: 110° C.), m-MTDATA (Tg: 75° C.), spiro TPD (Tg: 115° C.), TAPB (Tg: 113° C.), or a trinaphthylbenzene derivative can be preferably used.

Moreover, when the light emitting layer 132 contains a host material and a dopant material (guest material), the content of the dopant material in the light emitting layer 132 is preferably 1 to 20% by mass, and more preferably 3 to 15% by mass. If the content of the dopant material is less than the lower limit, the energy is not transferred efficiently from the host material to the guest material, so that the ratio of energy quenched in the host material tends to increase. Meanwhile, if the content of the dopant material exceeds the upper limit, the efficiency decreases because of the concentration quenching and the triplet-triplet annihilation. If the Tg of the dopant material (guest material) is lower than 70° C. in addition to the low content, the concavity and convexity structure is more easily smoothed (leveled), so that it tends to be difficult to form a light emitting layer having a concavity and convexity structure with a higher conformity.

In addition, the material (the host material or the like) for constituting the light emitting layer other than the dopant material is more preferably an organic material having a glass transition temperature of 100° C. to 300° C. (further preferably 90° C. to 200° C.). When the glass transition temperature of the organic material constituting the light emitting layer is within the above-described range, a layer having a sufficiently high conformity to the first concavities and convexities can be obtained more efficiently as the light emitting layer. In addition, from the same viewpoint, the glass transition temperature of the dopant material also preferably satisfies the same condition as that of the host material.

In addition, the thickness of the light emitting layer 132 is preferably 1 to 80 nm, and more preferably 10 to 50 nm. If the thickness is less than the lower limit, it is difficult to obtain a uniform film. Hence, an uneven in-plane distribution of the carrier mobility is created in the element, so that a local current concentration occurs, which causes a lifetime shortening. Meanwhile, if the thickness exceeds the upper limit, the resistance of the element increases, so that the power efficiency tends to decrease, and also the manufacturing time increases.

Meanwhile, as a material constituting the electron transporting layer 133, a material which can be formed into the electron transporting layer 133 can be used as appropriate. Examples of the material include nitro-substituted fluorene derivatives, diphenylquinone derivatives, thiopyran dioxide derivatives, heterocyclic tetracarboxylic acid anhydrides of naphthalene, perylene, and the like, carbodiimide, fluorenylidenemethane derivatives, anthraquinodimethane and anthrone derivatives, oxadiazole derivatives, organometallic complexes such as aluminum quinolinol complex ($Alq_3$), and the like. Moreover, thiadiazole derivatives, which are the same as the oxadiazole derivatives except that the oxygen atom in the oxadiazole ring is substituted with a sulfur atom, and quinoxaline derivatives, which has a quinoxaline ring known as an electron withdrawing group, can also be used as the electron transport material. Moreover, it is also possible to use polymer materials in which any of these materials is introduced into a polymer chain or any of these materials serves as the main chain of the polymer. Of these materials constituting the electron transporting layer 133, organic materials satisfying the above-described preferred temperature range of the glass transition temperature (Tg) are preferable, and materials such as $Alq_3$ (Tg: 175° C.), TPBi (Tg: 124° C.), and BAlq (Tg: 99° C.) can be used preferably, from the viewpoint of obtaining an organic layer having a sufficiently high conformity to the shape of the first concavities and convexities.

Moreover, the thickness of the electron transporting layer 133 is preferably 5 to 200 nm, and more preferably 10 to 100 nm. If the thickness is less than the lower limit, it is difficult to obtain a uniform film. Hence, an uneven in-plane distribution of the electron mobility is created in the element, so that a local current concentration occurs, which causes a lifetime shortening. Meanwhile, if the thickness exceeds the upper limit, the resistance of the element increases, so that the power efficiency tends to decrease, and also the manufacturing time increases.

In addition, in the organic layer 13, a layer stacked later tends to have a lower conformity of the concavities and convexities, and a relatively thick layer having a layer thickness of 50 nm or more is more easily smoothed (leveled) during stacking, and the like. For these reasons and the like, materials (other than the dopant material) constituting second- or later-stacked layers (in this embodiment, the light emitting layer 132 and the electron transporting layer 133) of the layers in the organic layer and layers having thicknesses of 50 nm or more preferably have glass transition temperatures of 90° C. to 300° C. (more preferably 100 to 200° C.) (Note that if the Tg of the dopant material (a phosphorescent material or the like) can be measured, the dopant material preferably satisfies the same condition). If the glass transition temperature is less than the lower limit, it tends to be difficult to achieve a higher level of conformity of the concavity and convexity shape.

Figure 2:
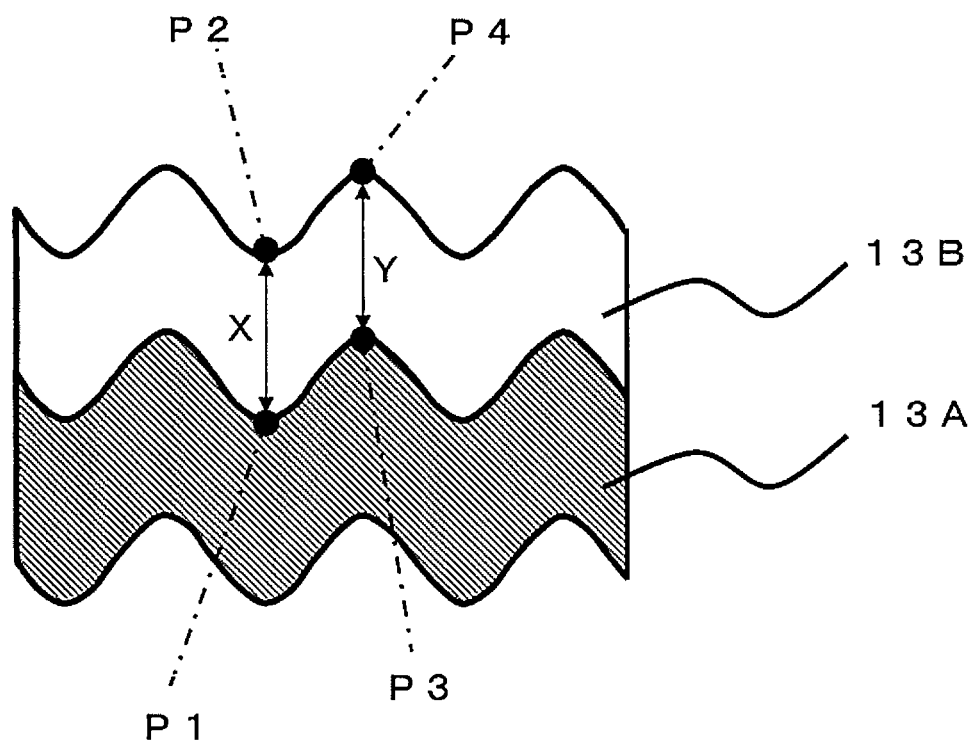
FIG. 2 is a conceptual diagram conceptually showing a thickness between concave portions and a thickness between convex portions based on any two layers in an organic layer.

In addition, the uniformity of the thickness of each of the layers in the organic layer 13 is preferably high. Here, suppose a case where an average value of thickness between concave portions (distances between lowermost points of concave portions) at randomly selected two or more points of each of the layers and an average value of thicknesses between convex portions (distances between vertices of convex portions formed on the surface, facing to the metal electrode, of the layer) at randomly selected two or more points of the layer are measured based on a transmission electron microscope image of a cross section of a ultrathin section (a test piece of 70 nm in thickness is prepared and used as a measurement sample) of the organic EL element. In such a case, the ratio of the average value of the thicknesses between the concave portions to the average value of the thicknesses between the convex portions ([Average value of thicknesses between concave portions]/[Average value of thicknesses between convex portions]) is more preferably within a range from 0.8 to 1.5 (more preferably 0.9 to 1.4). If the ratio is out of the above-described range, the uniformity of the film thickness is so low that it tends to be difficult to sufficiently suppress the electric field concentration. Note that the thickness between concave portions and the thickness between convex portions are described with reference to FIG. 2. FIG. 2 is a conceptual diagram schematically showing any layers 13A and 13B in the organic layer. In addition, the layer 13B is obtained by being stacked on the layer 13A. In the layer 13B, a "thickness between concave portions" is a distance X between a lowermost point P1 of any concave portion formed on the surface, facing to the metal electrode, of the layer 13A present on the substrate side and a lowermost point P2 of a concave portion on the layer 13B, the concave portion formed into such a shape that the shape of the concave portion of the layer 13A is maintained. In addition, in the layer 13B, a "thickness between convex portions" is a distance Y between a vertex P3 of a randomly selected convex portion being formed on the surface, facing to the metal electrode, of the layer 13A and a vertex P4 of a convex portion on the layer 13B, the convex portion being formed into such a shape that the shape of the convex portion of the layer 13A is maintained.

In addition, suppose a case where an average value of thicknesses between concave portions (distances between lowermost points of concave portions) of the entire organic layer at randomly selected two or more points and an average value of thicknesses between convex portions (distances between vertices of convex portions formed on the side, facing to the metal electrode, of each of the layers), of the entire organic layer at randomly selected two or more points are measured based on a transmission electron microscope image of an ultrathin section of the organic EL element. In such a case, the ratio of the average value of the thicknesses between the concave portions to the average value of the thicknesses between the convex portions ([Average value of thicknesses between concave portions]/[Average value of thicknesses between convex portions]) is more preferably within a range from 0.8 to 1.5 in the organic layer 13. If the ratio is out of the above-described range, the uniformity of the film thickness of the entire organic layer is not necessarily sufficient, and it tends to be difficult to sufficiently suppress the electric field concentration.

<Metal Electrode 14>

The metal electrode 14 is stacked on the diffraction grating, while being formed into such a shape that the shape of the first concavities and convexities is maintained. Concavities and convexities originated from the shape of the first concavities and convexities are formed on at least the surface of the metal electrode 14 on the organic layer side (on the side facing to the first concavities and convexities).

In the metal electrode 14, the standard deviation (σ) of the depth distribution of the concavities and convexities (second concavities and convexities) formed on the surface on the side facing to the organic layer is 15 to 100 nm. In addition, the standard deviation (σ) of the depth distribution of the second concavities and convexities is more preferably 17 to 80 nm, and further preferably 18 to 65 nm. Note that the upper limit value of the range of the standard deviation (σ) of the depth distribution of the concavities and convexities is further preferably 50 nm, particularly preferably 40 nm, and most preferably 30 nm. If the standard deviation (σ) of the depth distribution of the second concavities and convexities is less than the lower limit, a sufficient diffraction effect cannot be obtained, so that it becomes difficult to sufficiently improve the light extraction efficiency. Meanwhile, if the standard deviation (σ) exceeds the upper limit, many portions having short anode-cathode distances are present, so that a sufficient light emission efficiency cannot be obtained because a local electric field concentration, a leak current, or the like occurs in the obtained element.

In addition, the ratio of the change in the standard deviation of the depth distribution of the second concavities and convexities relative to the standard deviation of the depth distribution of the first concavities and convexities is +15% to −15% (Condition (C)). If the ratio of the change exceeds 15%, a local electric field concentration occurs, so that a leakage current and deterioration of the element tend to be more likely to occur. Meanwhile, if the ratio of the change is less than −15%, a local electric field concentration occurs, so that a leakage current and deterioration of the element tend to be more likely to occur, and the diffraction effect achieved by the concavities and convexities decreases, so that the light extraction efficiency decreases. The ratio of the change in the standard deviation of the depth distribution of the second concavities and convexities is more preferably +10% to −10%, and further preferably +8% to −8% from the same viewpoint. Note that the ratio of the change can be determined by calculation according to the following formula:

[Ratio of change]={([Standard deviation of depth distribution of second concavities and convexities]−[Standard deviation of depth distribution of first concavities and convexities])/[Standard deviation of depth distribution of first concavities and convexities]}×100.

Note that, in the metal electrode 14, preferred ranges of the average value of the depth distribution, the average height, and the average pitch of the second concavities and convexities are preferably the same as the preferred ranges of the average height and the average pitch of the first concavities and convexities, form the same viewpoints. In addition, the kurtosis of the second concavities and convexities preferably satisfies the same condition as that of the first concavities and convexities, and preferably satisfies the inequality (1). In addition, characteristics (for example, the depth distribution of the concavities and convexities, and the like) of the concavities and convexities (second concavities and convexities) formed on the surface, on the side facing to the organic layer, of the metal electrode 14 can be determined as follows. Specifically, only the metal electrode 14 is physically peeled from the organic EL element, and the concavities and convexities formed on the surface, on the side facing to the organic layer (on the peeled side), of the peeled metal electrode are measured by employing the same methods as the methods for measuring the characteristics (characteristics such as the standard deviation (σ) of the depth distribution of the concavities and convexities) of the concavities and convexities of the diffraction grating 11. Note that, as a method for peeling only the metal electrode 14 from the organic EL element, a method is preferably employed in which an adhesive tape (for example, one manufactured by Sumitomo 3M Limited under the trade name of "Scotch Mending adhesive tape," or the like) is attached onto an outer surface of the metal electrode of the obtained organic EL element, and then only the metal electrode is peeled from the organic layer by using the adhesive tape under conditions of the air atmosphere and room temperature (25° C.). In addition, a method for peeling only a metal electrode from an organic EL element by using an adhesive tape as described above is a known method, as described in, for example, documents such as Formation and growth of black spots in organic light-emitting diodes, Journal of Applied Physics, vol. 80, 6002-6007 (1996). Here, the conditions for peeling only the metal electrode may be changed as appropriate depending on the material of the metal electrode and the like. As described above, in the present invention, the characteristics of the concavities and convexities formed on the surface, on the side facing to the organic layer, of the metal electrode 14 can also be measured by attaching an adhesive tape onto an outer surface of the metal electrode of the organic EL element, then peeling only the metal electrode from the organic layer by using the adhesive tape, and obtaining a concavity and convexity analysis image (SPM image) by analyzing the concavities and convexities on the surface of the metal electrode on the adhesive tape with an atomic force microscope. Alternatively, it is also possible to attach a flexible film onto the surface of the metal electrode with an adhesive agent, and peel only the metal electrode from the organic layer.

In addition, a material of the metal electrode 14 is not particularly limited, as long as the material is a material for forming a metal electrode of an organic EL element. A substance having a small work function can be used preferably. Examples of the material of the metal electrode 14 include aluminum, MgAg, MgIn, and AlLi. The material of the metal electrode 14 comprises a metal or a metal compound as describe above. Hence, first, when the metal electrode 14 is stacked by a known physical deposition method such as the vapor deposition method or the sputtering method, the energy of the material dissipates in a shorter time after the material arrives at the to-be-coated object than that of an organic material, and the material is solidified and immobilized at the arrival position or in the close vicinity thereof. Hence, when the metal electrode 14 is stacked with a uniform film thickness by a known method such as the vapor deposition method or the sputtering method, it is possible to form concavities and convexities having a sufficiently high conformity to the concavities and convexities formed on the surface of the to-be-coated object. Basically, concavities and convexities having a sufficiently high conformity to the concavities and convexities formed on the layer in contact with the electrode can be formed in the metal electrode 14 as described above. Hence, when the concavities and convexities of the metal electrode 14 satisfy the above-described conditions (B) and (C), it is highly likely that the concavities and convexities of the layer in contact with the metal electrode 14 also satisfy the conditions as described in conditions (B) and (C), and it can be seen that an organic EL element is obtained in which each layer has a sufficiently high uniformity of film thickness.

In addition, the thickness of the metal electrode 14 is preferably 5 to 200 nm, and preferably 10 to 100 nm. If the thickness is less than the lower limit, it is difficult to obtain a uniform film, so that a local electric field concentration tends to be caused, the increased ratio of absorbed light tends to result in decrease in extraction efficiency, and the electrical conductivity tends to decrease. Meanwhile, if the thickness exceeds the upper limit, problems such as damage on the organic layer due to the radiation heat during the formation of the electrode occur, and the manufacturing time increases.

As described above, in the organic EL element of the present invention, the diffraction grating 11 satisfies the condition (A). In addition, the condition (B) that standard deviations of depth distributions of the first concavities and convexities and the second concavities and convexities are each 15 to 100 nm, each of the standard deviations being determined on the basis of a concavity and convexity analysis image obtained by analyzing a shape of the corresponding concavities and convexities by use of an atomic force microscope is satisfied, and the condition (C) that a ratio of a change in the standard deviation of the depth distribution of the second concavities and convexities relative to the standard deviation of the depth distribution of the first concavities and convexities is +15% to −15% is satisfied. When the condition (A) is satisfied, a sufficient diffraction effect is obtained by the diffraction grating. Meanwhile, when the conditions (B) and (C) are satisfied, the film thickness of each of the layers in the element is uniform, so that the local electric field concentration and the generation of a leakage current can be suppressed sufficiently, while a sufficiently high level of diffraction effect attributable to the first concavities and convexities is obtained. Hence, the light extraction efficiency can be improved sufficiently and stably. In addition, in the organic EL element of the present invention, the local electric field concentration can be suppressed sufficiently. Hence, even when the element is a phosphorescence-based element, the occurrence of the so-called roll-off phenomenon in which the triplet excited state of the phosphorescent material disappears because of the electric field concentration can also be suppressed sufficiently. Thus, the decrease in light emission efficiency of the phosphorescent light emission can also be sufficiently reduced.

In addition, in the organic EL element of the present invention, standard deviations of depth distributions of concavities and convexities formed on surfaces, on a side facing to the metal electrode, of the transparent electrode and each of the layers (the hole transporting layer, the light emitting layer, and the electron transporting layer in the embodiment shown in FIG. 1) which is included in the organic layer and has a thickness of 10 nm or more (more preferably concavities and convexities formed on the surface, on the side facing to the metal electrode, of the transparent electrode and each layer in the organic layer) are each preferably 15 to 100 nm (more preferably 17 to 80 nm, and further preferably 18 to 65 nm), and a ratio of a change in each of the standard deviations of the depth distributions of the concavities and convexities relative to the standard deviation of the depth distribution of the first concavities and convexities is preferably +15% to −15% (more preferably +10% to −10%, and further preferably +10% to −10%). Note that the upper limit value of the range of the standard deviations (σ) of the depth distributions of the concavities and convexities is further preferably 50 nm, particularly preferably 40 nm, and most preferably nm. When the standard deviations of the depth distributions of the concavities and convexities of the transparent electrode and each of all the layers which are included in the organic layer and have thicknesses of 10 nm or more (more preferably the transparent electrode and each of the layers in the organic layer (the hole transporting layer, the light emitting layer, and the electron transporting layer)) are each 15 to 100 nm (more preferably 15 to 50 nm) as described above, and when the ratio of the change in each of the standard deviations of the depth distributions of the concavities and convexities relative to the standard deviation of the depth distribution of the first concavities and convexities is +15% to −15%, the uniformity of the film thickness of each of the layers is improved to a higher level, so that the electric field concentration and the generation of a leakage current can be suppressed at higher levels.

Next, a method is described which can be suitably used as a method for manufacturing the organic EL element of the embodiment shown in FIG. 1. As a method for manufacturing the organic EL element, a method can be employed which comprises: a step (diffraction grating formation step) of forming a diffraction grating on a transparent supporting substrate; and a step (organic EL element formation step) of stacking, on a surface of the diffraction grating, each of the transparent electrode, the organic layer, and the metal electrode formed into such shapes that the shape of the first concavities and convexities formed on the surface of the diffraction grating (concavity and convexity layer) is maintained, thereby obtaining an organic EL element. Hereinafter, the diffraction grating formation step and the organic EL element formation step are described separately.

(Diffraction Grating Formation Step)

The method for manufacturing the diffraction grating 11 is not particularly limited, and a known method capable of manufacturing a diffraction grating satisfying the above-described conditions (for example, the method described in International Publication No. WO2011/007878 (WO2011/007878A1) or the like) can be used as appropriate.

In addition, as the method for manufacturing the diffraction grating 11, it is preferable to use a method comprising a step of applying a material (diffraction grating formation material) for forming the diffraction grating 11 (the concavity and convexity layer) onto a transparent supporting substrate, then curing the diffraction grating formation material with a master block for forming a diffraction grating being pressed thereto, and thereafter detaching the master block, thereby stacking, on the transparent supporting substrate, a layer having concavities and convexities formed thereon, because the first concavities and convexities can be formed more efficiently. Note that this method makes it possible to efficiently manufacture a diffraction grating having concavities and convexities formed thereon and satisfying the above-described characteristics of the first concavities and convexities. Hereinafter, this method for manufacturing the diffraction grating 11 is described.

In the method for manufacturing the diffraction grating 11, a master block (mold) for forming a diffraction grating is used. The master block (mold) for forming a diffraction grating may be any, as long as, when an uncured layer made of the diffraction grating formation material is cured with the master block (mold) being pressed thereto, a diffraction grating (concavity and convexity layer) having the first concavities and convexities formed thereon and described for the diffraction grating 11 above can be formed, while the shape of the concavities and convexities formed on the master block is transferred (inverted) to the diffraction grating. Hence, as the master block (mold) for forming a diffraction grating, one having a concavity and convexity shape on a surface thereof is used, and characteristics (the average height, the average pitch, and the like) of the concavity and convexity shape are preferably the same as the characteristics of the concavities and convexities formed on the surface of the diffraction grating 11.

In addition, the method for manufacturing the master block (mold) for forming a diffraction grating is not particularly limited, and an approach is a method utilizing phase separation of a block copolymer. Methods utilizing phase separation of a block copolymer include a method in which the phase separation of the block copolymer is promoted by heating and a method in which the phase separation of the block copolymer is achieved by solvent phase separation. Here, the phase separation by heating is described in detail. Specifically, as the method (a method preferable as the method for manufacturing the master block (mold) for forming a diffraction grating) in which the phase separation of the block copolymer is promoted by heating, it is preferable to employ, for example, a method comprising: a step (I) of applying a block copolymer solution comprising a block copolymer and a solvent onto a surface of a base member, the block copolymer being made of first and second polymers (segments); a step (II) of drying a coating film on the base member; a step (III) of heating the dried coating film at a temperature which is not lower than a glass transition temperature of the block copolymer; a step (IV) of removing, after the step (III) is conducted, the second polymer (segment) by an etching treatment on the coating film, thereby forming a concavity and convexity structure on the base member; a step (V) of heating the concavity and convexity structure at a temperature which is not lower than a glass transition temperature of the first polymer (segment); a step (VI) of forming a seed layer on the concavity and convexity structure subjected to the step (V); a step (VII) of stacking a metal layer on the seed layer by electroforming; and a step (VIII) of peeling the base member having the concavity and convexity structure from the metal layer and the seed layer. Hereinafter, the steps (I) to (VIII) are described separately with or without reference to the drawings.

<Step (I)>

The step (I) is a step of applying a block copolymer solution comprising a block copolymer and a solvent onto a surface of a base member, the block copolymer being made of first and second polymers (segments).

As the block copolymer, a copolymer is used which has a first polymer segment made of a first homopolymer and a second polymer segment made of a second homopolymer which is different from the first homopolymer. The second homopolymer preferably has a solubility parameter which is higher than a solubility parameter of the first homopolymer by 0.1 to 10 $(cal/cm^3)^{1/2}$. If the difference between the solubility parameters of the first and second homopolymers is less than 0.1 $(cal/cm^3)^{1/2}$, it is difficult to form a regular micro phase separation structure of the block copolymer. Meanwhile, if the difference exceeds 10 $(cal/cm^3)^{1/2}$, it is difficult to prepare a uniform solution of the block copolymer.

Examples of monomers serving as raw materials of homopolymers usable as the first homopolymer or second homopolymer include styrene, methylstyrene, propylstyrene, butylstyrene, hexylstyrene, octylstyrene, methoxystyrene, ethylene, propylene, butene, hexene, acrylonitrile, acrylamide, methyl methacrylate, ethyl methacrylate, propyl methacrylate, butyl methacrylate, hexyl methacrylate, octyl methacrylate, methyl acrylate, ethyl acrylate, propyl acrylate, butyl acrylate, hexyl acrylate, octyl acrylate, methacrylic acid, acrylic acid, hydroxyethyl methacrylate, hydroxyethyl acrylate, ethylene oxide, propylene oxide, dimethylsiloxane, lactic acid, vinylpyridine, hydroxystyrene, styrenesulfonate, isoprene, butadiene, ε-caprolactone, isopropylacrylamide, vinyl chloride, ethylene terephthalate, tetrafluoroethylene, and vinyl alcohol. Of these monomers, styrene, methyl methacrylate, ethylene oxide, butadiene, isoprene, vinylpyridine, and lactic acid are preferably used from the viewpoints that the formation of separated phases easily occurs, and that the concavities and convexities are easily formed by etching.

In addition, examples of the combination of the first homopolymer and the second homopolymer include combinations of two selected from the group consisting of a styrene-based polymer (more preferably polystyrene), a polyalkyl methacrylate (more preferably polymethyl methacrylate), polyethylene oxide, polybutadiene, polyisoprene, polyvinylpyridine, and polylactic acid. Of these combinations, combinations of a styrene-based polymer and a polyalkyl methacrylate, combinations of a styrene-based polymer and polyethylene oxide, combinations of a styrene-based polymer and polyisoprene, and combinations of a styrene-based polymer and polybutadiene are more preferable, and combinations of a styrene-based polymer and polymethyl methacrylate, combinations of a styrene-based polymer and polyisoprene, and combinations of a styrene-based polymer and polybutadiene are particularly preferable, from the viewpoint that the depths of the concavities and convexities formed on the block copolymer can be further increased by preferentially removing one of the homopolymers by an etching treatment. A combination of polystyrene (PS) and polymethylmethacrylate (PMMA) is more preferable.

The number average molecular weight (Mn) of the block copolymer is preferably 500000 or more, more preferably 1000000 or more, and particularly preferably 1000000 to 5000000. If the number average molecular weight is less than 500000, the average pitch of the concavities and convexities formed by the micro phase separation structure of the block copolymer is so small that the average pitch of the concavities and convexities of the obtained diffraction grating becomes insufficient. Particularly when it is necessary to diffract the illumination light over the wavelength range in the visible region, the average pitch is desirably 10 to 1500 nm (more desirably 100 to 1500 nm). From this viewpoint, the number average molecular weight (Mn) of the block copolymer is preferably 500000 or more (note that the upper limit value of the range of the average pitch is further preferably 700 nm). On the other hand, when a block copolymer having a number average molecular weight (Mn) of 500000 or more is used, it tends to be difficult to obtain a desired concavity and convexity pattern by electroforming without performing a second heating step after the etching step.

The molecular weight distribution (Mw/Mn) of the block copolymer is preferably 1.5 or less, and more preferably 1.0 to 1.35. If the molecular weight distribution exceeds 1.5, it is difficult to form a regular micro phase separation structure of the block copolymer. Note that the number average molecular weight (Mn) and the weight average molecular weight (Mw) of the block copolymer are values measured by gel permeation chromatography (GPC) and converted to molecular weights of standard polystyrene.

In the block copolymer, a volume ratio between the first polymer segment and the second polymer segment (the first polymer segment:the second polymer segment) is preferably 3:7 to 7:3, and more preferably 4:6 to 6:4 to create a lamellar structure by the self assembly. If the volume ratio is out of the range, it tends to be difficult to form a concavity and convexity pattern owing to a lamellar structure.

In addition, the block copolymer solution used in the step (I) can be prepared by dissolving the block copolymer in a solvent. Examples of the solvent include aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycol ethers such as ethylene glycol dimethyl ether, diethylene glycol dimethyl ether, triglyme, propylene glycol monomethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero element-containing compounds such as carbon disulfide; and mixture solvents thereof. A percentage content of the block copolymer in the block copolymer solution is preferably 0.1 to 15% by mass and more preferably 0.3 to 5% by mass relative to 100% by mass of the block copolymer solution.

In addition, the block copolymer solution may further comprise a different homopolymer (a homopolymer other than the first homopolymer and the second homopolymer in the block copolymer contained in the solution: for example, when the combination of the first homopolymer and the second homopolymer in the block copolymer is a combination of polystyrene and polymethyl methacrylate, the different homopolymer may be any kind of homopolymer other than polystyrene and polymethyl methacrylate), a surfactant, an ionic compound, an anti-foaming agent, a leveling agent, and the like.

When the block copolymer solution comprises the different homopolymer, the shape of the micro phase separation structure formed by the block copolymer (for example, the depths of the concavities and convexities and the like) can be altered. For example, to obtain greater depths of the concavities and convexities formed by the micro phase separation structure, a polyalkylene oxide can be used. As the polyalkylene oxide, polyethylene oxide or polypropylene oxide is more preferable, and polyethylene oxide is particularly preferable. In addition, as the polyethylene oxide, one represented by the following formula is preferable:

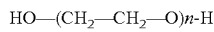

HO—(CH$_2$—CH$_2$—O)$n$-H

[in the formula, n represents an integer of 10 to 5000 (more preferably an integer of 50 to 1000, and further preferably an integer of 50 to 500)].

If the value of n is less than the lower limit, the molecular weight is so low that the effect achieved by the different homopolymer contained tends to be poor because the polyethylene oxide is lost due to volatilization, vaporization, or the like during a heat treatment at a high temperature. Meanwhile, if the value of n exceeds the upper limit, the molecular weight is so high that the molecular mobility is low. Hence, the speed of the phase separation is lowered, so that the formation of the micro phase separation structure tends to be inefficient.

In addition, the number average molecular weight (Mn) of the different homopolymer is preferably 460 to 220000 and more preferably 2200 to 46000. If the number average molecular weight is less than the lower limit, the molecular weight is so low that the effect achieved by the different homopolymer contained tends to be poor because the polyethylene oxide is lost due to volatilization, vaporization, or the like during a heat treatment at a high temperature. Meanwhile, if the number average molecular weight exceeds the upper limit, the molecular weight is so high that the molecular mobility is low. Hence, the speed of the phase separation is lowered so that the formation of the micro phase separation structure tends to be inefficient.

The molecular weight distribution (Mw/Mn) of the different homopolymer is preferably 1.5 or less and more preferably 1.0 to 1.3. If the molecular weight distribution exceeds the upper limit, the uniformity of the shape of the micro phase separation tends not to be maintained. Note that the number average molecular weight (Mn) and the weight average molecular weight (Mw) are values measured by gel permeation chromatography (GPC) and converted to molecular weights of standard polystyrene.

In addition, when the different homopolymer is used, it is preferable that the combination of the first homopolymer and the second homopolymer in the block copolymer be a combination of polystyrene and polymethyl methacrylate (polystyrene-polymethyl methacrylate), and that the different homopolymer be a polyalkylene oxide. The use of a polystyrene-polymethyl methacrylate block copolymer and a polyalkylene oxide in combination as described above further improves the orientation in the vertical direction, making it possible to further increase the depths of the concavities and convexities on the surface, and also makes it possible to shorten the heat treatment time during manufacturing.

When the different homopolymer is used in the block copolymer solution, the content thereof is preferably 100 parts by mass or less, and more preferably 5 parts by mass to 100 parts by mass, relative to 100 parts by mass of the block copolymer. If the content of the different homopolymer is less than the lower limit, the effect obtained by the different homopolymer contained tends to be poor.

In addition, when the surfactant is used, the content thereof is preferably 10 parts by mass or less relative to 100 parts by mass of the block copolymer. Moreover, when the ionic compound is used, the content thereof is preferably 10 parts by mass or less relative to 100 parts by mass of the block copolymer.

In addition, when the block copolymer solution comprises the different homopolymer, the total percentage content of the block copolymer and the different homopolymer is preferably 0.1 to 15% by mass, and more preferably 0.3 to 5% by mass, in the block copolymer solution. If the total percentage content is less than the lower limit, it is difficult to uniformly apply the solution in a film thickness sufficient to obtain a necessary film thickness. If the total percentage content exceeds the upper limit, it tends to be relatively difficult to prepare a solution in which the block copolymer and the different homopolymer are uniformly dissolved in the solvent.

In addition, the base member used in the step (I) is not particularly limited, and examples thereof include substrates of resins such as polyimide, polyphenylene sulfide (PPS), polyphenylene oxide, polyether ketone, polyethylene naphthalate, polyethylene terephthalate, polyarylate, triacetyl cellulose, and polycycloolefin; inorganic substrates such as glass, octadecyldimethylchlorosilane (ODS)-treated glass, octadecyltrichlorosilane (OTS)-treated glass, organosilicate-treated glass, and silicon substrates; and substrates of metals such as aluminum, iron, and copper. In addition, the base member may be subjected to surface treatments such as an orientation treatment. Note that, by treating the surface of a substrate such as glass with ODS, an organosilicate, or the like as described above, the micro phase separation structure such as a lamellar structure, a cylindrical structure, or a spherical structure is more likely to be arranged perpendicularly to the surface in the heating step described later. This is because the domain of each block constituting the block copolymer is more likely to be oriented perpendicularly by reducing the interface energy difference between the surfaces of the block copolymer components and the base member.

Moreover, the method for applying the block copolymer solution onto the base member is not particularly limited, and, for example, a spin coating method, a spray coating method, a dip coating method, a dropping method, a gravure printing method, a screen printing method, a relief printing method, a die coating method, a curtain coating method, or an inkjet method can be employed.

In addition, regarding the thickness of the coating film of the block copolymer formed on the base member, the thickness of the coating film after drying is preferably 10 to 3000 nm and more preferably 50 to 500 nm.

<Step (II)>

The step (II) is a step of drying the coating film on the base member. The step of drying the coating film is not particularly limited, and may be conducted in an air atmosphere. In addition, the drying temperature in this step is not particularly limited, as long as the solvent can be removed from the coating film at the temperature. The drying temperature is preferably 30 to 200° C. and more preferably 40 to 100° C. Note that, by the drying, the block copolymer starts to form the micro phase separation structure, and concavities and convexities are formed on a surface of the coating film (thin film) in some cases.

<Step (III)>

The step (III) is a step (first heating step) of heating the coating film dried in the step (II) at a temperature which is not lower than the glass transition temperature (Tg) of the block copolymer.

The heating of the coating film at a temperature which is not lower than the glass transition temperature (Tg) of the block copolymer in the coating film as described above can cause the micro phase separation of the block copolymer into portions of the first polymer segment and the second polymer segment by causing the self-assembly of the block copolymer to proceed in the coating film, so that the micro phase separation structure can be formed efficiently.

In the first heating step (III), the heating temperature is set to a temperature which is not lower than the glass transition temperature (Tg). If the heating temperature is lower than the glass transition temperature (Tg) of the block copolymer, the molecular mobility of the polymer is so low that the self-assembly of the block copolymer does not proceed sufficiently, and the formation of the micro phase separation structure is insufficient, or the heating time required for the sufficient formation of the micro phase separation structure tends to be long. In addition, the upper limit of the heating temperature is not particularly limited, unless the block copolymer is pyrolyzed at the temperature. The method for conducting the first heating step is not particularly limited, and, for example, a method using an oven or the like, as appropriate, under an air atmosphere may be employed. Note that the drying and heating steps (steps (II) and (III)) may be conducted continuously by gradually elevating the heating temperature. Note that when the drying and heating steps are conducted continuously by gradually elevating the heating temperature as described above, the drying step (step (II)) is included in the heating step (step (III)).

<Step (IV)>

The step (IV) is a step (etching step) of removing, after the step (III) is conducted, the second polymer (segment) by an etching treatment on the coating film, thereby forming a concavity and convexity structure on the base member.

The etching step (IV) is a step of selectively removing one (second polymer segment) of the polymer segments constituting the block copolymer by etching by utilizing the following nature. Specifically, since the molecular structure is different between the first polymer segment and the second polymer segment, the etching rate (easiness of etching) is different therebetween. Hence, one (second polymer segment) of the polymer segments can be selectively removed depending on the kinds of the homopolymers of the first polymer segment and the second polymer segment. The removal of the second polymer segment from the coating film in this etching step makes it possible to efficiently form, in the coating film, a remarkable concavity and convexity structure originated from the micro phase separation structure (the structure formed in the step (III)) of the block copolymer.

As an etching treatment for selectively removing one of the polymer segments as described above, for example, an etching method using a reactive ion etching method, an ozone oxidation method, a hydrolysis method, a metal ion staining method, an ultraviolet-ray etching method, or the like can be employed, as appropriate. Moreover, as the etching treatment, a method may be employed in which covalent bonds in the block copolymer are cleaved by treating the covalent bonds with at least one selected from the group consisting of acids, bases, and reducing agents, and then the coating film in which the micro phase separation structure is formed is washed with a solvent which dissolves only the one of the polymer segments, or the like, thereby removing only the one of the polymer segments, while keeping the micro phase separation structure.

<Step (V)>

The step (V) is a step (second heating step) of heating the concavity and convexity structure formed in the step (IV) at a temperature which is not lower than the glass transition temperature (Tg) of the first polymer (segment). The second heating step (V) is conducted as a so-called annealing treatment, and this heating makes smoother the line connecting the lowermost portions of the concave portions and the vertices of the convex portions forming the concavity and convexity structure, so that the kurtosis of the concavity and convexity shape is reduced.

The heating temperature in this second heating step (V) is preferably not lower than the glass transition temperature of the first polymer segment remaining after the etching (not lower than the glass transition temperature of the first homopolymer). The heating temperature is more preferably not lower than the glass transition temperature of the first homopolymer and not higher than a temperature (Tg+70° C.) which is 70° C. higher than the glass transition temperature of the first homopolymer. If the heating temperature is lower than the glass transition temperature of the first homopolymer, a desired concavity and convexity structure cannot be obtained after the electroforming step described later, or it tends to be necessary to conduct the heating for a long period for forming a desired concavity and convexity structure. Meanwhile, if the heating temperature exceeds the upper limit, the concavity and convexity shape tends to collapse greatly, because the entire first polymer segment melts or decomposes. Regarding the method for actually conducting the second heating step, for example, the second heating step may be conducted, for example, under an air atmosphere by using an oven or the like, as appropriate, as in the case of the first heating step. In addition, the heating time in the second heating step is preferably 10 minutes to 100 hours.

Note that the sectional structure of the concavity and convexity structure subjected to the etching step (IV) can be so complicated that side surfaces of grooves defined by the concavity and convexity structure are rough, and concavities and convexities (including overhangs) are formed in a direction perpendicular to the thickness direction. The higher the molecular weight of the block copolymer is, the more likely to be formed the concavities and convexities present on the side surfaces of the convex portions are. On the other hand, the molecular weight of the block copolymer has a close relationship with the micro phase separation structure and, in turn, the pitches of the diffraction grating obtained therefrom. In this respect, even when a block copolymer having a relatively high molecular weight is used in order to achieve a distribution of pitches preferable for the first concavities and convexities more efficiently, it can be said that it is preferable to perform the second heating step as described above in order to more reliably obtain a concavity and convexity structure having characteristics such as the desired pitch distribution by electroforming. In the second heating step (V), by heating the concavity and convexity structure subjected to the etching step (IV), an annealing treatment is performed on the first polymer segment constituting the side surfaces of the concavity and convexity shape, so that the sectional shape defined by the first polymer segment can be a relatively smooth inclined surface (the lines each connecting the lowermost portion of a concave portion and the vertex of a convex portion can be made smoother). As a result, a mountain-like shape tapered upward from the base member (referred to as "mountain-like shape structure" in the present application) is obtained. The concavities and convexities on the side surfaces are annealed by heating as described above, and the overhang portions are turned into smooth inclined surfaces by the heating. Hence, the concavities and convexities of the mountain-like shape structure obtained in the second heating step (V) make it possible to more easily peel a metal layer after the metal layer is deposited on the first polymer segment, and efficiently transfer the concavity and convexity shape to the metal layer.

Here, if the side surfaces of the grooves defined by the concavity and convexity structure subjected to the etching step (IV) are rough, and concavities and convexities (including overhangs) are formed in a direction perpendicular to the thickness direction, portions to which the seed layer for the electroforming is not attached are likely to be formed, and hence it tends to be difficult to uniformly deposit the metal layer by the electroforming. For this reason, when a first polymer segment layer having a concavity and convexity structure with rough side surfaces is used as it is, the mechanical strength of the obtained mold tends to be low, and deformation of the mold and defects such as pattern defects tend to occur. In addition, it tends to be difficult to obtain an electroforming film having a uniform film thickness in the case of a complicated sectional structure of concavities and convexities with rough side surfaces, because, in electroforming (electroplating), the thickness of the plating varies among potions depending on the shape of a workpiece, and a metal to be deposited is more likely to be attracted to convex portions and projecting corners of the workpiece, but is less likely to be attracted to concave portions and recessed portions. Moreover, suppose a case where such a complicated sectional structure can be transferred to a mold obtained by electroforming. Even in such a case, when transfer of the concavity and convexity shape is attempted by pressing the mold to a diffraction grating formation material, the diffraction grating formation material enters spaces in the complicated sectional structure of the mold. Hence, the mold cannot be peeled from the resin after the curing, or portions of the mold with low strength may fracture, so that pattern defects may occur in some cases. In view of these points in combination, it is preferable to perform the second heating step as described above from the viewpoint of more reliably obtaining a concavity and convexity structure having characteristics such as the desired pitch distribution by electroforming.

The base member having the concavities and convexities (the concavities and convexities of the mountain-like shape structure) obtained by performing the second heating step (V) as described above can be suitably used as a master for transfer to a metal in a subsequent step. For this reason, the concavities and convexities of the mountain-like shape structure preferably satisfy the following conditions: when a Fourier-transformed image is obtained by performing two-dimensional fast Fourier transform processing on a concavity and convexity analysis image obtained by analyzing the shape of the concavities and convexities by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 10 $\mu m^{-1}$ or less; and the standard deviation of a depth distribution of the concavities and convexities is 15 to 100 nm (more preferably 15 to 50 nm). In addition, the average pitch of the concavities and convexities of the mountain-like shape structure is preferably within a range from 10 to 1500 nm, more preferably from 100 to 1500 nm, and more preferably from 200 to 1500 nm (note that the upper limit value of the range of the average pitch is further preferably 700 nm). If the average pitch of the concavities and convexities is less than the lower limit, the pitch is so small relative to wavelengths of the visible light that diffraction of the visible light, which is necessary for a diffraction grating obtained by using such a master block, is less likely to occur. Meanwhile, if the average pitch exceeds the upper limit, the diffraction angle of a diffraction grating obtained by using such a master block is so small that the exhibition of the functions as a diffraction grating tends to be insufficient. Note that the average pitch of the concavities and convexities refers to an average value of pitches of the concavities and convexities, where pitches (distances between adjacent convex portions or between adjacent concave portions) of the concavities and convexities on the surface of the concavities and convexities of the mountain-like shape structure are measured. In addition, a value calculated as follows is employed as the average value of pitches of the concavities and convexities. Specifically, a concavity and convexity analysis image of the shape of the concavities and convexities on the surface is obtained by measurement using as canning probe microscope (for example, one manufactured by SII NanoTechnology Inc., under the trade name of "E-sweep," or the like). Then, distances between randomly selected adjacent convex portions or between randomly selected adjacent concave portions are measured at 100 points or more in the concavity and convexity analysis image, and the average of these distances is determined.

Meanwhile, the average height of the concavities and convexities formed on the base member is preferably in a range from 20 to 400 nm, more preferably in a range from 30 to 400 nm, further preferably in a range 35 to 300 nm, and particularly preferably in a range from 40 to 200 nm. The upper limit value of the range of the average height of the first concavities and convexities is further preferably 100 nm and particularly preferably 80 nm. If the average height of the concavities and convexities is less than the lower limit, the height is so insufficient relative to wavelengths of the visible light that the diffraction tends to be insufficient. Meanwhile, suppose a case where the average height exceeds the upper limit. In such a case, when the obtained diffraction grating is used as an optical element on the light extraction port side of an organic EL element, destruction of the element and life-shortening of the element tend to easily occur because of heat generation which occurs when the electric field distribution inside the EL layer becomes nonuniform, and hence the electric field concentrates on a certain position. Note that the average height of the concavities and convexities herein refers to an average value of heights of the concavities and convexities, where the heights of the concavities and convexities (the distances between concave portions and convex portions in the depth direction) on the surface on which the concavity and convexity shape is formed are measured. In addition, a value calculated as follows is employed as the average value of the heights of the concavities and convexities. Specifically, a concavity and convexity analysis image of the shape of the concavities and convexities on the surface is obtained by measurement using a scanning probe microscope (for example, one manufactured by SII NanoTechnology Inc., under the trade name of "E-sweep," or the like). Then, distances between randomly selected concave portions and convex portions in the depth direction are measured at 100 points or more in the concavity and convexity analysis image, and the average of these distances is determined.

Note that characteristics (the average height, the average pitch, the average value (m), and the like) of the concavities and convexities of the base member having the concavities and convexities (the concavities and convexities of the mountain-like shape structure) can be easily adjusted to desired characteristics by adjusting the kind of the block copolymer, the heating temperature in the heating treatment, and the like, or by other means.

<Step (VI) to Step (VIII)>

The step (VI) is a step of forming a seed layer on the concavity and convexity structure subjected to the step (V). The step (VII) is a step of stacking a metal layer on the seed layer by electroforming (electric field plating). The step (VIII) is a step of peeling the base member having the concavity and convexity structure from the metal layer and the seed layer. These steps are described below with reference to FIGS. 3 to 6.

Figure 3:
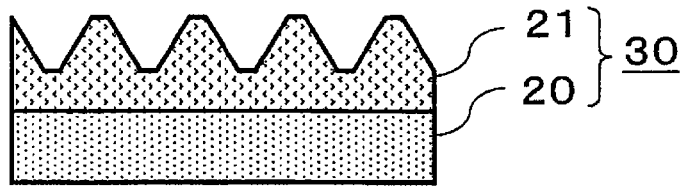
FIG. 3 is a cross-sectional view schematically showing an embodiment of a base member (master for transfer) on which a layer having concavities and convexities of a mountain-like shape structure and being made of a first polymer segment is formed.
Figure 4:
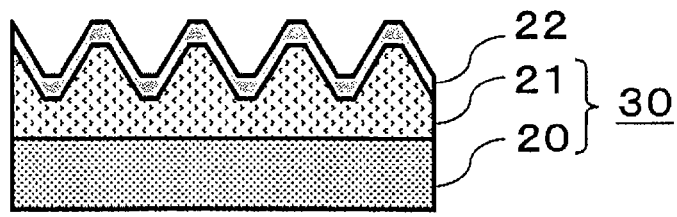
FIG. 4 is a cross-sectional view schematically showing a state where the layer having the concavities and convexities of the mountain-like shape structure and being made of the first polymer segment is formed and a seed layer is stacked on the concavities and convexities on the surface of the base member (master for transfer).
Figure 5:
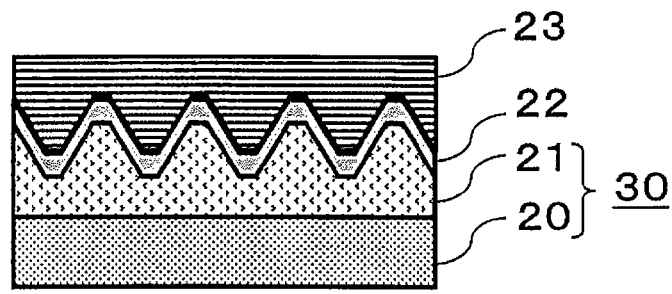
FIG. 5 is a cross-sectional view schematically showing a state where a metal layer is formed on the seed layer.
Figure 6:
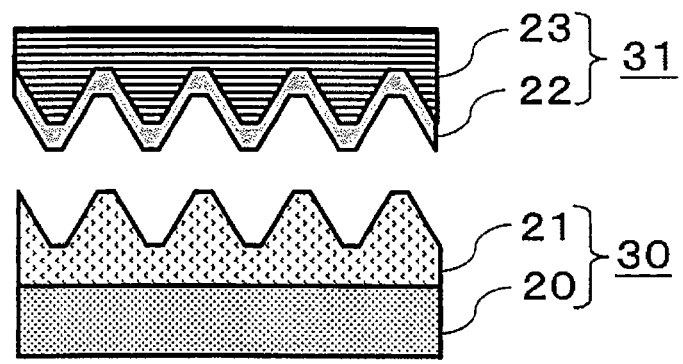
FIG. 6 is a cross-sectional view schematically showing a state where a metal portion (master block) comprising the metal layer and the seed layer stacked on the surface of the master for transfer is peeled from the master for transfer.

FIG. 3 is a cross-sectional view schematically showing a master 30 for transfer in which a layer 21 made of the first polymer segment and having the concavities and convexities of the mountain-like shape structure is formed on the base member 20. FIG. 4 is a cross-sectional view schematically showing a state where a seed layer 22 is formed on the concavities and convexities on the surface of the layer 21 made of the first polymer segment in the master 30 for transfer. FIG. 5 shows a state where a metal layer 23 is formed on the surface of the seed layer 22 by electroforming (electric field plating). FIG. 6 is a cross-sectional view schematically showing a state where the metal layer 23 and the seed layer 22 are peeled from the master 30 for transfer.

In the step (VI), the seed layer 22 is formed on the concavity and convexity structure of the base member (the master 30 for transfer), the concavity and convexity structure being obtained after the step (V) is performed (see FIGS. 3 and 4).

The seed layer 22 is to serve as a conductive layer for a subsequent electroforming treatment. A method for forming the seed layer 22 is not particularly limited, and it is possible to employ, as appropriate, a known method capable of forming a so-called conductive layer on the concavity and convexity-shaped layer 21 formed on the surface of the base member 20 into such a shape that the shape of the concavities and convexities is maintained. For example, the seed layer 22 can be formed by a method such as electroless plating, sputtering, or vapor deposition.

In addition, the thickness of the seed layer 22 is not particularly limited, as long as the current density can be uniform in the subsequent electroforming step, so that the thickness of the metal layer deposited in the subsequent electroforming step can be constant. Since a higher effect can be obtained, the thickness of the seed layer 22 is preferably 10 nm or more and more preferably 100 nm or more. In addition, a material of the seed layer is not particularly limited, and it is possible to use, for example, nickel, copper, gold, silver, platinum, titanium, cobalt, tin, zinc, chromium, a gold-cobalt alloy, a gold-nickel alloy, a boron-nickel alloy, solder, a copper-nickel-chromium alloy, a tin-nickel alloy, a nickel-palladium alloy, a nickel-cobalt-phosphorus alloy, an alloy of any ones thereof, or the like.

After the seed layer 22 is formed on the surface (the concavity and convexity-shaped surface) of the layer 21 made of the first polymer segment of the master 30 for transfer as described above, a metal layer is stacked on the seed layer by electroforming (electric field plating) (Step (VII): see FIG. 5).

The thickness of the metal layer 23 is not particularly limited, and, for example, the total thickness including the thickness of the seed layer 22 may be 10 to 3000 µm. Any one of the above-described metal species usable for the seed layer 22 can be used as a material of the metal layer 23 deposited by the electroforming. As the material of the metal layer 23, nickel is preferable from the viewpoints of the wear resistance, releasability, and the like of the obtained mold. In such a case, it is preferable to use nickel also for the seed layer 22.

In addition, conditions of the electroforming for forming the metal layer 23 are not particularly limited, and conditions employed in a known electrolytic plating method may be employed as appropriate. In addition, the current density for the electroforming may be, for example, 0.03 to 10 A/cm$^2$, from the viewpoints that a uniform metal layer is formed by preventing bridge, and that the electroforming time is shortened.

Note that when the mold comprising the metal layer 23 and the seed layer 22 is used, the metal layer 23 is pressed to the resin layer, and subjected to treatments such as the peeling and the washing. Hence, the metal layer preferably has a moderate hardness and a moderate thickness from the viewpoint of ease of these treatments. From such a viewpoint, a diamond-like carbon (DLC) treatment or a Cr plating treatment may be performed on the surface of the metal mold in order to improve the hardness of the metal layer 23 formed by electroforming. Alternatively, the surfaces hardness of the metal layer 23 may be increased by further performing a heat treatment on the metal layer 23.

After the metal layer 23 is formed as described above, a metal portion 31 comprising the metal layer 23 and the seed layer 22 is peeled from the base member (the master for transfer) having the concavity and convexity structure as shown in FIG. 6 (step (VIII)).

A master block (mold) for forming a diffraction grating can be obtained by peeling the thus obtained metal portion 31 comprising the seed layer 22 and the metal layer 23 from the base member having the concavity and convexity structure. In other words, a master block (mold) 31 for forming a diffraction grating comprising the seed layer 22 and the metal layer 23 can be obtained as described above.

A method for peeling the master block (mold) 31 for forming a diffraction grating is not particularly limited, and a known method can be used as appropriate. A physically peeling method may be employed, or a method may be employed in which the mold (metal portion) 31 is peeled off by removing by dissolution of the first homopolymer and the remaining block copolymer by use of an organic solvent, such as toluene, tetrahydrofuran (THF), or chloroform, capable of dissolving them. In addition, in the thus obtained mold 31, the characteristic of the concavities and convexities of the master 30 for transfer are transferred (inverted).

In addition, when the master block (mold) 31 for forming a diffraction grating is peeled from the master 30 for transfer (the base member 10 on which the layer 21 having the concavities and convexities of the mountain-shaped structure is stacked), part of the polymer, for example, the first polymer segment, may remain in a state of being attached to the surface of the mold, in some cases, depending on the method for the peeling treatment. In such a case, the polymer attached to and remaining on the surface of the mold is preferably removed by washing. As the method for the washing, wet washing or dry washing can be employed. In addition, examples of the method for the wet washing include methods for removal by washing with an organic solvent such as toluene or tetrahydrofuran, a surfactant, or an alkali-based solution. Note that when an organic solvent is used, ultrasonic cleaning may be performed. In addition, the polymer attached to and remaining on the surface of the mold may be removed by electrolytic cleaning. Meanwhile, an example of the method for the dry washing is a method for removal by ashing using ultraviolet rays or plasma. Furthermore, the polymer attached to and remaining on the surface of the mold may be removed by washing in which a combination of such wet washing and dry washing is employed. In addition, after the washing, the mold may be rinsed with pure water or purified water, dried, and then irradiated with ozone. Moreover, the polymer attached to and remaining on the surface of the mold may be removed by repeatedly conducting a step in which a resin film (for example, a UV-curable resin) is applied onto the mold, and cured, and then the polymer is removed by peeling the cured film.

Hereinabove, the method for manufacturing the master block (mold) for forming a diffraction grating comprising the steps (I) to (VIII) is described. However, the method for manufacturing such a master block (mold) for forming a diffraction grating having the concavities and convexities formed thereon is not particularly limited, and a known method can be used as appropriate. For example, a resin layer having a concavity and convexity structure originated from the micro phase separation structure of the block copolymer obtained by carrying out the steps (I) to (IV) (preferably, carrying out the step (V) in combination) as it is may be used as a mold. Alternatively, by using a resin layer having a concavity and convexity structure originated from the micro phase separation structure of the block copolymer obtained by carrying out the steps (I) to (IV) (preferably, carrying out the step (V) in combination), a transfer material (a material other than the above-described seed layer and metal layer) is attached onto the surface of the concavity and convexity structure of the resin layer, and the transfer material is cured and then detached. Thus, a concavity and convexity transfer member having concavities and convexities formed on a surface thereof is obtained, and this concavity and convexity transfer member may be used as a master block (mold) for forming a diffraction grating. Moreover, a diffraction grating is formed by using a mold obtained by carrying out the steps (I) to (VIII), and the obtained diffraction grating may be used as another master block (mold) for forming a diffraction grating. The transfer material is not particularly limited, and, for example, may be a resin composition of a silicone-based polymer (silicone rubber), a urethane rubber, a norbornene resin, a polycarbonate, polyethylene terephthalate, polystyrene, polymethyl methacrylate, an acrylic resin, a liquid crystal polymer, an epoxy resin, or the like. In addition, a method for attaching the transfer material is not particularly limited, and examples of employable methods include vacuum vapor deposition methods; various coating methods such as a spin coating method, a spray coating method, a dip coating method, a dropping method, a gravure printing method, a screen printing method, a relief printing method, a die coating method, a curtain coating method, an inkjet method, and a sputtering method. In addition, although conditions for curing the transfer material vary depending on the kind of the transfer material used, for example, the curing temperature is preferably within a range from room temperature to 250° C., and the curing time is preferably within a range from 0.5 minutes to 3 hours. In addition, a method may be employed in which the transfer material is cured by irradiation with energy rays such as ultraviolet rays or electron beams. In this case, the amount of irradiation is preferably within a range from 20 mJ/cm$^2$ to 10 J/cm$^2$. In addition, a final mold (master block) may be manufactured by repeating the step using the transfer material, and thus repeating the inversion and transfer of the concavities and convexities. Even when concavities and convexities (including overhangs) are formed on side surfaces of convex portions of a concavity and convexity structure (the concavity and convexity structure of the master) not subjected to the inversion and transfer of the concavities and convexities, the sectional shape can be smoothed (the lines each connecting the lowermost portion of a concave portion and the vertex of a convex portion can be made smoother) each time the step is performed by repeating the inversion and transfer of the concavities and convexities by use of such a transfer material. For this reason, even when concavities and convexities (including overhangs) are formed on side surfaces of convex portions of the concavity and convexity structure (the concavity and convexity structure of the master) not subjected to the inversion and transfer of the concavities and convexities, the shape of the concavities and convexities can be made a desired shape (for example, the mountain-like shape as described above) by repeating the inversion and transfer of the concavities and convexities by use of such a transfer material.

In addition, as another method for manufacturing a master block (mold) having concavities and convexities formed thereon for forming a diffraction grating is, for example, a method may be employed which comprises:

a step (i) of forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film; and a step (ii) of attaching a master block material onto the vapor-deposition film, curing the master block material, and then detaching the cured master block material from the vapor-deposition film, thereby obtaining a master block.

Hereinafter, the steps (i) and (ii) are described separately.

<Step (i)>

The step (i) is a step of forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film. In this step, first, a polymer film made of a polymer whose volume changes by heat is prepared on a substrate for forming a polymer film. As the polymer whose volume changes by heat, one whose volume changes by heating or cooling (for example, one having a coefficient of thermal expansion of 50 ppm/K or more) can be used as appropriate. As the polymer, a silicone-based polymer is more preferable, and a silicone-based polymer containing polydimethylsiloxane is particularly preferable, from the viewpoint that the concavities and convexities of wrinkles are easily formed on the surface of the vapor-deposition film, because the difference between the coefficient of thermal expansion of the polymer and the coefficient of thermal expansion of the vapor-deposition film is large, and because the polymer has a high flexibility. In addition, a method for forming the polymer film is not particularly limited, and, for example, a method can be employed in which the polymer is applied onto the substrate by employing a spin coating method, a dip coating method, a dropping method, a gravure printing method, a screen printing method, a relief printing method, a die coating method, a curtain coating method, an inkjet method, a spray coating method, a sputtering method, a vacuum vapor deposition method, or the like.

In addition, the substrate for forming a polymer film is not particularly limited, and a known substrate (a glass substrate or the like) which can be used for forming a polymer film can be used as appropriate. In addition, the thickness of the thus formed polymer film is preferably within a range from 10 to 5000 μm, and more preferably within a range from 10 to 2000 μm. Note that the polymer film kept stacked on the substrate may be used, or the polymer film may be used after detached from the substrate.

In addition, in the step (i), after the polymer film is prepared, a vapor-deposition film is formed on a surface of the polymer film under a temperature condition of 70° C. or above. The temperature at which the vapor-deposition film is formed needs to be 70° C. or above, and is more preferably 90° C. or above. If the temperature is lower than 70° C., the concavities and convexities of wrinkles cannot be formed sufficiently on the surface of the vapor-deposition film. As the method for forming the vapor-deposition film, a known method such as a vapor deposition method or a sputtering method can be employed as appropriate. Of these methods, the vapor deposition method is preferably employed from the viewpoint of maintaining the shape of the concavities and convexities formed on the surface of the polymer film. In addition, a material of the vapor-deposition film is not particularly limited, and examples thereof include metals such as aluminum, gold, silver, platinum, and nickel; and metal oxides such as aluminum oxide.

Moreover, in the step (i), after the vapor-deposition film is formed on the surface of the polymer film as described above, concavities and convexities of wrinkles are formed on the surface of the vapor-deposition film by cooling the polymer film and the vapor-deposition film. When the polymer film and the vapor-deposition film are cooled after the vapor-deposition film is formed on the polymer film as described above, the volume of each of the polymer film and the vapor-deposition film changes. However, since there is a difference between the coefficient of thermal expansion of the material forming the polymer film and the coefficient of thermal expansion of the material forming the vapor-deposition film, the layers have different volume change ratios, and hence concavities and convexities of wrinkles (the so-called bucking pattern or the so-called Turing pattern) are formed on the surface of the vapor-deposition film. In addition, after the cooling, the temperatures of the polymer film and the vapor-deposition film are preferably 40° C. or below. If the temperatures of the polymer film and the vapor-deposition film after the cooling exceed the upper limit, it tends to be difficult to form the concavities and convexities of wrinkles on the surface of the vapor-deposition film. Moreover, the rate of temperature drop in cooling the polymer film and the vapor-deposition film is preferably within a range from 1 to 80° C./minute. If the rate of temperature drop is less than the lower limit, the concavities and convexities tend to be relaxed. Meanwhile, if the rate of temperature drop exceeds the upper limit, scars such as cracks tend to be easily formed on the surfaces of the polymer film and the vapor-deposition film.

<Step (ii)>

The step (ii) is a step of attaching a master block material onto the vapor-deposition film, curing the master block material, and then detaching the cured master block material from the vapor-deposition film, thereby obtaining a master block for forming a diffraction grating. In this step, first, a master block material is attached onto the surface of the vapor-deposition film (the surface having the concavity and convexity shape).

The master block material is not particularly limited, as long as the master block obtained from the master block material is capable of maintaining the strength, hardness, and the like enough to be used as a mold for the concavity and convexity shape. Examples of the master block material include inorganic substances such as nickel, silicon, silicon carbide, tantalum, glassy carbon, silica glass, and silica; and resin compositions of silicone-based polymers (silicone rubbers), urethane rubbers, norbornene resins, polycarbonates, polyethylene terephthalate, polystyrene, polymethyl methacrylate, acrylic, liquid crystal polymers, and the like. Of these master block materials, silicone-based polymers, nickel, silicon, silicon carbide, tantalum, glassy carbon, silica glass, and silica are more preferable, silicone-based polymers are further more preferable, and silicone-based polymers containing polydimethylsiloxane are particularly preferable, from the viewpoints of moldability, conformity to a fine pattern, and mold releasability.

In addition, a method for attaching the master block material onto the surface of the vapor-deposition film on which the concavity and convexity shape is formed is not particularly limited, and examples of employable methods include electroplating; vacuum vapor deposition methods; and various coating methods such as a spin coating method, a spray coating method, a dip coating method, a dropping method, a gravure printing method, a screen printing method, a relief printing method, a die coating method, a curtain coating method, an inkjet method, and a sputtering method.

In addition, in the step (ii), after the master block material is attached onto the surface of the vapor-deposition film as described above, the master block material is cured. General conditions for curing the master block material cannot be specified, because the conditions vary depending on the kind of the master block material used. For example, when a resin material is used, it is preferable to set a curing temperature within a range from room temperature to 250° C., and a curing time within a range from 0.5 minutes to 3 hours, depending on the kind of the material. In addition, a method may be employed in which the master block material is cured by irradiation with energy rays such as ultraviolet rays or electron beams, depending on the kind of the master block material. In such a case, the amount of irradiation is preferably within a range from 20 mJ/cm$^2$ to 10 J/cm$^2$.

In addition, in the step (ii), after the master block material on the surface of the vapor-deposition film is cured as described above, a master block for forming a diffraction grating is obtained by detaching the layer obtained by curing the master block material from the vapor-deposition film. A method for detaching the master block from the vapor-deposition film as described above is not particularly limited, and a known method can be employed as appropriate.

In addition, when the master block is manufactured by using a polymer whose volume changes by heat as the master block material, the steps (i) and (ii) may be repeated by using the master block as the polymer film. By repeatedly carrying out the steps (i) and (ii) as described above, wrinkles formed on the surface of the master block can be deepened, and the average height of the concavities and convexities formed on the surface of the master block can be increased.

In addition, one obtained by applying a resin (a material used as a master block material) onto a surface of a master block obtained by carrying out the steps (i) and (ii) as described above, curing the resin, and detaching the cured resin may be used as a master block. Moreover, a concavity and convexity film of a cured resin obtained by pressing the master block onto a coating film of a resin and curing the resin, instead of applying a resin onto a surface of the obtained master block, may be used as a master block. As described above, a resin film in which the concavities and convexities are inverted can also be used as a master block.

Moreover, a final master block may be manufactured from a master block obtained by carrying out the steps (i) and (ii) by repeating inversion and transfer of the concavities and convexities through one or more intermediate master blocks. As the intermediate master blocks, those obtained by appropriately inverting or transferring the concavity and convexity structure can be used. In addition, when a master block is manufactured by repeating the inversion and transfer of the concavities and convexities as described above, it is possible to conduct temporal transfer to a flexible material (for example, a plastic film or a silicone rubber) during the transfer of the concavity and convexity structure of the master block, in order to facilitate the transfer of the concavity and convexity structure even in a case where a non-flexible substrate (for example, glass) from which a resin film or the like is difficult to peel is used. Hence, the same concavity and convexity structure as that of the master block used tends to be easily obtained (the same even-odd property is obtained). In addition, it is also possible to further repeat the steps (i) and (ii) by using, as a master block, a polymer film obtained by applying a polymer whose volume changes by heat onto any one of the intermediate master blocks, and curing the polymer. In addition, when the intermediate master block is made of a UV-curable resin, postcure may be conducted by irradiation again with ultraviolet light, after the intermediate master block is obtained by irradiation with ultraviolet light, during the manufacturing thereof. The postcure conducted by irradiating again a master block made of a UV-curable resin with ultraviolet light as described above leads to a tendency that the degree of the cross-linking of the master block is improved, and the mechanical strength and the chemical resistance are improved.

In addition, the master blocks (including the intermediate master blocks) obtained by carrying out the steps (i) and (ii) may be converted to metal master blocks by performing a plating treatment by use of a known method. The formation of the metal master blocks by plating as described above leads to a tendency that master blocks which are excellent in mechanical strength and which can be used repeatedly can be obtained. The use of a master block plated as described above as a mold for nanoimprinting or the like makes it possible to mass-produce resin substrates having a predetermined concavity and convexity pattern by repeatedly conducting transfer to curable resin substrates. Examples of materials usable for the plating include nickel, copper, iron, nickel-cobalt alloys, nickel-iron alloys, and the like. Note that the thickness of the plating layer is preferably 50 μm to 1 mm from the viewpoints of mechanical strength, time required for the formation of the mold, and the like. In addition, one obtained by heating the thus obtained master block under atmospheric pressure under a temperature condition of about 80 to 200° C. for about 1 to 48 hours may be used as a master block for manufacturing a diffraction grating.

The concavity and convexity shape of the master block (mold) for forming a diffraction grating finally obtained by using, as appropriate, the above-described method for manufacturing the master block (mold) for forming a diffraction grating preferably has characteristics similar to those of the above-described first concavities and convexities. The shape of the concavities and convexities can be easily adjusted by changing, as appropriate, the kind of the polymer used, the heating conditions in the heating step, and the like, by repeating the transfer step, or by other means.

Next, a step of manufacturing a diffraction grating by using the obtained master block (mold) 31 for forming a diffraction grating is described. Specifically, the step (step of manufacturing a diffraction grating) is described in which a material (diffraction grating formation material) for forming a diffraction grating (concavity and convexity layer) 11 is applied onto a transparent supporting substrate, and is cured with the master block 31 being pressed thereto. Then, the master block 31 is detached, so that a diffraction grating 11 having concavities and convexities formed thereon is stacked on the transparent supporting substrate.

Figure 7:
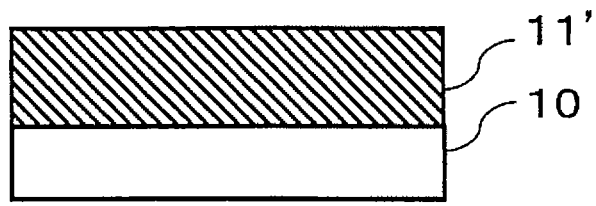
FIG. 7 is a cross-sectional view schematically showing a state where a diffraction grating formation material is applied onto a transparent supporting substrate.
Figure 8:
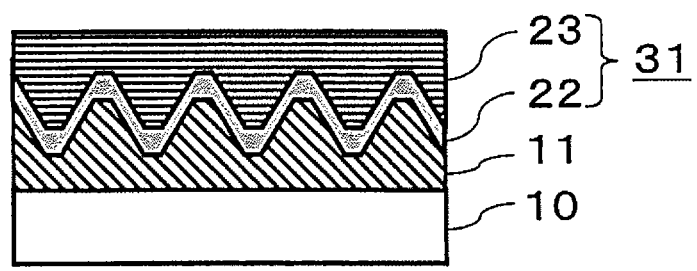
FIG. 8 is a cross-sectional view schematically showing a state where the diffraction grating formation material is cured with the master block for forming a diffraction grating being pressed thereto.
Figure 9:
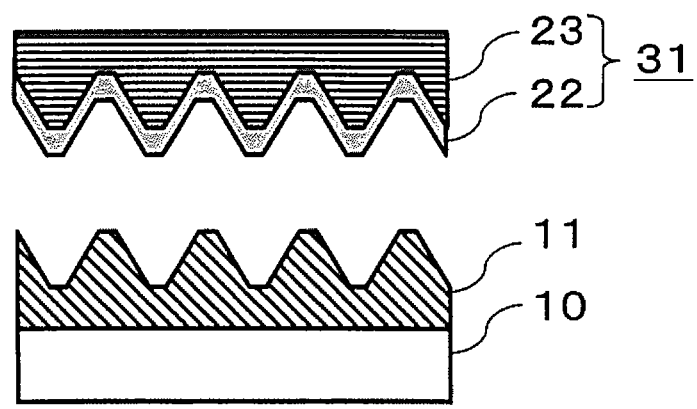
FIG. 9 is a cross-sectional view schematically showing a state where concavities and convexities are formed on a surface of a cured layer of the diffraction grating formation material by detaching the master block for forming a diffraction grating.

FIGS. 7 to 9 are schematic diagrams for describing a preferred embodiment of the method for manufacturing a diffraction grating. Here, FIG. 7 is a cross-sectional view schematically showing a state where a diffraction grating formation material 11' is applied onto the transparent supporting substrate 10. FIG. 8 is a cross-sectional view schematically showing a state where the diffraction grating formation material is cured with the master block 31 being pressed thereto. FIG. 9 is a cross-sectional view schematically showing a state where concavities and convexities are formed on a surface of the diffraction grating 11 by detaching the master block 31.

In the step of manufacturing the diffraction grating 11, first, the diffraction grating formation material 11' is applied onto the transparent supporting substrate 10 (see FIG. 7). After that, with the master block (mold) 31 for forming a diffraction grating being pressed to a coating film of the diffraction grating formation material 11', the diffraction grating formation material is cured (see FIG. 8).

This transparent supporting substrate 10 is the same as the above-described transparent supporting substrate 10. In addition, as the diffraction grating formation material 11', the same materials (resin materials and transparent inorganic layer formation materials) as those described as materials for forming the diffraction grating (the concavity and convexity layer) can be used.

When a transparent inorganic layer formation material is used as the diffraction grating formation material 11' (when an inorganic layer is formed as the concavity and convexity layer), a sol containing a metal material is preferably used to more efficiently form a concavity and convexity layer to which the pattern is transferred by sol-gel process. The sol containing a metal material is not particularly limited. For example, when an inorganic concavity and convexity layer made of silica is formed, the sol may be a sol containing a silica precursor (a metal alkoxide). In addition, examples of the silica precursor include metal alkoxides including tetraalkoxide monomers such as tetramethoxysilane (TMOS), tetraethoxysilane (TEOS), tetra-i-propoxysilane, tetra-n-propoxysilane, tetra-sec-butoxysilane, tetra-n-butoxysilane, tetra-sec-butoxysilane, and tetra-t-butoxysilane; trialkoxide monomers such as methyltrimethoxysilane, ethyltrimethoxysilane, propyltrimethoxysilane, isopropyltrimethoxysilane, phenyltrimethoxysilane, methyltriethoxysilane, ethyltriethoxysilane, propyltriethoxysilane, isopropyltriethoxysilane, phenyltriethoxysilane, methyltripropoxysilane, ethyltripropoxysilane, propyltripropoxysilane, isopropyltripropoxysilane, phenyltripropoxysilane, methyltriisopropoxysilane, ethyltriisopropoxysilane, propyltriisopropoxysilane, isopropyltriisopropoxysilane, and phenyltriisopropoxysilane; polymers obtained by polymerizing any of these monomers to a small extent; composite materials obtained by introducing a functional group or a polymer into part of any of the above-described materials; and the like. Note that the sol only needs to be capable of forming an inorganic layer in a sol-gel process, and the kind of the metal material is not particularly limited. Examples of the metal material other than metal alkoxides include metal acetylacetonates, metal carboxylates, oxychlorides, chlorides, mixtures thereof, and the like. Moreover, the metal species in the metal material is not particularly limited, and a metal species other than silicon (Si) can be used as appropriate, as long as the metal species is capable of forming an inorganic layer in a sol-gel process. For example, Ti, Sn, Al, Zn, Zr, In, or the like may be used as appropriate. In addition, one of the above-described metal materials may be used alone, or a combination of two or more thereof may be used as a mixture. In addition, as the sol, one obtained by mixing, as appropriate, precursors of the inorganic layer (a layer made of a simple substance of the metal or an oxide of the metal) can also be used. In addition, when a mixture of TEOS and MTES is used for the sol, the blending ratio thereof is not particularly limited, and may be 1:1.

Moreover, examples of the solvent of the sol include alcohols such as methanol, ethanol, isopropyl alcohol (IPA), and butanol; aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycols such as ethylene glycol and propylene glycol; glycol ethers such as ethylene glycol dimethyl ether, diethylene glycol dimethyl ether, and propylene glycol monomethyl ether acetate; esters such as ethyl acetate, ethyl lactate, and γ-butyrolactone; phenols such as phenol and chlorophenol; amides such as N, N-dimethylformamide, N,N-dimethylacetamide, and N-methylpyrrolidone; halogen-containing solvent such as chloroform, methylene chloride, tetrachloroethane, monochlorobenzene, and dichlorobenzene; hetero element-containing compounds such as carbon disulfide; water; and mixture solvents thereof. In particular, ethanol and isopropyl alcohol are preferable, and mixtures of ethanol or isopropyl alcohol with water are also preferable.

Moreover, examples of additives which can be added to the sol include polyethylene glycol, polyethylene oxide, hydroxypropyl cellulose, and polyvinyl alcohol for adjusting the viscosity; alkanolamines such as triethanolamine, β-diketones such as acetylacetone, β-ketoesters, formamide, dimethylformamide, dioxane, which are solution stabilizers; and the like.

In addition, the coating thickness of the diffraction grating formation material is preferably within a range in which the thickness of the diffraction grating 11 can be 0.01 to 500 μm. If the coating thickness of the diffraction grating formation material is less than the lower limit, the heights of the concavities and convexities formed on the surface of the concavity and convexity layer tends to be insufficient. Meanwhile, if the coating thickness exceeds the upper limit, an effect of volume change of the material which occurs during the curing of the concavity and convexity layer tends to be so large that the formation of the concavity and convexity shape tends to be poor.

In addition, examples of methods which can be employed as a method for applying the diffraction grating formation material 11' (including the sol) onto the transparent supporting substrate 10 include various coating methods such as a spin coating method, a spray coating method, a dip coating method, a dropping method, a gravure printing method, a screen printing method, a relief printing method, a die coating method, a curtain coating method, an inkjet method, and a sputtering method.

Moreover, when the diffraction grating formation material 11' is a resin material, the conditions for curing the diffraction grating formation material vary depending on the kind of the resin material used. However, the curing temperature is preferably within a range from room temperature to 250° C., and the curing time is preferably within a range from 0.5 minutes to 3 hours, for example. Alternatively, when the diffraction grating formation material is a material which is cured by irradiation with energy rays such as ultraviolet rays or electron beams, a method may be employed in which the material is irradiated with energy rays. In such a case, the amount of irradiation is preferably within a range from 20 mJ/cm$^2$ to 5 J/cm$^2$.

In addition, when the sol is used, and the diffraction grating formation material is cured (when an inorganic layer is formed), a cured layer (an inorganic layer) may be formed from the sol by employing, as appropriate, known conditions which can be employed in the so-called sol-gel process, depending on the metal species or the kind of the metal material used. For example, when an inorganic layer (concavity and convexity layer) made of silica is formed by using a sol containing a silica precursor, the inorganic layer can be formed by performing hydrolysis and a polycondensationn reaction to synthesize amorphous silica. The hydrolysis and the polycondensation reaction are not particularly limited, as long as these are conducted under conditions where the amorphous silica can be synthesized. It is preferable to add an acid such as hydrochloric acid, an alkali such as ammonia, or the like to adjust the pH of the sol. It is more preferable to adjust the pH to 4 or lower or 10 or higher. In addition, additional water may be added for performing the hydrolysis. Note that when additional water is added for performing the hydrolysis as described above, the amount of water added is preferably 1.5 times or more in terms of molar ratio relative to the metal alkoxide species. In addition, when a transparent inorganic layer formation material is used as the diffraction grating formation material 11' (when an inorganic layer is formed as the concavity and convexity layer), it is preferable to use a heated pressing roll for pressing the master block (mold) 31 for forming a diffraction grating to the coating film of the sol. By pressing the mold to the coating film with heating as described above, the coating film can be cured with the mold being pressed thereto. Hence, the formation of the concavity and convexity layer tends to be more efficient. In addition, after the inorganic layer is formed by curing the transparent inorganic layer formation material as described above, it is preferable to further heat the inorganic layer at a temperature of 200 to 1200° C. for 5 minutes to 6 hours, from the viewpoint of increasing the mechanical strength.

Note that the heat resistance of the diffraction grating 11 tends to be improved in a case where the diffraction grating 11 is formed of the transparent inorganic layer format ion material, as compared with a case where a resin material is used. For this reason, when the diffraction grating 11 is formed of the transparent inorganic layer formation material, not only an organic EL element having a higher power efficiency can be obtained because a film of a low resistant transparent electrode (for example, ITO) can be formed efficiently by the so-called sputtering with heating, but also degradation due to high temperature of the organic EL element can be suppressed further sufficiently because the diffraction grating 11 does not undergoes color change or the like even when the organic EL element is used under a high-temperature condition. In addition, when the diffraction grating 11 is formed of the transparent inorganic layer formation material, it is also possible to wash the concavity and convexity pattern surface of the diffraction grating 11 with a brush before the element is formed. Here, a comparison is made between a case where the transparent inorganic layer formation material is used as the material for forming the concavity and convexity layer and a case where a resin material is used. In the former case, the mechanical strength of the surface of the concavity and convexity layer is higher, and the formation of scars on the surface of the layer can be suppressed more sufficiently during the brush-washing process (basically, no scars are formed). Hence, the surface of the concavity and convexity layer can be washed efficiently, and foreign substances and the like on the surface can be removed more efficiently. For this reason, formation of defects due to foreign substance and the like on the surface can be sufficiently suppressed (the defective rate can be lowered). Moreover, a layer having a better chemical resistance can be formed, and hence the alkaline resistance of the layer can be improved to a higher level in a case where the diffraction grating 11 is formed of the transparent inorganic layer formation material than in a case where a resin material is used. For this reason, various washing solvents can be used in the step of washing the surface. In other words, the washing liquid is not particularly limited in the washing step conducted before the element is formed, and it is also possible to use alkalis or various organic solvents as appropriate. Moreover, as described above, a layer having a better chemical resistance can be formed in a case where the diffraction grating 11 is formed of the transparent inorganic layer formation material than in a case where a resin material is used. Hence, damage due to a resist or a developer for ITO patterning tends to be more reduced in the former case. In addition, a higher level of UV resistance can be imparted to the diffraction grating 11 in a case where the diffraction grating 11 is formed of the transparent inorganic layer formation material than in a case where a resin material is used. Hence, when the diffraction grating 11 is formed of the transparent inorganic layer formation material, organic contaminants can be efficiently removed by UV-ozone washing, so that the defective rate due to organic contaminants can be reduced. Moreover, even when the diffraction grating 11 is used outdoors, degradation due to sunlight can be suppressed sufficiently, and a higher level of weather resistance tends to be achieved.

In addition, in the step of manufacturing a diffraction grating, next, the master block 31 is detached from the cured diffraction grating 11 (see FIG. 9). A method for detaching the master block 31 from the cured diffraction grating 11 as described above is not particularly limited, and a known method can be employed as appropriate. Thus, the diffraction grating 11 having concavities and convexities formed thereon can be stacked on the transparent supporting substrate 10.

Note that when the concavity and convexity structure of the master block (mold 31) is transferred to the diffraction grating format ion material by carrying out this step using the master block (mold 31), a mold-release treatment may be performed on the master block 31 in advance in order to improve the mold releasability from the diffraction grating formation material. The mold-release treatment is not particularly limited, and an approach of lowering the surface energy is employed, in general. Examples of the mold-release treatment include a method in which the concavity and convexity surface of the mold is coated with a mold release agent such as a fluorine-containing material, a silicone resin, or the like (for example, one manufactured by Daikin Chemicals Sales, Ltd. under the trade name of "HD-2101TH"), or treated with a fluorine-containing silane coupling agent, a method in which a film of diamond-like carbon is formed on the surface, and the like.

Thus, the transparent supporting base member 10 provided with the diffraction grating 11 having a desired pattern can be obtained. Further, the step of manufacturing a diffraction grating 11 may be carried out again by using the thus obtained transparent supporting base member 10 provided with the diffraction grating 11 as a master block (mold) for forming a diffraction grating. Specifically, a replica having an inverted pattern may be manufactured by using the transparent supporting base member 10 provided with the diffraction grating 11 as a master block. In this case, the replica may be used as the diffraction grating 11. In addition, the step of inversion and transfer may be carried out repeatedly. For example, the transfer step may be repeated again by using the replica having an inverted pattern as a master block to from a child replica. A diffraction grating 11 in which the first concavities and convexities are formed may be finally formed by repeating the inversion and transfer of the concavities and convexities as described above. Note that when replicas are sequentially formed as described above, a film may be stacked by a vapor phase method such as a vapor deposition method or a sputtering method on the surface, on which the concavity and convexity pattern is formed, of the concavity and convexity layer used as a master block. When the film is stacked as described above, and when the transfer or the like is performed by applying a resin onto a surface of the film or by other means, the adhesion with the resin (for example, a UV-curable resin) can be lowered, and the master block can be easily peeled off. In addition, the vapor-deposition film may be made of, for example, a metal such as aluminum, gold, silver, platinum, or nickel, or a metal oxide such as aluminum oxide. In addition, the thickness of the film is preferably 5 to 500 nm. If the thickness is less than the lower limit, a uniform film is difficult to obtain, and the sufficient adhesion-lowering effect is impaired. If the thickness exceeds the upper limit, the shape of the master block tends to be dull. When the concavity and convexity layer of the replica is made of a UV-curable resin, postcure may be conducted, as appropriate, by irradiation again with ultraviolet light or the like after the resin is cured.

(Organic EL Element Formation Step)

Subsequently, the organic EL element formation step is described. The organic EL element formation step is a step of stacking, on a surface of the diffraction grating 11 obtained by the diffraction grating formation step, each of the transparent electrode 12, the organic layer 13, and the metal electrode 14 formed into such shapes that the shape of the first concavities and convexities formed on the surface of the diffraction grating 11 is maintained, thereby obtaining an organic EL element.

As a method for stacking, on the diffraction grating, the transparent electrode 12 formed into such a shape that the shape of the first concavities and convexities is maintained as described above, for example, a method can be preferably employed in which the transparent electrode 12 is stacked by a known method such as the vapor deposition method or the sputtering method by using the above-described transparent electrode material. When a transparent electrode is stacked by employing a known method such as the vapor deposition method or the sputtering method and by using the above-described transparent electrode material as described above, while changing the conditions as appropriate, the transparent electrode 12 can be formed into such a shape that the shape of the first concavities and convexities is sufficiently maintained. In other words, since the material for the transparent electrode 12 comprises a metal or a metal oxide, concavities and convexities having a standard deviation (σ) and a ratio of a change in the standard deviation which are within the above-described ranges can be formed easily by employing a known method such as the vapor deposition method or the sputtering method and by changing, as appropriate, the vapor deposition conditions, the sputtering conditions, or the like. Hence, concavities and convexities originated from characteristics of the first concavities and convexities (for example, concavities and convexities satisfying the above-described conditions of the kurtosis, the average height, the average pitch, and the inequality (1) as in the case of the first concavities and convexities) can be formed easily. In addition, as the method for stacking the transparent electrode 12, the sputtering method is preferably employed, because concavities and convexities having a standard deviation (σ) and a ratio of a change in the standard deviation which are within the above-described ranges can be formed more efficiently.

In addition, as the method for stacking the organic layer 13 formed into such a shape that the shape of the first concavities and convexities formed on the surface of the diffraction grating 11 is maintained, for example, a method can be preferably employed in which the layers in the organic layer 13 are sequentially stacked on the transparent electrode 12 by a known method such as the vapor deposition method or the sputtering method sequentially using the above-described materials to constitute the layers in the organic layer. In addition, of these methods, the vacuum vapor deposition method is more preferably employed for the following reasons. Specifically, by the vacuum vapor deposition method, the shape of the first concavities and convexities formed on the surface of the diffraction grating 11 can be maintained more sufficiently. Hence, not only fourth to sixth concavities and convexities having standard deviations (σ) and ratios of changes in the standard deviations which are within the above-described ranges can be formed more efficiently, but also fourth to sixth concavities and convexities having characteristics of concavities and convexities originated from the characteristics of the first concavities and convexities (for example, concavities and convexities satisfying the above-described conditions of the kurtosis, the average height, the average pitch, and the inequality (1) as in the case of the first concavities and convexities) can be formed more reliably. In addition, materials other than the dopant material which are used in the vacuum vapor deposition method to constitute the hole transporting layer, the light emitting layer, and the electron transporting layer (note that, when the glass transition temperature of the dopant material (a phosphorescent material or the like) can be measured, the dopant material is also included) are each further preferably an organic material having a glass transition temperature of 70° C. to 300° C. By using organic materials having such glass transition temperatures, each of the materials can be easily immobilized at a site at which the material arrives during the vapor deposition (a site on a material to be coated) and in the vicinity of the site. Hence, each of the layers in the organic layer each having such a concavity and convexity shape that the shape of the first concavities and convexities is sufficiently maintained can be formed more reliably. Therefore, concavities and convexities having a standard deviation (σ) and a ratio of a change in the standard deviation which are within the above-described ranges can be formed more efficiently. Note that, as a method for obtaining a light emitting layer in which a dopant material is dispersed, a known method can be employed as appropriate, and, for example, a co-vapor deposition method using a host material and a dopant material may be employed.

In addition, as a method for stacking the metal electrode 14 formed into such a shape that the shape of the first concavities and convexities formed on the surface of the diffraction grating 11 is maintained, a method can be preferably employed in which the metal electrode 14 is stacked on the organic layer 13 by a known method such as the vapor deposition method or the sputtering method by using the above-described material for the metal electrode 14. Of these method, the vacuum vapor deposition method is preferably employed for the following reasons. Specifically, by the vacuum vapor deposition, the shape of the first concavities and convexities formed on the surface of the diffraction grating 11 can be maintained more sufficiently. Hence, not only second concavities and convexities having a standard deviation (σ) and a ratio of a change in the standard deviation which are within the above-described ranges can be formed more efficiently, but also second concavities and convexities having characteristics of concavities and convexities originated from the characteristics of the first concavities and convexities (for example, concavities and convexities satisfying the above-described conditions of the kurtosis, the average height, the average pitch, and the inequality (1) as in the case of the first concavities and convexities) can be formed.

Next, another preferred embodiment of the organic EL element of the present invention is described with reference to FIG. 10.

In the organic EL element of the present invention, the diffraction grating is preferably disposed on one surface side of the transparent supporting substrate, and the organic EL element of the present invention preferably further comprises an optical member disposed on another surface side of the transparent supporting substrate. Specifically, the organic EL element of the present invention is preferably an organic EL element comprising:

a transparent supporting substrate;

a diffraction grating which comprises a concavity and convexity layer having first concavities and convexities formed on a surface thereof and which is disposed on one surface side of the transparent supporting substrate;

a transparent electrode, an organic layer, and a metal electrode which are stacked in this order on the diffraction grating and formed into such shapes that a shape of the first concavities and convexities formed on the surface of the diffraction grating is maintained, the organic layer comprising at least a light emitting layer, and an optical member disposed on another surface side of the transparent supporting substrate, wherein the organic EL element satisfies the above-described conditions (A) to (C).

Figure 10:
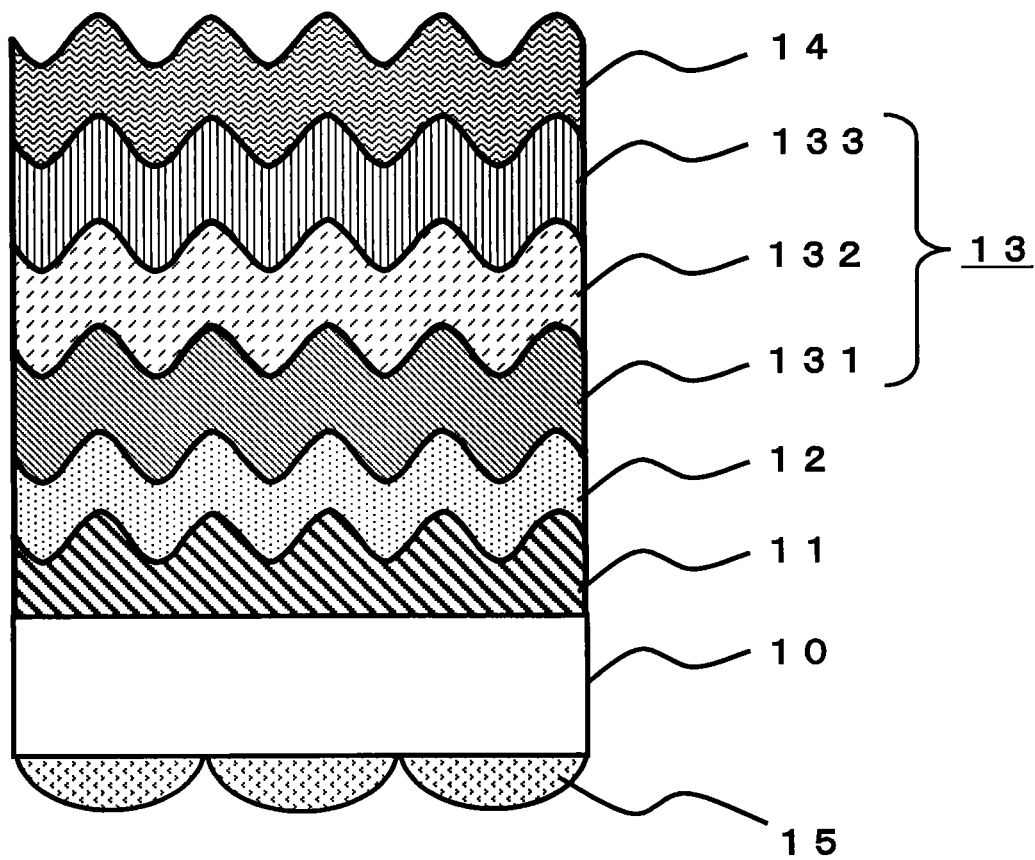
FIG. 10 is a cross-sectional view schematically showing another preferred embodiment (an embodiment further comprising an optical member) of the organic EL element of the present invention.

FIG. 10 is a cross-sectional view schematically showing the other preferred embodiment of the organic EL element of the present invention. The organic EL element of the embodiment shown in FIG. 10 comprises: a transparent supporting substrate 10; a diffraction grating 11 which comprises a concavity and convexity layer having concavities and convexities formed on a surface thereof and which is disposed on one surface side of the transparent supporting substrate 10; a transparent electrode 12, an organic layer 13, and a metal electrode 14, which are stacked in this order on the diffraction grating 11 and formed into such shapes that a shape of the concavities and convexities formed on the surface of the diffraction grating 11 is maintained; and an optical member 15 disposed on another surface side of the transparent supporting substrate 10. In addition, in the organic EL element of the embodiment shown in FIG. 10, the organic layer 13 has a layered structure comprising a hole transporting layer 131, a light emitting layer 132, and an electron transporting layer 133. Note that the diffraction grating 11, the transparent electrode 12, the organic layer 13 (the hole transporting layer 131, the light emitting layer 132, and the electron transporting layer 133), and the metal electrode 14 are the same as those described for the above-described organic EL element of the embodiment shown in FIG. 1.

<Optical Member 15>

The optical member 15 is used for efficiently extracting light, which would otherwise be repeatedly reflected inside the transparent supporting substrate, to the outside. The optical member 15 is not particularly limited, as long as the optical member 15 can be used for light extraction of an organic EL element. A known optical member having a structure capable of extracting light to the outside of the element can be used as appropriate. As the optical member 15, it is possible to use, for example, a lens member (a convex lens (a hemispherical lens or the like), a concave lens, a prism lens, a cylindrical lens, a microlens comprising a concavity and convexity layer which can be formed by employing the same method as the above-described method (the method for manufacturing a diffraction grating 11) by which the diffraction grating 11 (a concavity and convexity layer) is manufactured, or the like), a diffusion sheet or diffusion plate obtained by kneading a diffusion material with a transparent material, or the like. It is more preferable to use a lens member as the optical member 15, because the light can be extracted more efficiently. In addition, multiple lens members may be used as the optical member 15. In such a case, a so-called microlens may be formed by arranging minute lens members. Note that a commercially available product may be used, as appropriate, as the optical member 15 for extracting light to the outside.

In addition, when a microlens comprising a concavity and convexity layer which can be formed by employing the same method as the method for manufacturing a diffraction grating 11 (a concavity and convexity layer) is used as the optical member 15, the shape of the concavities and convexities of the microlens is preferably such a shape that when a Fourier-transformed image is obtained by performing two-dimensional fast Fourier transform processing on a concavity and convexity analysis image obtained by analyzing the shape with an atomic force microscope, the Fourier-transformed image shows a circular or annular pattern substantially centered at an origin at which an absolute value of wavenumber is 0 $\mu m^{-1}$. In such a microlens comprising a concavity and convexity layer, the concavity and convexity shape is isotropic in any cross-sectional direction. Hence, when light is allowed to be incident on one surface (the surface in contact with the substrate) side and to exist from the surface on which the shape is formed, it is possible to sufficiently reduce the angle dependence of the emitted light (the angle dependence of luminance) and the change in chromaticity.

In addition, when a microlens comprising a concavity and convexity layer as described above is used as the optical member 15, the Fourier-transformed image of the concavities and convexities is preferably present within a region where an absolute value of wavenumber is within a range of 1 $\mu m^{-1}$ or less. When the Fourier-transformed image satisfy the above-described condition, it is possible to sufficiently reduce the angle dependence of the emitted light and the change in chromaticity at higher levels. In addition, the circular or annular pattern of the Fourier-transformed image is preferably present within a region where an absolute value of wavenumber is within a range from 0.05 to 1 $\mu m^{-1}$, and is more preferably present within a region where an absolute value of wavenumber is within a range from 0.1 to 0.5 $\mu m^{-1}$, from the viewpoint of efficiently refracting or diffracting an emission spectrum in the visible region (380 nm to 780 nm). If the circular or annular pattern is not present within the region where an absolute value of wavenumber is within the range, that is, if the number of bright spots which form the circular or annular pattern in the Fourier-transformed image and which are present within the range is less than 30%, refraction effective for a lens for extracting light tends not to be obtained. In addition, the pattern of the Fourier-transformed image is more preferably annular from the viewpoint that a sufficient effect is obtained on light having wavelengths in the visible region (380 nm to 780 nm).

In addition, when a microlens comprising a concavity and convexity layer as described above is used as the optical member 15, an average pitch of the concavities and convexities of the microlens is preferably within a range from 2 to 10 $\mu m$, and more preferably within a range from 2.5 to 5 $\mu m$. If the average pitch of the concavities and convexities is less than the lower limit, not only the light extraction effect tends to decrease because the optical member has a stronger diffraction effect as a diffraction grating than a refraction effect for extracting light to the outside, but also sufficient light emission tends not to be obtained at some measurement positions because the angle dependence of the emitted light is increased. Meanwhile, if the average pitch exceeds the upper limit, a diffraction effect tends to be difficult to obtain, so that the characteristics tend to be at the same levels as those of ordinary hemispherical lenses. Moreover, an average height of the concavities and convexities of the microlens is preferably within a range from 400 to 1000 nm, more preferably within a range from 600 to 1000 nm, and further preferably within a range from 700 to 900 nm. If the average height (depth) of the concavities and convexities is less than the lower limit, a sufficient refraction or diffraction effect tends not to be obtained. Meanwhile, if the average height exceeds the upper limit, the mechanical strength tends to decrease, so that cracks are more likely to be formed during manufacturing or use. Note that the microlens comprising such a concavity and convexity layer can be formed by employing the above-described method for manufacturing a diffraction grating 11 and by changing, as appropriate, the conditions for forming the master block, and the like to adjust, as appropriate, the characteristics (the size and the like) of the concavity and convexity shape.

In addition, as the optical member 15 for extracting light to the outside, those having various sizes and shapes can be used, as appropriate, depending on the application, the size, and the structure of the organic EL element, and the like. It is preferable to use a hemispherical lens or a microlens comprising a concavity and convexity layer which can be formed by employing the same method as the above-described method for manufacturing a diffraction grating 11 (a concavity and convexity layer) from the viewpoint of suppressing the reflection at the interface between the air and the structure for extraction to the outside. Moreover, when the thickness of the organic EL element does not matter (when a large thickness is acceptable), a hemispherical lens is preferably used. When the thickness matters a lot (when a smaller thickness is preferable), a micro lens comprising a concave and convex layer is preferably used. When a microlens comprising a concavity and convexity layer obtained by employing the same method as the method for manufacturing a diffraction grating 11 (a concavity and convexity layer) is used as described above, the concavity and convexity shape is isotropic in any cross-sectional direction. Hence, when light is allowed to be incident on one surface (the surface in contact with the substrate) side and to exist from the surface on which the shape is formed, it is possible to sufficiently reduce the angle dependence of the emitted light (the angle dependence of luminance) and the change in chromaticity.

In addition, a hemispherical lens preferable as the optical member 15 is preferably a hemispherical lens whose bottom surface area is 1 to 10 times a light emission area of the organic EL element. In other words, when a hemispherical lens is used, it is preferable to use a hemispherical lens having a bottom surface area which is 1 to 10 times the one-pixel area, which is a light emission area of an organic EL element, and completely cover one pixel, which is a light emission area of the organic EL element, with the bottom surface of the hemispherical lens. If the bottom surface area of the hemispherical lens is less than the lower limit, the component of the light generated in the organic EL element obliquely incident on a spherical surface portion of the hemispherical lens tends to increase. Meanwhile, if the bottom surface area exceeds the upper limit, the organic EL element tends to be excessively large, and the hemispherical lens tends to be expensive.

In addition, the material of the optical member 15 is not particularly limited, and an optical member made of a known material can be used, as appropriate. For example, it is possible to use, as appropriate, a transparent inorganic material such as glass; a transparent resin material made of a transparent polymer or the like such as a polyester-based resin such as polyethylene terephthalate, a cellulose-based resin, an acetate-based resin, a polyether sulfone-based resin, a polycarbonate-based resin, a polyamide-based resin, a polyimide-based resin, a polyolefin-based resin, or an acrylic resin; or the like. In addition, the optical member 15 is preferably stacked on the transparent supporting substrate 10, with an pressure-sensitive adhesive layer and/or an adhesive layer interposed therebetween in order not to allow the air to be present between the organic EL element and the optical member 15 for suppressing the reflection between the organic EL element and the optical member 15.

Moreover, in the optical member 15, a protective layer may be stacked on a surface of the optical member (on the surface on which the concavity and convexity shape is formed in a case where a microlens comprising a concavity and convexity layer as described above is used as the optical member 15), from the viewpoint that the friction resistance and the scar resistance of the surfaces are improved. As the protective layer, a transparent film or a transparent inorganic vapor deposition layer can be used as appropriate. The transparent film is not particularly limited, and a known transparent film can be used as appropriate. Examples thereof include films made of transparent polymers such as polyester-based resins including polyethylene terephthalate, cellulose-based resins, acetate-based resins, polyether sulfone-based resins, polycarbonate-based resins, polyamide-based resins, polyimide-based resins, polyolefin-based resins, and acrylic resins. In addition, the transparent film may be used after a pressure-sensitive adhesive layer or an adhesive layer is formed on one surface of the transparent film, and the transparent film is laminated on the surface of the optical member (note that, when a microlens comprising a concavity and convexity layer as described above is used as the optical member 15, the transparent film may be laminated with spaces being formed between convex portions). As the pressure-sensitive adhesive agent or the adhesive agent, for example, a synthetic rubber-based pressure-sensitive adhesive agent such as an acrylic pressure-sensitive adhesive agent, an ethylene-vinyl acetate copolymer, a natural rubber-based pressure-sensitive adhesive agent, polyisobutylene, butyl rubber, a styrene-butylene-styrene copolymer, and a styrene-isoprene-styrene block copolymer; a polyurethane-based pressure-sensitive adhesive agent; or a polyester-based pressure-sensitive adhesive agent may be used as appropriate.

In addition, when an inorganic vapor deposition layer is stacked as the protective layer, a known metal material capable of forming a transparent inorganic layer in the vapor deposition method can be used as appropriate, and example thereof include oxides, nitrides, and sulfides of metals such as Sn, In, Te, Ti, Fe, Co, Zn, Ge, Pb, Cd, Bi, Se, Ga, and Rb, and the like. In addition, $TiO_2$ can be preferably used as the metal material, from the viewpoint that deterioration due to oxidation can be prevented sufficiently. Meanwhile, ZnS can be preferably used from the viewpoint that high luminance can be obtained at low costs. In addition, a method for forming the inorganic vapor deposition layer is not particularly limited, and the inorganic vapor deposition layer may be manufactured, as appropriate, by using a known physical vapor deposition apparatus.

Next, a method which can be preferably employed as a method for manufacturing an organic EL element of the embodiment shown in FIG. 10 is described. As the method for manufacturing an organic EL element of the embodiment shown in FIG. 10, a method can be employed which comprises:

a step (a diffraction grating formation step) of forming a diffraction grating on a transparent supporting substrate (on one surface side of the transparent supporting substrate);

a step (an organic EL element formation step) of stacking, on a surface of the diffraction grating, each of the transparent electrode, the organic layer, and the metal electrode formed into such shapes that a shape of the first concavities and convexities formed on the surface of the diffraction grating (concavity and convexity layer) is maintained, thereby obtaining an organic EL element; and a step (optical member disposal step) of disposing an optical member on a surface of the transparent supporting substrate, the surface being opposite to the surface on which the diffraction grating is disposed. The diffraction grating formation step and the organic EL element formation step are the same as the diffraction grating formation step and the organic EL element formation step described for the method for manufacturing an organic EL element of the embodiment shown in FIG. 1. Hereinafter, the optical member disposal step is described.

(Optical Member Disposal Step)

The optical member disposal step is a step of disposing an optical member on a surface of the transparent supporting substrate, the surface being opposite to the surface on which the diffraction grating is disposed (a surface to be a light extraction surface after formation of the element). In this step, the optical member 15 may be stacked on the transparent supporting substrate 10, with a pressure-sensitive adhesive layer and/or an adhesive layer interposed therebetween. When the optical member 15 is stacked and disposed with a pressure-sensitive adhesive layer and/or an adhesive layer interposed therebetween as described above, for example, the optical member 15 may be stacked and disposed on the transparent resin substrate 10 by using a method in which the optical member 15 is stacked on the surface of the transparent supporting substrate 10, the surface being opposite to the surface on which the diffraction grating is disposed, by using an adhesive agent, a method in which the optical member 15 is stacked on the surface of the transparent supporting substrate 10, the surface being opposite to the surface on which the diffraction grating is disposed, by using a pressure-sensitive adhesive agent, or the like.

In addition, as a material of the pressure-sensitive adhesive layer and/or an adhesive layer, known materials (pressure-sensitive adhesive agents and adhesive agents) capable of adhering the optical member 15 onto the transparent supporting substrate 10 can be used as appropriate. For example, a synthetic rubber-based pressure-sensitive adhesive agent such as an acrylic pressure-sensitive adhesive agent, an ethylene-vinyl acetate copolymer, a natural rubber-based pressure-sensitive adhesive agent, polyisobutylene, butyl rubber, a styrene-butylene-styrene copolymer, or a styrene-inprene-styrene block copolymer; a polyurethane-based pressure-sensitive adhesive agent; or a polyester-based pressure-sensitive adhesive agent may be used as appropriate. Alternatively, a commercially available product (a UV-curable optical adhesive agent NOA60, NOA61, NOA71, NOA72, or NOA81 manufactured by Norland Products Inc. or UV-3400 manufactured by TOAGOSEI CO., LTD.) may be used. A method for applying the pressure-sensitive adhesive agent or the adhesive agent is not particularly limited, and a known method can be employed as appropriate. Note that the pressure-sensitive adhesive agent or the adhesive agent may be applied onto either the transparent supporting substrate 10 or the optical member 15. In addition, the optical member disposal step may be conducted before or after the diffraction grating 11 is formed. The order of execution of these steps is not particularly limited.

Note that, when a microlens comprising a concavity and convexity layer is used as the optical member 15, the following method can be employed as a method for manufacturing the microlens comprising a concavity and convexity layer. Specifically, a method can be employed which comprises a step of applying a material similar to the diffraction grating format ion material onto one surface of a planer supporting material, curing the material with a master block being pressed thereto, and then detaching the master block (a method basically the same as the above-described diffraction grating formation step; note that, in order to obtain a microlens having a desired shape, the manufacturing conditions can be changed, as appropriate, from those in the above-described diffraction grating formation step; for example, a method may be employed in which a master block for a microlens having desired characteristics is manufactured by repeating the transfer and inversion of master blocks, while changing the material as appropriate, and a microlens having a desired shape is manufactured by using the manufactured master block). When such a method is employed, the transparent supporting substrate 10 can also be used preferably as the supporting material. When the transparent supporting substrate 10 is used as the supporting material as described above, it is also possible to directly use the microlens, without peeling the microlens from the supporting material. Hence, it is no more necessary to conduct the step of stacking and disposing a microlens (an optical member 15) comprising a concavity and convexity layer with a pressure-sensitive adhesive layer and/or an adhesive layer, or the like interposed therebetween. Therefore, the step of manufacturing an organic EL element can be simplified. In addition, when a material other than the transparent supporting substrate 10 is used as the supporting material, a resin film (a film of TAC, PET, COP, PC, or the like) can be used as the supporting material. When such a microlens laminate in a state where the microlens is stacked on a resin film is obtained, the microlens laminate in this form as it is may be stacked on the transparent supporting substrate 10. Moreover, the microlens may be peeled from the supporting material, and only the microlens may be stacked on the transparent supporting substrate 10. When the microlens (concavity and convexity layer) is manufactured in the form of an independent film as described above, the microlens in this form as it is can be laminated on the surface of the transparent resin substrate 10. Hence, when a scar or a defect is found in the formed microlens comprising a concavity and convexity layer, such a portion can be removed. Moreover, when a defect is found on the element side, the defective part can be removed. Hence, the yield can also be improved. In addition, the thickness of the supporting material is not particularly limited, and is preferably within a range from 1 to 500 μm.

Hereinabove, the preferred embodiments of the organic EL element of the present invention are described on the basis of the organic EL element of the embodiment shown in FIG. 1 and the organic EL element of the other embodiment shown in FIG. 10. However, the organic EL element of the present invention is not limited to the above-described embodiments. For example, in each of the organic EL elements of the embodiments shown in FIGS. 1 and 10, the organic layer has a structure of hole transporting layer/light emitting layer/electron transporting layer stacked in this order. However, the organic EL element of the present invention only needs to comprise a transparent supporting substrate, a diffraction grating, a transparent electrode, an organic layer comprising at least a light emitting layer, and a metal electrode, and the structure of the organic layer is not particularly limited.

In other words, in the present invention, the structure of the organic layer is not particularly limited, as long as the organic layer stacked on the transparent electrode comprises a light emitting layer. A known organic layer which can be used as an organic layer of an organic EL element can be used as appropriate. The organic layer only needs to comprise at least one light emitting layer, and may be a laminate comprising a light emitting layer and various organic thin film layers other than the light emitting layer. The organic thin film layers other than the light emitting layer are not particularly limited, as long as the organic thin film layers can be used for an organic EL element. Examples of the organic thin film layers include a hole transporting layer, an electron transporting layer, an anode buffer layer, a hole blocking layer, an electron blocking layer, a cathode buffer layer (a cathode buffer layer in a case where the organic material content is 50% by mass or more; a case where the layer is an inorganic layer formed of a metal-based material is excluded), and the like. In addition, the hole transporting layer or the electron transporting layer may also play a role of a light emitting layer. In such a case, the organic layer between the transparent electrode and the metal electrode may have a two-layer structure (a structure of hole transporting layer/electron transporting layer; here, one of the layers functions as a light emitting layer).

More specifically, in addition to the embodiments shown in FIGS. 1 and 10 in each of which the organic layer 13 has a layered structure represented by the following structure (A):

(A) hole transporting layer 131/light emitting layer 132/electron transporting layer 133 (hereinafter the sign "/" means that the layers are stacked on each other), the organic layer in the present invention may be a layer having a layered structure in which other layers made of known organic materials, such as an anode buffer layer, a hole blocking layer, and an electron blocking layer, are stacked, as appropriate. Moreover, the light emitting layer in the organic layer may comprise two layers, namely, a first light emitting layer and a second light emitting layer which contain different host materials.

When the organic layer comprises layers other than the light emitting layer (layers which are other than the light emitting layer and are made of organic materials) as described above, the concavities and convexities formed on the surface, on the side facing to the metal electrode, of each of the other layers (a hole transporting layer, an electron transporting layer, an anode buffer layer, a hole blocking layer, an electron blocking layer, a cathode buffer layer (a cathode buffer layer in a case where the layer is formed of an organic material), and the like) preferably have characteristics similar to those of the concavities and convexities formed on the surface of each of the hole transporting layer, the light emitting layer, and the electron transporting layer described for the embodiments shown in FIGS. 1 and 10, when the layer has a thickness of 10 nm or more. Note that when such a layer in the organic layer has a thickness of less than 10 nm, the thickness is so small that, basically, the layer can be stacked by the vapor deposition method, the sputtering method, or the like, while the characteristics of the concavity and convexity shape formed on the surface of an object on which the layer is to be stacked (to-be-coated object) can be sufficiently inherited. Hence, the ratio of change in the characteristics of the concavity and convexity shape at the stacking tends to be low. Therefore, in the present invention, a condition that, when a layer in the organic layer has a thickness of 10 nm or more, the layer has characteristics similar to those of the concavities and convexities formed on the surface of each of the hole transporting layer, the light emitting layer, and the electron transporting layer described for the embodiments shown in FIGS. 1 and 10 is considered as a preferred condition. In addition, in the present invention, it is more preferable that the concavities and convexities formed on the surface, on the side facing to the metal electrode, of each of all the layers in the organic layer (all the layers regardless of the thicknesses of the layers) have characteristics similar to those of the concavities and convexities formed on the surface of each of the hole transporting layer, the light emitting layer, and the electron transporting layer described for the embodiments shown in FIGS. 1 and 10. Specifically, it is preferable that a standard deviation ($\sigma$) of a depth distribution of the concavities and convexities formed on the surface, on the side facing to the metal electrode, of each layer which is included in the organic layer and which has a thickness of 10 nm or more (more preferably each of all the layers in the organic layer regardless of the thicknesses) be 15 to 100 nm (more preferably 15 to 50 nm), and a ratio of a change in the standard deviation of the depth distribution of the concavities and convexities relative to the standard deviation of the depth distribution of the first concavities and convexities be +15% to −15%. Note that preferred ranges of the standard deviation ($\sigma$) of the depth distribution of the concavities and convexities of each of the other layers and the ratio of the change in the standard deviation thereof are the same as the preferred ranges of the standard deviation ($\sigma$) of the depth distribution of the concavities and convexities of each of the above-described hole transporting layer, light emitting layer, and electron transporting layer, and the ratio of the change in the standard deviation thereof. In addition, in each of the other layers, a material constituting the layer is preferably an organic material having a glass transition temperature (Tg) of 70° C. to 300° C., from the viewpoint of achieving a standard deviation ($\sigma$) and a ratio of a change in the standard deviation which are within the above-described ranges. When the material for forming each of the other layers has a glass transition temperature (Tg) of 70° C. to 300° C., a layer having concavities and convexities with a high conformity to the first concavities and convexities can be formed more efficiently. Thus, concavities and convexities having a standard deviation ($\sigma$) and a ratio of a change in the standard deviation which are within the above-described ranges can be formed on each of the layers more efficiently. Note that a preferred range of the glass transition temperature (Tg) of each of the materials of the other layers is the same as that of the material of the above-described hole transporting layer. In addition, it is preferable that the concavities and convexities formed on the surface, on the side facing to the metal electrode, of each of all the layers in the organic layer have characteristics similar to the characteristics of the first concavities and convexities (for example, the height of the concavities and convexities, and the like).

In addition, the structure of the organic EL element of the present invention is not particularly limited as described above, but it is preferable that the organic layer further comprise a hole transporting layer and an electron transporting layer, and that the light emitting layer be a layer containing a phosphorescent material and a host material. As described above, the organic EL element of the present invention is preferably, for example, an organic EL element of the embodiment shown in FIG. 1 or 10, wherein the light emitting layer is a layer containing a phosphorescent material and a host material.

Figure 11:
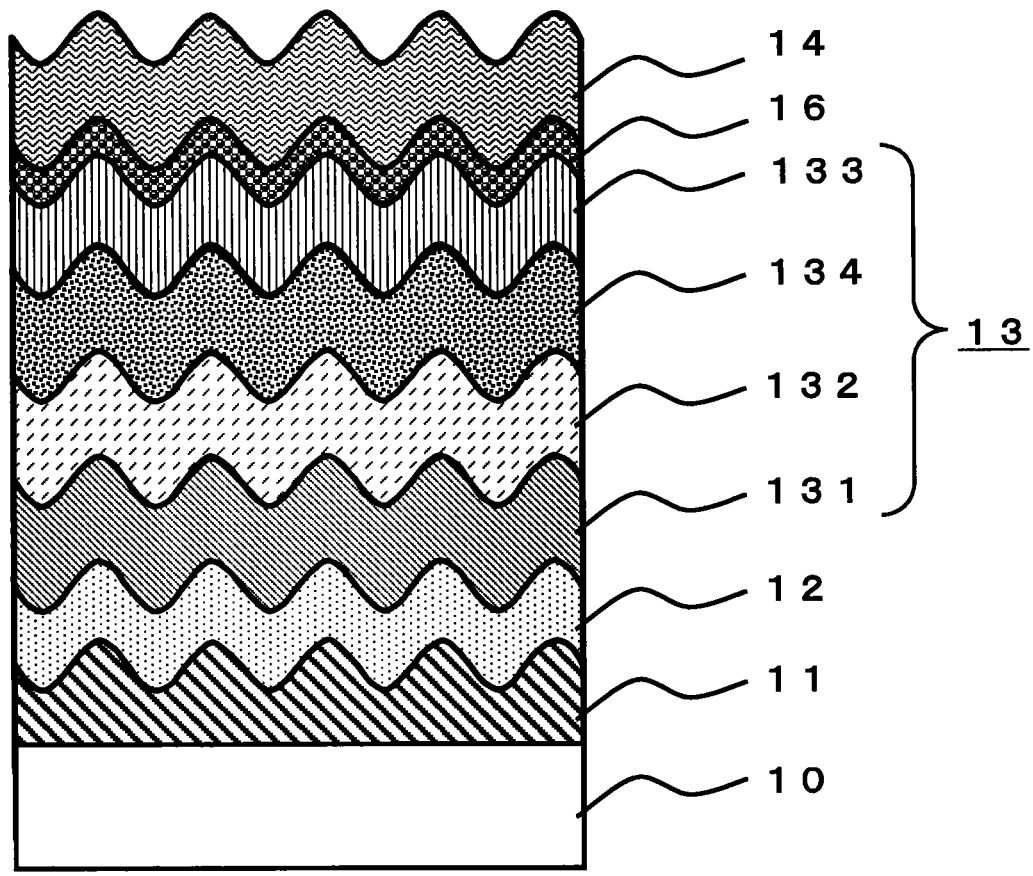
FIG. 11 is a cross-sectional view schematically showing another preferred embodiment of the organic EL element of the present invention.
Figure 12:
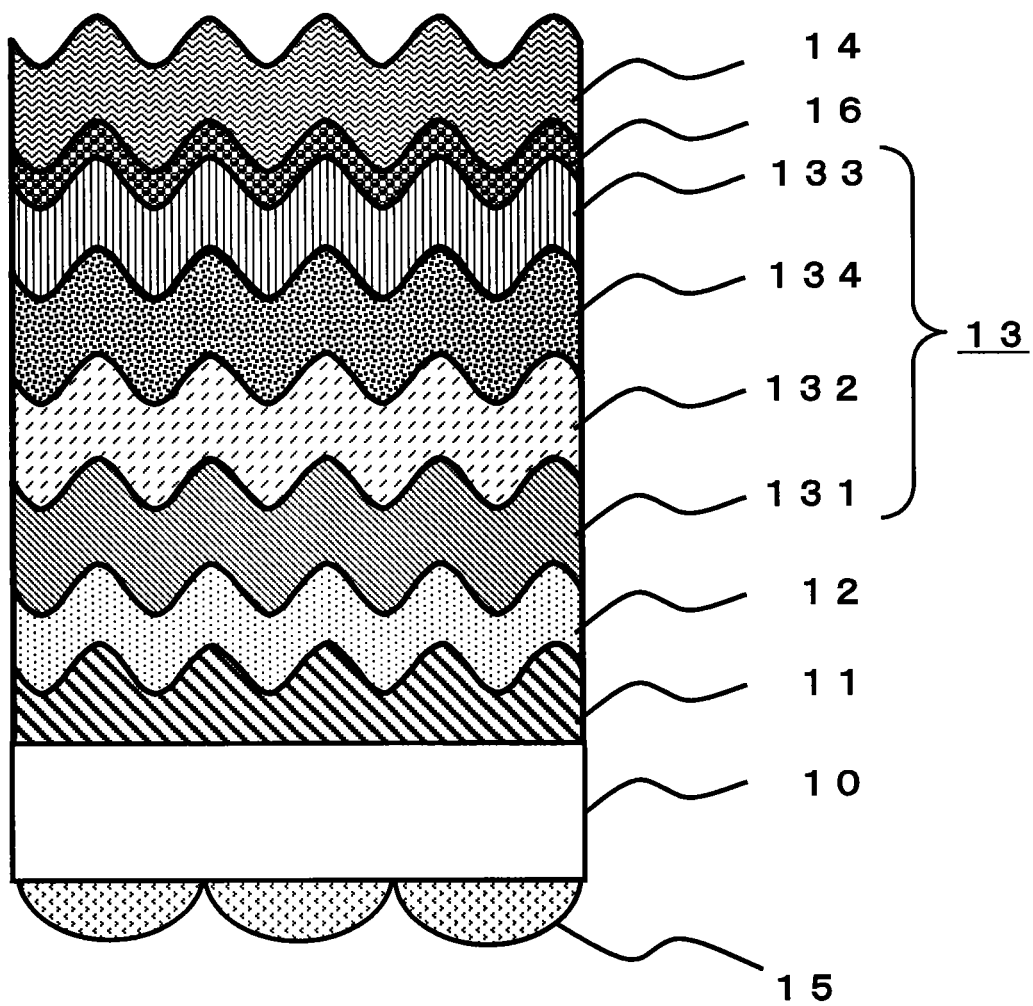
FIG. 12 is a cross-sectional view schematically showing another preferred embodiment (an embodiment further comprising an optical member) of the organic EL element of the present invention.

In addition, a specific example of another preferred embodiment of the organic EL element of the present invention is, for example, an organic EL element as shown in FIG. 11 or 12, wherein
the organic layer 13 has a layered structure represented by the following structure (B):
(B) hole transporting layer 131/light emitting layer 132/hole blocking layer 134/electron transporting layer 133, and
the organic EL element has a structure further comprising a cathode buffer layer (an electron injection layer, an inorganic layer) 16 made of a metal-based material between the organic layer 13 and the metal electrode 14.

As materials of the hole transporting layer 131, the light emitting layer 132, and the electron transporting layer 133, those described for the above-described embodiment shown in FIG. 1 can be used as appropriate.

In addition, as a constituent material of the hole blocking layer 134, a known material can be used as appropriate, and, for example, BCP (Tg: 83° C.) or the like can be used. Note that, although a hole blocking layer has the same structure as that of an electron transporting layer used in an ordinary organic EL element, the hole blocking layer is named so because a function of blocking the movement of holes, which would otherwise leak from the light emitting layer to the cathode side, is more prominent than the electron transporting function in the layer. Hence, the hole blocking layer can be regarded as a kind of electron transporting layer. Light can be emitted more efficiently by using such a hole blocking layer 134. Note that since the materials constituting the organic layer are preferably organic materials having glass transition temperatures (Tg) of 70° C. to 300° C. as described above, the constituent material of the hole blocking layer 134 is also preferably an organic material having a glass transition temperature (Tg) of 70° C. to 300° C.

In addition, the thickness of the hole blocking layer 134 is preferably 1 to 50 nm. In addition, also when such a hole blocking layer 134 is manufactured, the hole blocking layer 134 is preferably stacked, while being formed into such a shape that the shape of the first concavities and convexities is maintained. From such a viewpoint, the vapor deposition method or the sputtering method is preferably employed as a method for manufacturing the hole blocking layer 134.

As a material of the cathode buffer layer (an electron injection layer, an inorganic layer) 16 made of a metal-based material, metal fluorides such as lithium fluoride (LiF) and $Li_2O_3$; highly active alkaline earth metals such as Ca, Ba, and Cs; and the like can be used. Note that the inorganic layer refers to a layer in which the content of inorganic materials (metals and metal compounds other than organometallic complexes (oxides, hydroxides, halides, nitrates, sulfates, carbonates, and the like of metals)) is 50% by mass or higher. The thickness of the cathode buffer layer 16 made of a metal-based material is preferably within a range from 0.1 to 10 nm. In addition, also when such a cathode buffer layer 16 is manufactured, each of the layers is preferably stacked, while being formed into such a shape that the shape of the first concavities and convexities is maintained. As the stacking method, the vapor deposition method or the sputtering method is preferably employed. Note that, since the cathode buffer layer 16 made of a metal-based material is a layer whose constituent material is a metal or a metal compound and is basically a thin layer, the cathode buffer layer 16 can be stacked by the vapor deposition method, the sputtering method, or the like, while the characteristics of the concavity and convexity shape formed on the surface of an object on which the layer is to be stacked (to-be-coated object) is sufficiently inherited. In addition, also in the case of the cathode buffer layer 16 made of a metal-based material, it is preferable that a standard deviation ($\sigma$) of a depth distribution of the concavities and convexities formed on the surface, on the side facing to the metal electrode, of the cathode buffer layer 16 be 15 to 100 nm (more preferably 15 to 50 nm), and that a ratio of a change in the standard deviation of the depth distribution of the concavities and convexities relative to the standard deviation of the depth distribution of the first concavities and convexities be +15% to −15%.

Figure 13:
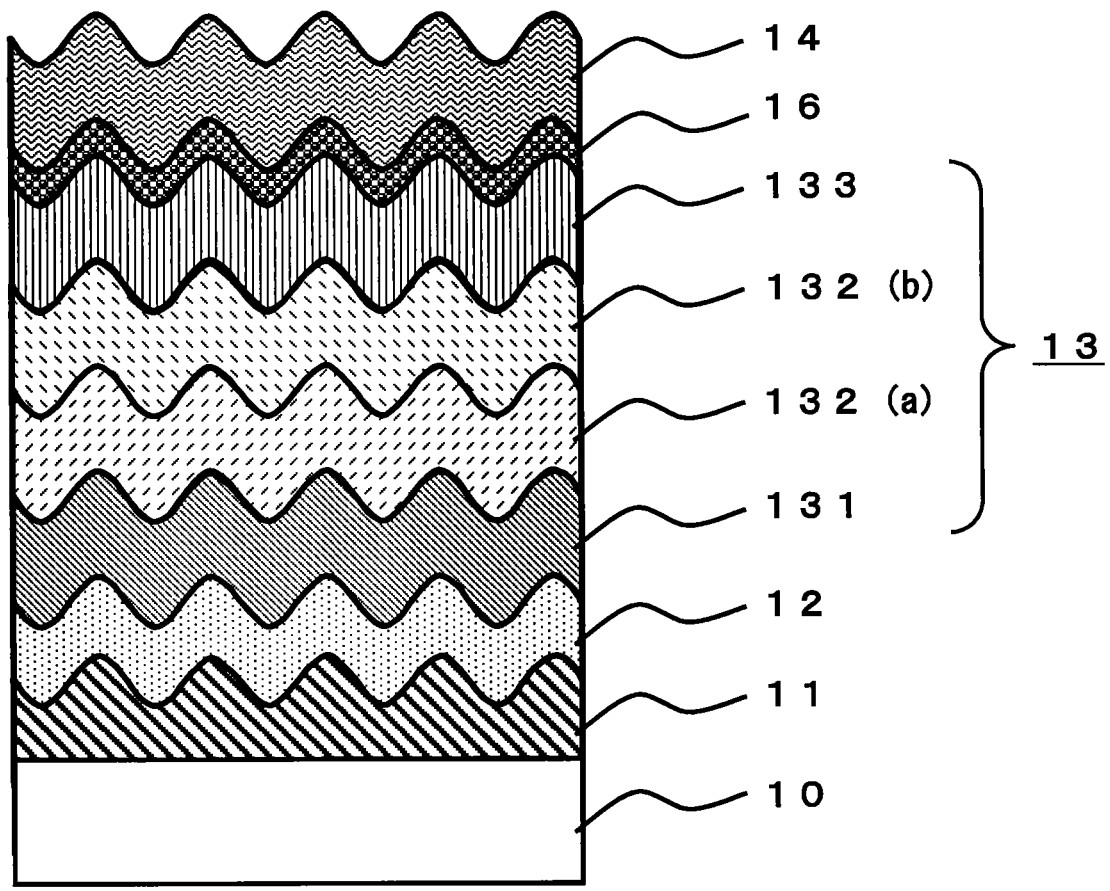
FIG. 13 is a cross-sectional view schematically showing another preferred embodiment of the organic EL element of the present invention.
Figure 14:
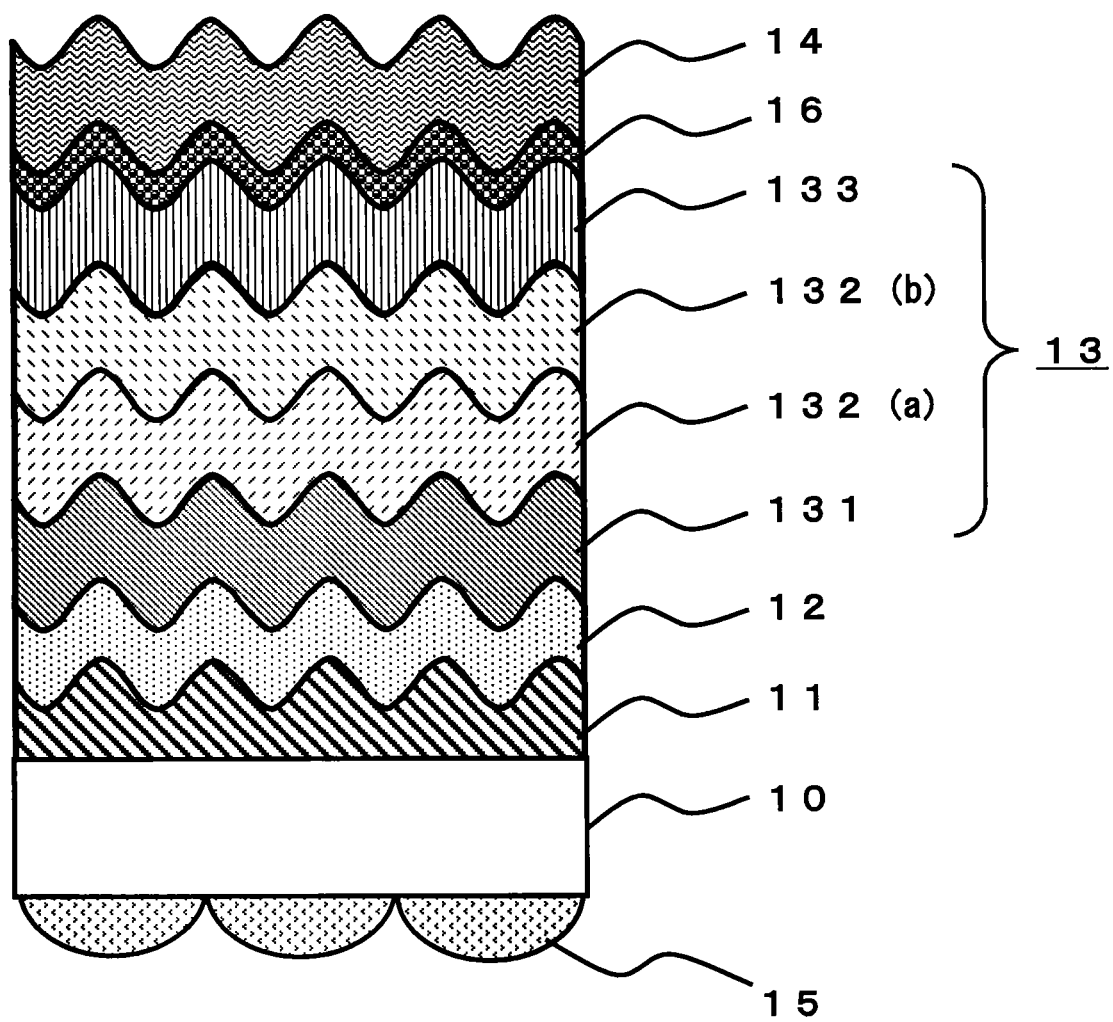
FIG. 14 is a cross-sectional view schematically showing another preferred embodiment (an embodiment further comprising an optical member) of the organic EL element of the present invention.

Moreover, another preferred embodiment of the organic EL element of the present invention is, for example, an organic EL element as shown in FIG. 13 or 14 having a structure in which the organic layer further comprises a hole transporting layer and an electron transporting layer, and the light emitting layer is a layer containing a phosphorescent material and a host material, wherein the organic layer has a layered structure represented by the following structure (C):

(C) hole transporting layer 131/first light emitting layer 132(*a*)/second light emitting layer 132(*b*)/electron transporting layer 133, and the organic EL element comprises a cathode buffer layer 16 made of a metal-based material.

The first light emitting layer 132 (*a*) and the second light emitting layer 132 (*b*) only need to contain different host materials between the light emitting layers 132(*a*) and (*b*). Regarding host materials which can be used for the first light emitting layer 132 (*a*) and the second light emitting layer 132(*b*), those described as the materials of the above-described light emitting layer can be used as appropriate. Note that each of the surface shapes (concavities and convexities) of the two light emitting layers has characteristics similar to those of the above-described light emitting layer 132.

In addition, in the organic EL element having the layered structure as shown in FIG. 13 or 14, it is preferable that an organic material used as the material constituting the hole transporting layer 131 and an organic material used as the host material of the first light emitting layer 132(*a*) be the same (for example, a case where both the materials are TCTA), and that an organic material used as the host material of the second light emitting layer 132 (*b*) and an organic material used as the material constituting the electron transporting layer 133 be the same (for example, a case where both the materials are TPBi). When the two-layer structure is employed for the light emitting layer, in which the organic material used as the material constituting the hole transporting layer 131 and the organic material used as the host material of the first light emitting layer 132 (*a*) are the same, and the organic material used as the host material of the second light emitting layer 132 (*b*) and the organic material used as the material constituting the electron transporting layer 133 are the same as described above, substantially no interface exists between the hole transporting layer 131 and the light emitting layer 132 (*a*) and between the electron transporting layer 133 and the light emitting layer 132 (*b*). Hence, it is possible to reduce the decrease in efficiency due to the energy barrier and the decrease in carrier mobility at the interfaces. Note that, in the case of an organic EL element using phosphorescent light emission, the possibility of the occurrence of the roll-off phenomenon increases because of the following mechanism. Specifically, when holes accumulate between the light emitting layer and the electron transporting layer (for example, when a hole blocking layer is provided, at an interface between the light emitting layer and the hole blocking layer), or when electrons accumulate between the light emitting layer and the hole transporting layer (for example, when an electron blocking layer is provided, at an interface between the light emitting layer and the electron blocking layer), recombination of electrons and holes occurs there, and the triplet excited state easily disappears. To suppress the roll-off phenomenon and to prevent the disappearance of the triplet excited state, it is effective to increase the area where the carriers are recombined, and to minimize the recombination of electrons and holes at the interfaces of the light emitting layer and the like. Also from such viewpoints, it is preferable that the organic material used as the material constituting the hole transporting layer 131 and the organic material used as the host material of the first light emitting layer 132 (*a*) be the same, and that the organic material used as the host material of the second light emitting layer 132 (*b*) and the organic material used as the material constituting the electron transporting layer 133 be the same.

In addition, examples of other embodiments of the organic EL element of the present invention include organic EL elements in which the organic layer 13 has a layered structure represented by any of the following structures (D) to (K):

(D) hole transporting layer/electron blocking layer/light emitting layer/electron transporting layer, (E) hole transporting layer/electron blocking layer/light emitting layer/hole blocking layer/electron transporting layer, (F) anode buffer layer (hole injecting layer)/hole transporting layer/electron blocking layer/light emitting layer/electron transporting layer, (G) anode buffer layer (hole injecting layer)/hole transporting layer/electron blocking layer/light emitting layer/hole blocking layer/electron transporting layer, (H) hole transporting layer/electron blocking layer/light emitting layer/electron transporting layer/cathode buffer layer made of organic material, (I) hole transporting layer/electron blocking layer/light emitting layer/hole blocking layer/electron transporting layer/cathode buffer layer made of organic material, (J) anode buffer layer (hole injecting layer)/hole transporting layer/electron blocking layer/light emitting layer/electron transporting layer/cathode buffer layer made of organic material, and (K) anode buffer layer (hole injecting layer)/hole transporting layer/electron blocking layer/light emitting layer/hole blocking layer/electron transporting layer/cathode buffer layer made of organic material; and the like.

As a constituent material of the electron blocking layer, a known material can be used as appropriate. Examples of materials used for the electron blocking layer include TCTA, Irppz, and the like. Note that, although an electron blocking layer has the same structure as that of a hole transporting layer used in an ordinary organic EL element, the electron blocking layer is named so because a function of blocking the movement of electrons, which would otherwise leak from the light emitting layer to the anode side, is more prominent than the hole transporting function in the layer. Hence, the electron blocking layer can be regarded as a kind of hole transporting layer. Note that when a phosphorescent material is used for the light emitting layer, the use of such an electron blocking layer makes it possible to achieve more efficient phosphorescent light emission. In addition, the thickness of the electron blocking layer is preferably 1 to 50 nm. When such an electron blocking layer is manufactured, the electron blocking layer is preferably stacked, while formed into such a shape that the shape of the first concavities and convexities is maintained, and the vapor deposition method or the sputtering method is preferably employed as the stacking method.

In addition, as a material of the anode buffer layer (hole injecting layer), a known material can be used as appropriate, and examples thereof include organic materials such as copper phthalocyanine and PEDOT. In addition, the thickness of the anode buffer layer is preferably 1 to 100 nm. Moreover, when such an anode buffer layer is manufactured, the anode buffer layer is preferably stacked, while being formed into such a shape that the shape of the first concavities and convexities is maintained, and the vapor deposition method or the sputtering method is preferably employed as the stacking method.

Moreover, the cathode buffer layer may be an organic layer which is formed by co-vapor deposition of an organic material such as Bphen, BCP, or TBBPhen with an organic compound doped with an alkali metal compound, an alkali metal, an alkaline earth metal compound, or an alkaline earth metal, or the like. Note that the organic material used here preferably has a Tg within a range from 70° C. to 300° C. In addition, the thickness of the cathode buffer layer is preferably 1 to 50 nm. When a cathode buffer layer is manufactured as one of the organic layers as describe above, the cathode buffer layer is preferably stacked, while formed into such a shape that the shape of the first concavities and convexities is maintained, and the vapor deposition method or the sputtering method is preferably employed as the stacking method.

EXAMPLES

Hereinafter, the present invention is described more specifically on the basis of Examples and Comparative Examples. However, the present invention is not limited to Examples below.

First, a method for measuring characteristics of a concavity and convexity shape formed in each of the layers of organic EL elements obtained in Examples and Comparative Examples is described.

<Method for Measuring Characteristics of Concavity and Convexity Shape>

In the method for measuring a concavity and convexity shape, first, concavity and convexity analysis images (SPM images) of the concavity and convexity shapes of first concavities and convexities formed in a diffraction grating, concavities and convexities formed on a surface, facing to the metal electrode, of a transparent electrode (on a surface on a opposite side to the surface facing to the diffraction grating), concavities and convexities formed on a surface, facing to the metal electrode, of each of the layers in the organic layer (on a surface on an opposite side to the surface facing to the diffraction grating), and concavities and convexities formed on a surface, facing to the organic layer, of the metal electrode were each obtained by conducting analysis of a randomly selected measuring region of 3 μm square (length: 3 μm, width: 3 μm) by using an atomic force microscope (a scanning probe microscope equipped with an environment control unit "Nanonavi II Station/E-sweep" manufactured by SII Nano-Technology Inc.) under the following analysis conditions:
Measurement mode: dynamic force mode,
Cantilever: SI-DF40 (material: Si, lever width: 40 μm, diameter of tip of chip: 10 nm),
Measurement atmosphere: in air, and
Measuring temperature: 25° C.
Note that, regarding the concavity and convexity shape of the concavities and convexities formed on the surface, facing to the organic layer, of the metal electrode, an adhesive tape (one manufactured by Sumitomo 3M Limited under the trade name of "Scotch Mending adhesive tape," or the like) was attached onto an outer surface of the metal electrode of the obtained organic EL element, and then only the metal electrode was peeled from the organic layer by using the adhesive tape under conditions of an air atmosphere and room temperature (25° C.), and a metal electrode surface on the adhesive tape was evaluated based on an SPM image.

Next, by using each of the SPM images of the concavity and convexity shapes, a measuring point which had the largest height from the surface of the transparent supporting substrate 10 was determined among all the 65536 (256 columns×256 rows) measuring points in a measuring region. Then, while a plane which included the measuring point and which was parallel to the surface of the transparent supporting substrate 10 was taken as a reference plane (horizontal plane), values of depths from the reference plane (the differences each obtained by subtracting the height from the transparent supporting substrate 10 at one of the measuring points from the value of the height from the transparent supporting substrate 10 at the measuring point which had the largest height) were determined as concavity and convexity depth data by automatic calculation with software in the measuring apparatus (for example, one manufactured by SII NanoTechnology Inc., under the trade name of "E-sweep"). Then, on the basis of the concavity and convexity depth data, the average value (m) of the depth distribution of the concavities and convexities and the standard deviation ($\sigma$) of the depth distribution of the concavities and convexities were determined by calculations according to the above-described formulae (I) and (II). In addition, on the basis of the concavity and convexity depth data, the median (M) and the kurtosis (k) of the depth distribution of the concavities and convexities were also determined. Note that, regarding the method for measuring the median (M) and the kurtosis (k) of the depth distribution of the concavities and convexities, the median (M) and the kurtosis (k) were determined by employing the same method as the method for measuring the median (M) and the kurtosis (k) of the depth distribution of the concavities and convexities of the above-described diffraction grating 11.

In addition, by using the SPM image of the concavity and convexity shape (the shape of the first concavities and convexities) of the obtained diffraction grating, the SPM image was subjected to a flattening process including primary inclination correction, and then to two-dimensional fast Fourier transform processing. Thus, a Fourier-transformed image was obtained. Then, on the basis of the concavity and convexity analysis image and the Fourier-transformed image, the average height of the concavities and convexities, the average pitch of the concavities and convexities, and the pattern of the Fourier-transformed image of the diffraction grating were determined. Note that average values of heights and distances of the concavities and convexities at 100 points were employed as the average height of the concavities and convexities and the average pitch of the concavities and convexities of the diffraction grating.

Example 1

An organic EL element having the structure shown in FIG. 11 (the structure of transparent supporting substrate 10/diffraction grating 11/transparent electrode 12/hole transporting layer 131/light emitting layer 132/hole blocking layer 134/ electron transporting layer 133/cathode buffer layer 16/metal electrode 14 stacked in this order) was manufactured as follows.

<Step of Preparing Master Block (Mold) for Forming Diffraction Grating>

First, a b lock copolymer (A) used in a step of preparing a master block (mold) is described.

[Block Copolymer (A)]

A block copolymer of PS and PMMA (manufactured by Polymer Source Inc,),

Mn of PS segment=868,000,
Mn of PMMA segment=857,000,
Mn of block copolymer=1,725,000,
Volume ratio of PS segment to PMMA segment (PS:PMMA)=53:47,
Molecular weight distribution (Mw/Mn)=1.30,
Tg of PS segment=96° C.,
Tg of PMMA segment=110° C.

As the block copolymer (A), a block copolymer being manufactured by Polymer Source Inc, and containing polystyrene (hereinafter, abbreviated as "PS," as appropriate) as a first polymer segment and polymethyl methacrylate (hereinafter, abbreviated as "PMMA," as appropriate) as a second polymer segment was used. Note that the volume ratio between the first and second polymer segments (first polymer segment:second polymer segment) in the block copolymer (A) was calculated on the assumption that the density of polystyrene was 1.05 g/cm$^3$ and the density of polymethyl methacrylate was 1.19 g/cm$^3$. The number average molecular weights (Mn) and the weight average molecular weights (Mw) of the polymer segments and the polymer were measured by gel permeation chromatography (Model No: "GPC-8020" manufactured by Tosoh Corporation, in which TSK-GEL SuperH1000, SuperH2000, SuperH3000, and SuperH4000 were connected in series). The glass transition points (Tg) of the polymer segments were measured by use of a differential scanning calorimeter (manufactured by Perkin-Elmer under the trade name of "DSC7"), while the temperature was raised at a rate of temperature rise of 20° C./min over a temperature range from 0 to 200° C. The solubility parameters of polystyrene and polymethylmethacrylate are 9.0 and 9.3, respectively (see Kagaku Binran Ouyou Hen (Handbook of Chemistry, Applied Chemistry) 2nd edition).

Next, a step of preparing a master block (mold) for forming a diffraction grating employed in Example 1 is described. Specifically, first, 150 mg of the block copolymer (A) and, as a polyethylene oxide, 38 mg of polyethylene glycol 4,000 (Mw=3000, Mw/Mn=1.10) manufactured by Tokyo Chemical Industry Co., Ltd. were dissolved by adding toluene, so that the total amount became 10 g. Then, the solution was filtered through a membrane filter having a pore diameter of 0.5 μm. Thus, a block copolymer solution was obtained. Next, the thus obtained block copolymer solution was applied onto a polyphenylene sulfide film (manufactured by Toray Industries, Inc. under the trade name of "torelina") as a base member by spin coating to a film thickness of 200 to 250 nm. The spin coating was conducted at a spin speed of 500 rpm for 10 seconds, and subsequently at 800 rpm for 30 seconds. After that, the thin film applied by the spin coating was dried by being allowed to stand at room temperature for 10 minutes.

Subsequently, the base member on which the thin film was formed was heated in an oven of 170° C. for 5 hours (first heating step). Concavities and convexities were observed on a surface of the heated thin film, and it was found that micro phase separation of the block copolymer constituting the thin film occurred. Note that a cross section of the thin film was observed with a transmission electron microscope (TEM) (H-7100FA manufactured by Hitachi, Ltd.). Also from the image of the cross section, the micro phase separation was confirmed.

Next, after the first heating step, the thin film was subjected to an etching treatment as follows, so that PMMA was selectively decomposed and removed from the block copolymer layer on the base member. In the decomposition and removal step, first, the thin film was irradiated with ultraviolet rays by using a high pressure mercury lamp with an irradiation intensity of 30 J/cm$^2$. Subsequently, PMMA was selectively decomposed and removed by immersing the thin film in acetic acid. The thin film was washed with ion-exchanged water, and then dried. Note that measurement with a transmission electron microscope (TEM) showed that, by the decomposition and removal step, a concavity and convexity pattern apparently deeper than the concavities and convexities appearing on the thin film surface by the first heating treatment was formed on the base member.

Subsequently, the base member on which the concavity and convexity pattern was formed by the etching treatment was subjected to a heat treatment in an oven of 140° C. for 1 hour (a second heating step). A measurement with a transmission electron microscope (TEM) showed that, by the second heating step, side surfaces of convex portions were smoothed, and were turned into a so-called mountain-like shape structure.

Next, a nickel layer as thin as 10 nm was formed as a current seed layer by sputtering on the surface of the thin film being subjected to the second heating step and having the concavity and convexity pattern formed thereon. Subsequently, the base member having the thin film on which the nickel layer was formed was subjected to an electroforming treatment (maximum current density: 0.05 A/cm$^2$) in a sulfamic acid-nickel bath at a temperature of 50° C. to thereby deposit nickel to a thickness of 250 μm. Thus, an electroplating layer (metal layer) was formed on the nickel layer (seed layer). The thus formed nickel-electroformed article (one in which the nickel layer as the electroplating layer was stacked on the nickel layer as the seed layer) was mechanically peeled from the base member having the thin film on which the concavity and convexity pattern was formed. Subsequently, the nickel-electroformed article thus peeled from the base member was immersed in Chemisol 2303 manufactured by The Japan Cee-Bee Chemical Co., Ltd., and washed with stirring at 50° C. for 2 hours. After that, the polymer component attached to the surface of the electroformed article was removed by repeating application of an acrylic UV-curable resin onto the nickel-electroformed article, curing of the acrylic UV-curable resin, and peeling of the acrylic UV-curable resin three times. Thus, a mold (M-1) for forming a diffraction grating comprising the nickel-electroformed article having concavities and convexities formed on the surface thereof was obtained. Observation of a cross section of the thus obtained mold (M-1) for forming a diffraction grating with a scanning electron microscope (FE-SEM: S4800 manufactured by Hitachi, Ltd.) showed that the concavities and convexities of the nickel-electroformed article were smooth, and the convex portions were in a smooth mountain-like shape.

Subsequently, the mold (M-1) for forming a diffraction grating was immersed in HD-2101TH manufactured by Daikin Chemicals Sales, Ltd. for approximately 1 minute, dried, and then allowed to stand overnight. On the next day, the mold (M-1) for forming a diffraction grating was immersed in HDTH manufactured by Daikin Chemicals Sales, Ltd., and washed by an ultrasonic wave treatment for approximately 1 minute. Thus, a mold-release treatment was performed on the surface of the first mold (M-1) for forming a diffraction grating.

Next, a second mold (M-2) for forming a diffraction grating was manufactured by using the first mold (M-1) for forming a diffraction grating. Specifically, a fluorine-containing UV-curable resin (manufactured by Asahi Glass Co., Ltd. under the trade name of "NIF") was applied onto a PET substrate (COSMOSHINE A-4100 manufactured by Toyobo Co., Ltd.), and the first mold (M-1) made of nickel was pressed thereto. Then, the fluorine-containing UV-curable resin was cured by irradiation with ultraviolet rays at 600 mJ/cm$^2$, and then the first mold (M-1) was peeled off. Thus, the second mold (M-2) for forming a diffraction grating made of the UV-curable resin film to which the surface shape of the first mold (M-1) was transferred was obtained. The thickness of the UV-curable resin to which the surface shape was transferred was 1 μm.

<Diffraction Grating Formation Step>

A diffraction grating 11 made from a curable resin was manufactured on a glass substrate (a transparent supporting substrate 10) by using the above-described "second mold (M-2)." For manufacturing the diffraction grating 11, first, a glass substrate (made of soda lime) having a thickness of 0.7 mm was prepared as the transparent supporting substrate 10, and a fluorine-containing UV-curable resin (manufactured by Asahi Glass Co., Ltd. under the trade name of "NIF") was applied onto one surface of the glass plate. Next, the fluorine-containing UV-curable resin was cured by irradiation with ultraviolet rays under a condition of 600 mJ/cm$^2$, with the second mold (M-2) being pressed onto the surface of the coating film of the fluorine-containing UV-curable resin. After the fluorine-containing UV-curable resin was thus cured, the PET substrate was peeled from the glass substrate. Thus, a diffraction grating (concavity and convexity layer) made of the cured resin having a first concavity and convexity shape to which the surface shape of the second mold (M-2) was transferred was stacked on the glass substrate. The thickness of the cured resin layer (concavity and convexity layer) having the first concavity and convexity shape was 1 μm.

Figure 15:
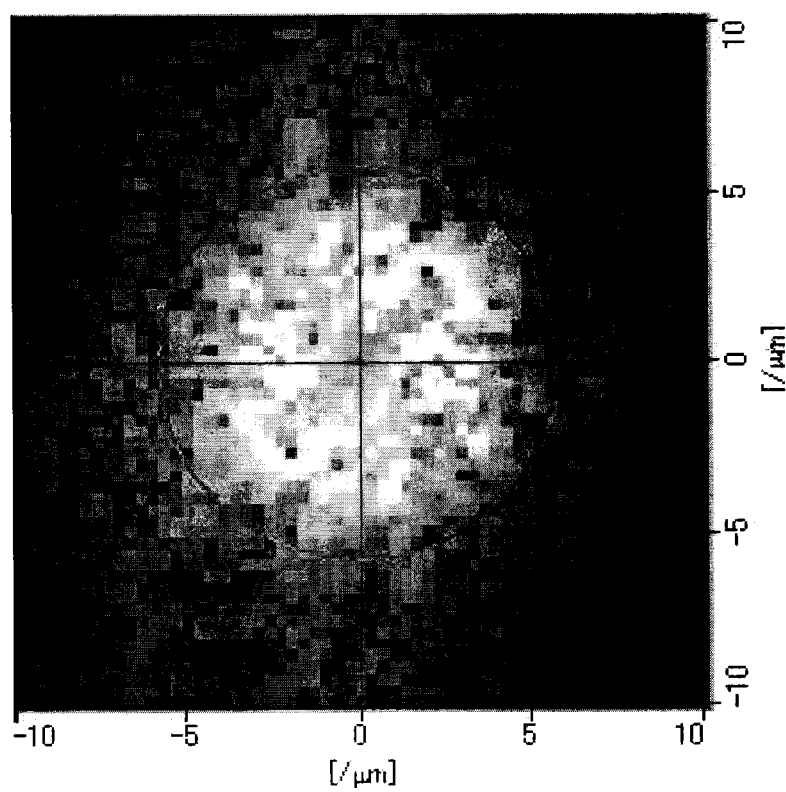
FIG. 15 is a photograph showing a Fourier-transformed image, in which a result of two-dimensional fast Fourier transform processing conducted on a concavity and convexity analysis image, which was obtained by using an atomic force microscope, of a surface of a diffraction grating obtained in Example 1 is displayed on a display.

FIG. 15 shows a Fourier-transformed image of the thus obtained diffraction grating. As is apparent from the Fourier-transformed image shown in FIG. 15, it was found that the Fourier-transformed image showed a circular pattern substantially centered at an origin at which an absolute value of wavenumber was 0 μm$^{-1}$, and that, in the circular pattern, 90% or more of all the bright spots forming the Fourier-transformed image were present within a region where an absolute value of wavenumber was within a range of 10 μm$^{-1}$ or less.

In addition, shown below are the average value (m) of the depth distribution of the concavities and convexities, the standard deviation (σ) of the depth distribution of the concavities and convexities, the average height of the concavities and convexities of the diffraction grating, the average pitch of the concavities and convexities, the median (M) of the depth distribution of the concavities and convexities, and the kurtosis (k) of the concavities and convexities which were determined from the concavity and convexity analysis image of the surface of the diffraction grating. Note that the measuring method was as described above.

Average value (m) of depth distribution of concavities and convexities: 50.3 nm

Standard deviation (σ) of depth distribution of concavities and convexities: 19.3 nm Average height of concavities and convexities of diffraction grating: 71.5 nm Average pitch of concavities and convexities: 375 nm Median (M) of depth distribution of concavities and convexities: 49.6

Kurtosis (k) of concavities and convexities: −0.15.

<Organic EL Element Formation Step 1>

Next, by using the glass substrate obtained as described above on which the diffraction grating was stacked, a transparent electrode [ITO, thickness: 120 nm], a hole transporting layer [α-NPD (N,N'-diphenyl-N,N'-bis(3-methylphenyl)-1,1'-diphenyl-4,4'-diamine, Tg: 95° C.), thickness: 65 nm], a light emitting layer [a layer of TCTA (4,4',4''-tris(carbazole-9-ly)-triphenylamine, Tg: 149° C.) containing 7.0% by mass of Ir(ppy)$_3$ complex (tris(2-phenylpyridinato)iridium(III)), thickness: 30 nm], a hole blocking layer [BCP (2,9-dimethyl-4,7-diphenyl-1,10-phenanthroline, Tg: 83° C.), thickness: 5 nm], an electron transporting layer [Alq$_3$ (8-hydroxyquinolinealuminum, Tg: 175° C.), thickness: 60 nm], a cathode buffer layer made of a metal-based material [lithium fluoride (LiF), thickness: 1.5 nm, an inorganic layer] and a metal electrode [aluminum, thickness: 50 nm] were stacked on the surface of the diffraction grating on the glass substrate, while being formed into such shapes that the shape of the first concavities and convexities formed on the surface of the diffraction grating was maintained. Thus, a laminate for an organic EL element in which glass substrate/diffraction grating/transparent electrode/hole transporting layer/light emitting layer/hole blocking layer/electron transporting layer/cathode buffer layer (inorganic layer) made of metal-based material/metal electrode were stacked in this order, with the size of the light emission pixel being 3 mm in length×3 mm in width, and the area thereof being 9 mm$^2$, was obtained. Note that steps of stacking these layers were as follows. Specifically, first, the transparent electrode was stacked by a sputtering method. Meanwhile, after a film of the transparent electrode was formed, the transparent electrode was exposed to an oxygen plasma to increase the work function (radical treatment). In addition, the hole transporting layer was stacked by a vacuum vapor deposition method. Moreover, the light emitting layer was stacked by a co-vapor deposition method using TCTA and Ir(ppy)$_3$, with the amount of Ir(ppy)$_3$ introduced into the layer being adjusted to 7% by mass. In addition, each of the hole blocking layer, the electron transporting layer, the cathode buffer layer (lithium fluoride layer), and the metal electrode was stacked by a vacuum vapor deposition method. In addition, in all the examples and comparative examples shown below, the size of a light emission pixel was 3 mm in length×3 mm in width, and the area thereof was 9 mm$^2$. After each of the transparent electrode, the hole transporting layer, the light emitting layer, and the electron transporting layer was formed, characteristics of the concavity and convexity shape on the surface, on the side opposite to the surface facing to the diffraction grating, of the layer were measured during the stacking of these layers. Thus, the standard deviation (σ) of the depth of the concavities and convexities of each of the layers and the ratio of the change in the standard deviation of the depth of the concavities and convexities of the layer relative to the standard deviation of the first concavities and convexities formed on the surface of the diffraction grating were determined. In addition, characteristics of the concavities and convexities, on the surface facing to the diffraction grating, of the metal electrode were evaluated after formation of the element by peeling the metal electrode from the organic layer with an adhesive tape, and using an SPM image of the surface of the metal electrode on the adhesive tape, as described above. Note that the ratio of the change in the standard deviation of depth of the concavities and convexities of each of the layers was determined by calculation according to the following formula:

[Ratio of change]={([Standard deviation of depth distribution of concavities and convexities of layer]−[standard deviation of depth distribution of first concavities and convexities])/[standard deviation of depth distribution of first concavities and convexities]}×100.

Table 1 shows the obtained values.

TABLE 1

|  | Standard deviation of depth of concavities and convexities (Unit: nm) | Ratio of change in standard deviation of depth of concavities and convexities of each layer relative to standard deviation of first concavities and convexities |
|---|---|---|
| Diffraction grating (first concavities and convexities) | 19.32 | — |
| Transparent electrode (ITO) | 20.25 | 4.8% |
| Hole transporting layer (α-NPD) | 19.27 | −0.3% |
| Light emitting layer (TCTA: Ir(ppy)$_3$) | 20.18 | 4.5% |
| Electron transporting layer (Alq$_3$) | 19.08 | −1.2% |
| Metal electrode (Al: Second concavities and convexities on surface facing to diffraction grating) | 19.21 | −0.6% |

As is apparent from the results shown in Table 1, it was found that, in the organic EL element obtained in Example 1, the concavity and convexity shape on the surface, on the side opposite to the surface facing to the diffraction grating, of each of the transparent electrode, the hole transporting layer, the light emitting layer, and the electron transporting layer and the concavity and convexity shape, on the surface facing to the diffraction grating, of the metal electrode were each such that the standard deviation (σ) of the depth of the concavities and convexities was within a range from 15 to 100 nm (moreover within a range from 15 to 50 nm), and the ratio of the change in the standard deviation of the depth of the concavities and convexities of each of the layers relative to the standard deviation of the first concavities and convexities was within a range from +15% to −15%, indicating that the uniformity of the film thickness of each of the layers was extremely high. From these results, it was found that the organic EL element obtained in Example 1 satisfied the above-described conditions (A) to (C).

Figure 16:
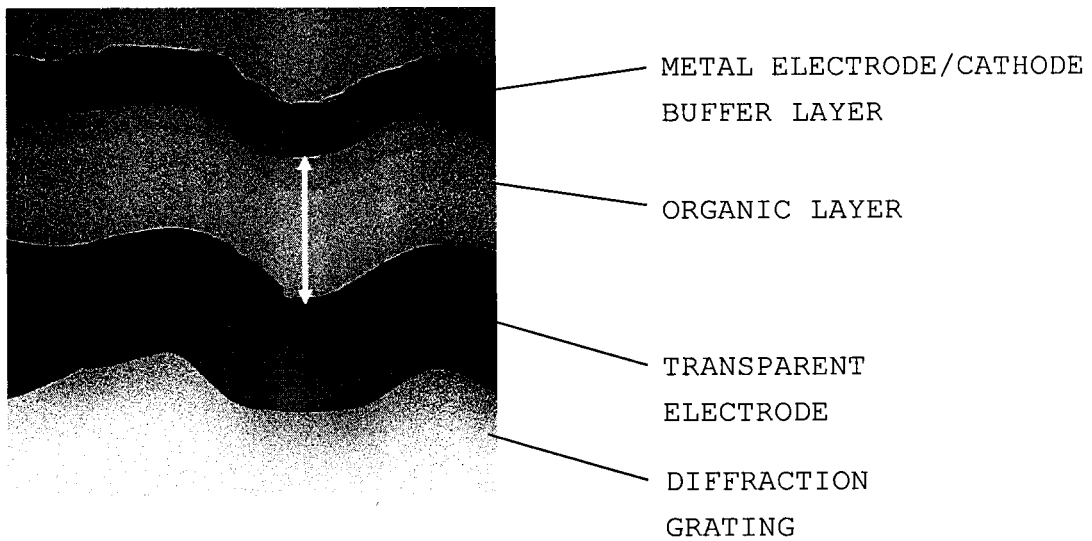
FIG. 16 is an electron micrograph of a cross section of an organic EL element obtained in Example 1.
Figure 17:
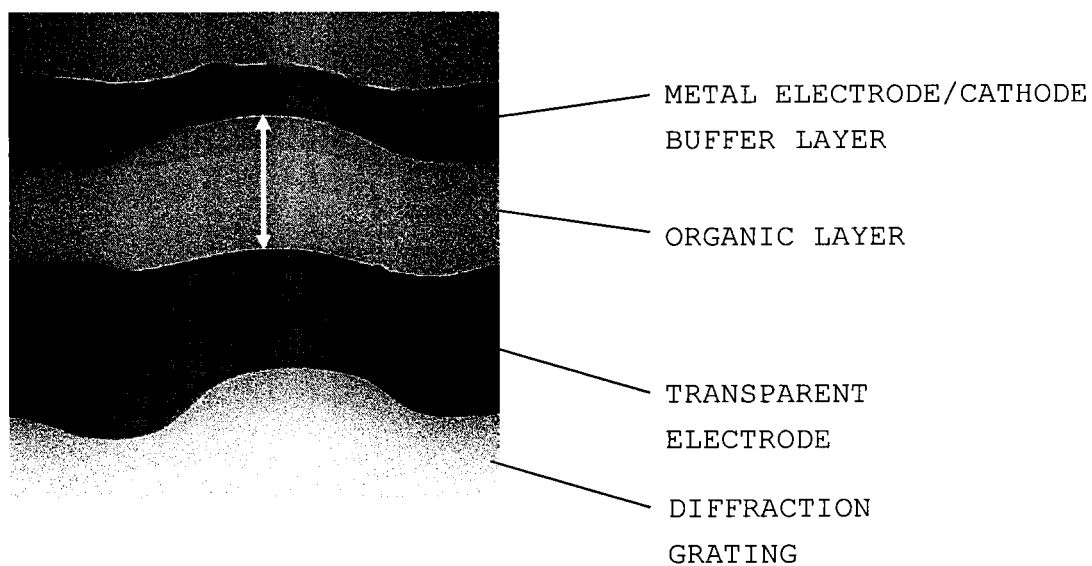
FIG. 17 is an electron micrograph of a cross section of the organic EL element obtained in Example 1.

In addition, FIGS. 16 and 17 show transmission electron microscope (TEM) images of cross sections of the organic EL element obtained in Example 1. From the results shown in FIGS. 16 and 17, it was found that the concavities and convexities of each of the layers in the organic EL element obtained in Example 1 had a sufficiently high conformity to the first concavities and convexities formed on the surface of the diffraction grating, and the uniformity of the film thickness between the electrodes was extremely high. Note that, for the measurement of the cross sections with the transmission electron microscope (TEM), a test piece (ultrathin section) having a thickness of 70 nm was prepared and used as a measurement sample.

In addition, in the cross section measurement, the thickness between concave portions and the thickness between convex portions (the portion indicated by the white arrows in FIG. 16 was a thickness between concave portions of the entire organic layer, and the portion indicated by the white arrows in FIG. 17 was a thickness between convex portions of the entire organic layer) of each of the layers (the hole transporting layer, the light emitting layer, the hole blocking layer, and the electron transporting layer) in the organic layer and the entire organic layer were each measured at randomly selected two points, and the ratio of the average value of the thicknesses between the concave portions of each layer to the average value of the thicknesses between the convex portions of the layer ([Average value of thicknesses between concave portions]/[Average value of thicknesses between convex portions]) were determined. Table 2 shows the obtained results.

TABLE 2

|  | [Average value of thicknesses between concave portions]/[Average value of thicknesses between convex portions] |
|---|---|
| Electron transporting layer (Alq$_3$) | 1.06 |
| Hole blocking layer (BCP) | 1.18 |
| Light emitting layer (TCTA: Ir(ppy)$_3$) | 1.18 |
| Hole transporting layer (α-NPD) | 0.97 |
| Entire organic layer | 1.05 |

As is apparent from the results shown in Table 2, it was found that the uniformity of each of the film thicknesses of the layers in the organic layer and the entire organic layer was extremely high in the organic EL element obtained in Example 1.

Comparative Example 1

A diffraction grating (concavity and convexity layer) was manufactured on a glass substrate by employing the same method as in the diffraction grating formation step employed in Example 1. Subsequently, a laminate for an organic EL element in which glass substrate/diffraction grating/transparent electrode (ITO)/hole transporting layer (α-NPD)/light emitting layer (CBP: 7.0% by mass Ir(ppy)$_3$)/hole blocking layer (BCP)/electron transporting layer (Alq$_3$)/cathode buffer layer made of metal-based material (LiF: inorganic layer)/metal electrode (Al) were stacked in this order was obtained in the same manner as in Example 1, except that the host material of the light emitting layer was changed from TCTA (Tg: 149° C.) to CBP (4,4'-N,N'-dicarbazole-biphenyl, Tg: 65° C.).

As in the case of Example 1, it was found that a Fourier-transformed image of the diffraction grating thus obtained in Comparative Example 1 showed a circular pattern substantially centered at an origin at which an absolute value of wavenumber was 0 μm$^{-1}$, and that, in the circular pattern, 90% or more of all the bright spots forming the Fourier-transformed image were present within a region where an absolute value of wavenumber was within a range of 10 µm$^{-1}$ or less. In addition, since the method for manufacturing the diffraction grating obtained in Comparative Example 1 was the same as that employed in Example 1, the diffraction grating obtained in Comparative Example 1 had characteristics such as the average value (m) of the depth distribution of the concavities and convexities, the standard deviation (σ) of the depth distribution of the concavities and convexities, the average height of the concavities and convexities of the diffraction grating, the average pitch of the concavities and convexities, the median (M) of the depth distribution of the concavities and convexities, and the kurtosis (k) of the concavities and convexities, which were the same as the characteristics in Example 1.

In addition, in Comparative Example 1, after each of the transparent electrode, the hole transporting layer, the light emitting layer, and the electron transporting layer was formed, characteristics of the concavity and convexity shape on the surface, on the side opposite to the surface facing to the diffraction grating, of the layer were measured during the stacking of the layers. Thus, the standard deviation (σ) of the depth of the concavities and convexities of each of the layers and the ratio of the change in the standard deviation of the depth of the concavities and convexities of the layer relative to the standard deviation of the first concavities and convexities formed on the surface of the diffraction grating were determined. In addition, in the same manner as in Example 1, the standard deviation (σ) of the depth of the concavities and convexities, on the surface facing to the diffraction grating, of the metal electrode and the ratio of the change in the standard deviation of the depth of the concavities and convexities of each of the layers relative to the standard deviation of the first concavities and convexities formed on the surface of the diffraction grating were also determined. Table 3 shows the obtained values.

TABLE 3

| | Standard deviation of depth of concavities and convexities (Unit: nm) | Ratio of change in standard deviation of depth of concavities and convexities of each layer relative to standard deviation of first concavities and convexities |
|---|---|---|
| Diffraction grating (first concavities and convexities) | 19.32 | — |
| Transparent electrode (ITO) | 20.25 | 4.8% |
| Hole transporting layer (α-NPD) | 19.27 | −0.3% |
| Light emitting layer (CBP: Ir(ppy)$_3$) | 14.68 | −24.0% |
| Electron transporting layer (Alq$_3$) | 13.41 | −30.6% |
| Metal electrode (Al: Second concavities and convexities on surface facing to diffraction grating) | 13.35 | −30.9% |

As is apparent from the results shown in Table 3, it was found that, in the organic EL element obtained in Comparative Example 1, the standard deviation (σ) of the depth of the concavities and convexities of the light emitting layer was out of the range of from 15 to 100 nm, and the ratio of the change in the standard deviation of depth of the concavities and convexities of the light emitting layer relative to the standard deviation of the first concavities and convexities was −24.0%, indicating that the conformity to the first concavities and convexities decreased in the light emitting layer. In addition, from the value of the standard deviation (σ) and the value of the ratio of the change in the standard deviation of the depth of the concavities and convexities relative to the standard deviation of the first concavities and convexities of each of the electron transporting layer and the metal electrode stacked after the light emitting layer was stacked, it was found that the conformity of each of the electron transporting layer and the metal electrode to the first concavities and convexities decreased because of the change in the concavity and convexity structure in the light emitting layer. From these results, it was found that, in Comparative Example 1, the material was deposited in larger amounts in concave portions in the light emitting layer (CBP), so that the concavity and convexity shape was smoothed and become dull, and the depths of the concave portions decreased.

Figure 18:
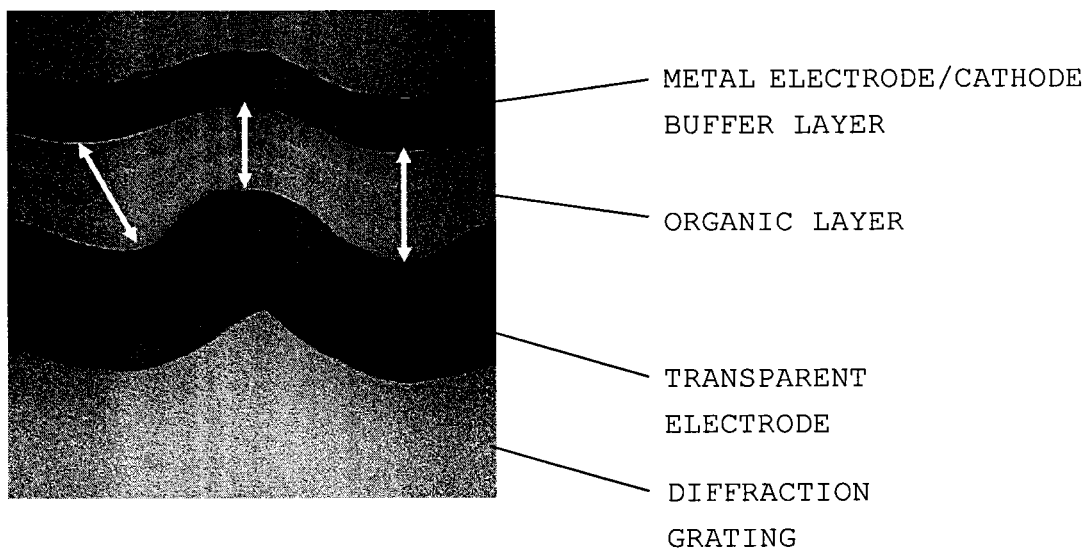
FIG. 18 is an electron micrograph of a cross section of an organic EL element obtained in Comparative Example 1.

In addition, a cross section measurement of the organic EL element obtained in Comparative Example 1 was conducted in the same manner as in Example 1. FIG. 18 shows a transmission electron microscope (TEM) image of a cross section of the organic EL element obtained in Comparative Example 1. As is apparent from the results shown in FIG. 18, it was found that, in the organic EL element obtained in Comparative Example 1, the conformity to the first concavities and convexities formed on the surface of the diffraction grating decreased in the organic layer, and the uniformity of the film thickness between the electrodes was lower in the organic EL element obtained in Comparative Example 1 than in the organic EL element obtained in Example 1. In other words, from a comparison of FIGS. 16 and 17 with FIG. 18, it was found that when the uniformity of the film thickness of each layer was compared between the organic EL element obtained in Example 1 and the organic EL element obtained in Comparative Example 1, the organic EL element obtained in Example 1 had a higher level of uniformity. In addition, from a comparison of FIGS. 16 and 17 with FIG. 18, it was also found that, in the organic EL element obtained in Comparative Example 1, the thickness between concave portions increased, and the concavities and convexities were smoothed in the organic layer, so that the depths of the concave portions decreased (the concavities and convexities become dull).

In addition, in the cross section measurement, the thickness between concave portions and the thickness between convex portions (the thicknesses between portions indicated by the white arrows in FIG. 18) of each of the layers in the organic layer (the hole transporting layer, the light emitting layer, the hole blocking layer, and the electron transporting layer) and the entire organic layer were each measured at randomly selected two points, and the ratio of the average value of the thicknesses between the concave portions of each layer to the average value of the thicknesses between the convex portions of the layer ([Average value of thicknesses between concave portions]/[Average value of thicknesses between convex portions]) were determined. Table 4 shows the obtained results.

TABLE 4

| | [Average value of thicknesses between concave portions]/[Average value of thicknesses between convex portions] |
|---|---|
| Electron transporting layer (Alq$_3$) | 1.09 |
| Hole blocking layer (BCP) | 0.98 |

TABLE 4-continued

| | [Average value of thicknesses between concave portions]/[Average value of thicknesses between convex portions] |
|---|---|
| Light emitting layer (CBP: Ir(ppy)$_3$) | 1.62 |
| Hole transporting layer (α-NPD) | 0.97 |
| Entire organic layer | 1.22 |

As is apparent from the results shown in Tables 2 and 4, it was found that the uniformity of the film thickness of each of the layers in the organic layer and the entire organic layer was insufficient in organic EL element obtained in Comparative Example 1, when compared with that in the organic EL element obtained in Example 1. Considering these results, especially, the result that the ratio between the average values of the thicknesses of the concavities and convexities in the light emitting layer was 1.62 times, it can be seen that the conformity of the concavities and convexities decreases, when a material (CBP, Tg: 65° C.) having a Tg of lower than 70° C. is used as a constituent material of the layer.

Comparative Example 2

A laminate for an organic EL element in which glass substrate/transparent electrode (ITO)/hole transporting layer (α-NPD)/light emitting layer (TCTA:7.0% by mass of Ir(ppy)$_3$)/hole blocking layer (BCP)/electron transporting layer (Alq$_3$)/cathode buffer layer made of metal-based material (LiF)/metal electrode (Al) were stacked in this order was obtained in the same manner as in Example 1, except that no diffraction grating was formed, and a glass substrate, as it was, was used in the organic EL element formation step, instead of the glass substrate on which the diffraction grating was stacked.

Comparative Example 3

A laminate for an organic EL element in which glass substrate/transparent electrode (ITO)/hole transporting layer (α-NPD)/light emitting layer (CBP: 7.0% by mass of Ir(ppy)$_3$)/hole blocking layer (BCP)/electron transporting layer (Alq$_3$)/cathode buffer layer made of metal-based material (LiF)/metal electrode (Al) were stacked in this order was obtained in the same manner as in Comparative Example 1, except that no diffraction grating was formed, and a glass substrate, as it was, was used in the organic EL element formation step, instead of the glass substrate on which the diffraction grating was stacked.

[Measurement of Light Emission Efficiencies of Organic EL Elements Obtained in Example 1 and Comparative Examples 1 to 3]

The light emission efficiencies of each of the organic EL elements obtained in Example 1 and Comparative Examples 1 to 3 were measured by the following method. Specifically, while a voltage was applied to the organic EL element, the applied voltage (V, unit: V) and the current (I, unit: A) flowing in the organic EL element were measured with a DC voltage current source/monitor (Model No: R6244 manufactured by ADVANTEST CORPORATION), and the total luminous flux (L, unit: lm) was measured with a total luminous flux measuring apparatus (Solid Lambda CCD UV-NIR manufactured by Spectra Co-op). On the basis of the measured values of the applied voltage (V), the current (I), and the total luminous flux (L) thus obtained, the current efficiency (CE, unit: cd/A) at a front luminance (L') of 1000 cd/m$^2$ was calculated by using the following calculation formula (F2), and the power efficiency (PE, unit: Lm/W) at a front luminance (L') of 1000 cd/m$^2$ was calculated by using the following calculation formula (F3). Note that the front luminance (L', unit: cd/m$^2$) was determined by converting the value of the light emitting element area (S, unit: m$^2$) and the value of the total luminous flux (L, unit: lm) according to the formula (F1) on the assumption that the angle distribution of the light emission of the element was Lambertian:

$$\text{(Light emission luminance } L') = L/\pi/S \quad \text{(F1)},$$

$$\text{(Current efficiency)} = (L'/I) \quad \text{(F2), and}$$

$$\text{(Power efficiency)} = (L/I/V) \quad \text{(F3)}.$$

Of the measurement results of the light emission efficiencies, first, the current efficiency (CE) and the power efficiency (PE) of the organic EL element obtained in each of Example 1 and Comparative Example 2 are shown in Table 5. Note that the organic EL elements obtained in Example 1 and Comparative Example 2 had different structures in terms of the presence or absence of the diffraction grating and the presence or absence of the concavity and convexity structure of each layer, but were the same in terms of the stacking structure of the other layers and the materials constituting all the layers. In addition, Table 5 also shows calculation results of the improvement ratios (times) of the current efficiency (CE) and the power efficiency (PE) of the organic EL element (using glass substrate/diffraction grating) obtained in Example 1 relative to the current efficiency (CE) and the power efficiency (PE) of the organic EL element (using the bare glass) obtained in Comparative Example 2.

TABLE 5

| | Example 1 (diffraction grating: present) | Comparative Example 2 (diffraction grating: absent) |
|---|---|---|
| Current efficiency (CE) | 42.7 | 35.6 |
| Power efficiency (PE) | 29.5 | 20.8 |
| Improvement ratio of current efficiency (CE) ([Example 1]/[Comparative Example 2]) | 1.20 times | — |
| Improvement ratio of power efficiency (PE) ([Example 1]/[Comparative Example 2]) | 1.42 times | — |

As is apparent from the results shown in Table 5, a comparison of the organic EL element obtained in Example 1 with the organic EL element obtained in Comparative Example 2 has shown that the use of a diffraction grating sufficiently improves the light emission efficiencies.

Next, the current efficiency (CE) and the power efficiency (PE) of each of the organic EL elements obtained in Comparative Example 1 and Comparative Example 3 are shown in Table 6. Note that the organic EL elements obtained in Comparative Example 1 and Comparative Example 3 had different structures in terms of the presence or absence of the diffraction grating and the presence or absence of the concavity and convexity structure of each layer, but were the same in terms of the stacking structure of the other layers and the materials constituting all the layers. In addition, Table 6 also shows calculation results of the improvement ratios (times) of the current efficiency (CE) and the power efficiency (PE) of the organic EL element obtained in Comparative Example 1 (using glass substrate/diffraction grating) relative to the current efficiency (CE) and the power efficiency (PE) of the organic EL element (using the bare glass) obtained in Comparative Example 3.

TABLE 6

|  | Comparative Example 1 (diffraction grating: present) | Comparative Example 3 (diffraction grating: absent) |
| --- | --- | --- |
| Current efficiency (CE) | 54.1 | 51.6 |
| Power efficiency (PE) | 31.2 | 24.9 |
| Improvement ratio of current efficiency (CE) ([Comparative Example 1]/ [Comparative Example 3]) | 1.05 times | — |
| Improvement ratio of power efficiency (PE) ([Comparative Example 1]/ [Comparative Example 3]) | 1.25 times | — |

As is apparent from the results shown in Table 6, a comparison of the organic EL element obtained in Comparative Example 1 with the organic EL element obtained in Comparative Example 3 has shown that the use of a diffraction grating improves the light emission efficiencies.

Here, based on the results shown in Tables 5 and 6, the values of the improvement ratios of the current efficiency (CE) and the power efficiency (PE) achieved by using the diffraction grating relative to the organic EL element using only the bare glass as the substrate are compared between Example 1 and Comparative Example 1. Because the diffraction grating was used, the current efficiency (CE) of the organic EL element obtained in Example 1 was improved by 1.20 times as compared with that in the case (Comparative Example 2) where no diffraction grating was used. In contrast, in the case of the organic EL element obtained in Comparative Example 1, the improvement ratio of the current efficiency (CE) achieved by using the diffraction grating was 1.05 times. Hence, it was shown that the current efficiency was improved more sufficiently to a high level in the organic EL element obtained in Example 1. In addition, because the diffraction grating was used, the power efficiency (PE) of the organic EL element obtained in Example 1 was improved by 1.42 times as compared to that in the case (Comparative Example 2) where no diffraction grating was used. In contrast, in the case of the organic EL element obtained in Comparative Example 1, the improvement ratio of the power efficiency (PE) achieved by using the diffraction grating was 1.25 times. Hence, it was shown that power efficiency was improved more sufficiently to a high level in the organic EL element obtained in Example 1. As described above, the current efficiency (CE) and the power efficiency (PE) were improved sufficiently to higher levels in the organic EL element obtained in Example 1. Hence, it has been found that the light emission efficiencies can be improved more sufficiently.

From the results of the comparison between the organic EL element obtained in Example 1 and the organic EL element obtained in Comparative Example 1, the following was found. Specifically, in the organic EL element obtained in Example 1, the standard deviation (σ) of the depth of the second concavities and convexities formed on the metal electrode was within a range from 15 to 100 nm (moreover within in a range from 15 to 50 nm), and the ratio of the change in the standard deviation of the depth of the concavities and convexities relative to the standard deviation of the first concavities and convexities was within a range from +15% to −15%. Hence, the conformity of the second concavities and convexities formed on the metal electrode to the shape of the first concavities and convexities was higher in Example 1 than Comparative Example 1. Therefore, the uniformity of the film thickness of the layers, as a whole, between the diffraction grating and the metal electrode increased, so that the current efficiency (CE) and the power efficiency (PE) were improved more sufficiently. Consequently, the light emission efficiencies were successfully improved to higher levels in Example 1. In addition, in Example 1, the standard deviations (σ) of the depths of the concavities and convexities formed on each of the transparent electrode, the hole transporting layer, the light emitting layer, and the electron transporting layer (the concavities and convexities formed on the surface on the side opposite to the surface facing to the diffraction grating) and the concavities and convexities formed on the surface, facing to the diffraction grating, of the metal electrode were each within a range from 15 to 100 nm (moreover, within a range from 15 to 50 nm) and the ratio of the change in each of the standard deviations of the depths of the concavities and convexities relative to the standard deviation of the first concavities and convexities was within a range from +15% to −15% as described above. Hence, each of the layers had a sufficiently high conformity to the shape of the first concavities and convexities, and each of the layers had a sufficiently high uniformity of the film thickness.

In addition, from the results of the comparison between Example 1 and Comparative Example 1, it has been found that an organic EL element (an organic EL element satisfying the above-described conditions (A) to (C)) comprising a metal electrode in which second concavities and convexities having a high conformity to first concavities and convexities are formed makes it possible to improve the light emission efficiencies to higher levels. Specifically, considering that Example 1 and Comparative Example 1 were different only in terms of the kind of the host material of the light emitting layer, and the other structure was basically the same, it has been found that if an element does not satisfy the conditions (B) and (C), the effect of improving the light emission efficiencies is not necessarily sufficient, even when a diffraction grating satisfying the condition (A) is used, and it has been found that an organic EL element satisfying all the conditions (A) to (C) can stably achieve the effect of improving the light emission efficiencies to higher levels.

Example 2

A diffraction grating (concavity and convexity layer) was manufactured on a glass substrate by employing the same method as in the diffraction grating formation step employed in Example 1. After the diffraction grating was formed on the glass substrate, an organic EL element having a structure as shown in FIG. 13 (the structure of transparent supporting substrate 10/diffraction grating 11/transparent electrode 12/hole transporting layer 131/first light emitting layer 132 (a)/second light emitting layer 132 (b)/electron transporting layer 133/cathode buffer layer 16/metal electrode 14 stacked in this order) was manufactured in the same manner as in Example 1, except that an organic EL element formation step 2 described later was conducted instead of the organic EL element formation step 1.

In addition, as in the case of Example 1, it was found that a Fourier-transformed image of the diffraction grating obtained in Example 2 showed a circular pattern substantially centered at an origin at which an absolute value of wavenumber was 0 μm$^{-1}$, and that, in the circular pattern, 90% or more of all the bright spots forming the Fourier-transformed image were present within a region where an absolute value of wavenumber was within a range of 10 μm⁻¹ or less. In addition, since the method for manufacturing the diffraction grating obtained in Example 2 was the same as that employed in Example 1, the diffraction grating obtained in Example 2 had characteristics such as the average value (m) of the depth distribution of the concavities and convexities, the standard deviation (σ) of the depth distribution of the concavities and convexities, the average height of the concavities and convexities of the diffraction grating, the average pitch of the concavities and convexities, the median (M) of the depth distribution of the concavities and convexities, and the kurtosis (k) of the concavities and convexities, which were the same as the characteristics in Example 1.

<Organic EL Element Formation Step 2>

By using the above-described glass substrate on which the diffraction grating was stacked, a transparent electrode [ITO, thickness: 120 nm], a hole transporting layer [TCTA (Tg: 149° C.), thickness: 35 nm], a first light emitting layer [a layer of TCTA (Tg: 149° C.) containing 7.0% by mass of Ir(ppy)$_3$, thickness: 15 nm], a second light emitting layer [a layer of TPBi (1,3,5-tris(N-phenylbenzimidazolyl)benzene, Tg: 124° C.) containing 7.0% by mass of Ir(ppy)$_3$, thickness: 15 nm], an electron transporting layer [TPBi (Tg: 124° C.), thickness: 50 nm], a cathode buffer layer made of a metal-based material [lithium fluoride (LiF), thickness: 1.5 nm], and a metal electrode [aluminum, thickness: 50 nm] were stacked on the surface of the diffraction grating on the glass substrate, while being formed into such shapes that the shape of the first concavities and convexities formed on the surface of the diffraction grating was maintained. Thus, a laminate for an organic EL element in which glass substrate/diffraction grating/transparent electrode/hole transporting layer/first light emitting layer/second light emitting layer/electron transporting layer/cathode buffer layer (inorganic layer) made of metal-based material/metal electrode were stacked in this order was obtained (in the element, the organic layer had a layered structure of hole transporting layer/first light emitting layer/second light emitting layer/electron transporting layer). Note that steps of stacking these layers were as follows. Specifically, first, the transparent electrode was stacked by a sputtering method. Meanwhile, after a film of the transparent electrode was formed, the transparent electrode was exposed to an oxygen plasma to increase the work function (radical treatment). In addition, the hole transporting layer was stacked by a vacuum vapor deposition method. Moreover, the first light emitting layer was stacked by a co-vapor deposition method using TCTA and Ir(ppy)$_3$, with the amount of Ir(ppy)$_3$ introduced into the layer being adjusted to 7% by mass. Meanwhile, the second light emitting layer was stacked by a co-vapor deposition method using TPBi and Ir(ppy)$_3$, with the amount of Ir(ppy)$_3$ introduced into the layer being adjusted to 7% by mass. In addition, each of the electron transporting layer, the cathode buffer layer (lithium fluoride layer), and the metal electrode was stacked by a vacuum vapor deposition method. After each of the transparent electrode, the hole transporting layer, the first light emitting layer, the second light emitting layer, and the electron transporting layer was formed, characteristics of the concavity and convexity shape on the surface, on the side opposite to the surface facing to the diffraction grating, of the layer were measured during the stacking of the layers as described above. Thus, the standard deviation (σ) of the depth of the concavities and convexities of each of the layers and the ratio of the change in the standard deviation of the depth of the concavities and convexities of the layer relative to the standard deviation of the first concavities and convexities formed on the surface of the diffraction grating were determined. In addition, in the same manner as in Example 1, the standard deviation (σ) of the depth of the concavities and convexities, on the surface facing to the diffraction grating, of the metal electrode and the ratio of the change in the standard deviation of the depth of the concavities and convexities relative to the standard deviation of the first concavities and convexities formed on the surface of the diffraction grating were determined. Note that the ratio of the change in the standard deviation of the depth of the concavities and convexities of each of the layers was determined by calculation according to the following formula:

[Ratio of change]={([Standard deviation of depth distribution of concavities and convexities of layer]−[Standard deviation of depth distribution of first concavities and convexities])/[Standard deviation of depth distribution of first concavities and convexities]}×100.

Table 7 shows the obtained values.

TABLE 7

| | Standard deviation of depth of concavities and convexities (Unit: nm) | Ratio of change in standard deviation of depth of concavities and convexities of each layer relative to standard deviation of first concavities and convexities |
|---|---|---|
| Diffraction grating (first concavities and convexities) | 19.32 | — |
| Transparent electrode (ITO) | 20.25 | 4.8% |
| Hole transporting layer (TCTA) | 20.12 | 4.1% |
| First light emitting layer (TCTA: Ir(ppy)$_3$) | 19.18 | −0.7% |
| Second light emitting layer (TPBi: Ir(ppy)$_3$) | 19.50 | 0.9% |
| Electron transporting layer (TPBi) | 19.66 | 1.8% |
| Metal electrode (Al: Second concavities and convexities on surface facing to diffraction grating) | 19.54 | 1.1% |

As is apparent from the results shown in Table 7, it was found that, in the organic EL element obtained in Example 2, the standard deviations (σ) of the depths of the concavities and convexities formed on each of the transparent electrode, the hole transporting layer, the first light emitting layer, the second light emitting layer, and the electron transporting layer (the concavities and convexities formed on the surface on the side opposite to the surface facing to the diffraction grating) and the concavities and convexities formed on the surface, facing to the diffraction grating, of the metal electrode were each within a range from 15 to 100 nm (moreover, within a range from 15 to 50 nm), and the ratio of the change in the standard deviation of the depth of the concavities and convexities of each of the layers relative to the standard deviation of the first concavities and convexities was within a range from +15% to −15%, indicating that the uniformity of the film thickness of each of the layers was extremely high. From these results, it was found that the organic EL element obtained in Example 2 satisfied the above-described conditions (A) to (C).

Comparative Example 4

A laminate for an organic EL element in which glass substrate/transparent electrode (ITO)/hole transporting layer (TCTA)/first light emitting layer (TCTA: 7.0% by mass of Ir(ppy)$_3$)/second light emitting layer (TPBi: 7.0% by mass of Ir(ppy)$_3$)/electron transporting layer (TPBi)/cathode buffer layer made of metal-based material (LiF)/metal electrode (Al) were stacked in this order was obtained in the same manner as in Example 2, except that no diffraction grating was formed, and a glass substrate, as it was, was used in the organic EL element formation step 2, instead of the glass substrate on which the diffraction grating was stacked.

[Measurement of Light Emission Efficiencies of Organic EL Elements Obtained in Example 2 and Comparative Example 4]

The light emission efficiencies of the organic EL elements obtained in Example 2 and Comparative Example 4 were measured in the same manner as in the method employed for measuring the light emission efficiencies of the organic EL elements obtained in Example 1 and Comparative Examples 1 to 3 described above, to determine the current efficiency (CE) and the power efficiency (PE) of each of the organic EL elements obtained in Example 2 and Comparative Example 4. Table 8 shows the obtained results. In addition, Table 8 also shows calculation results of the improvement ratios (times) of the current efficiency (CE) and the power efficiency (PE) of the organic EL element obtained in Example 2 relative to the current efficiency (CE) and the power efficiency (PE) of the organic EL element obtained in Comparative Example 4.

TABLE 8

| | Example 2 (diffraction grating: present) | Comparative Example 4 (diffraction grating: absent) |
| --- | --- | --- |
| Current efficiency (CE) | 89.7 | 66.3 |
| Power efficiency (PE) | 81.3 | 49.5 |
| Improvement ratio of current efficiency (CE) ([Example 2]/[Comparative Example 4]) | 1.35 times | — |
| Improvement ratio of power efficiency (PE) ([Example 2]/[Comparative Example 4]) | 1.64 times | — |

As is apparent from the results shown in Table 8, a comparison of the organic EL element obtained in Example 2 with the organic EL element obtained in Comparative Example 4 has shown that the use of a diffraction grating sufficiently improves the light emission efficiencies. In addition, as is apparent from the results shown in Table 8, it was found that the improvement ratios of the current efficiency (CE) and the power efficiency (PE) of the organic EL element obtained in Example 2 were sufficiently high.

Moreover, from a comparison of the current efficiency (CE) and the power efficiency (PE) between the organic EL element obtained in Example 2 and the organic EL element obtained in Comparative Example 2, it was found that the improvement ratios (times) of the current efficiency (CE) and the power efficiency (PE) of the organic EL element obtained in Example 2 were 2.52 times and 3.91 times, respectively, as compared with those of the organic EL element obtained in Comparative Example 2. The improvement ratios (times) of the current efficiency (CE) and the power efficiency (PE) as compared with those of the organic EL element obtained in Comparative Example 2 were higher in Example 2 than in Example 1. Hence, it has been found that the employment of the two layer structure for the light emitting layer further improves the light emission efficiencies.

Example 3

A diffraction grating (concavity and convexity layer) was manufactured on a glass substrate by employing the same method as in the diffraction grating formation step employed in Example 1. Subsequently, an organic EL element having a structure of transparent supporting substrate (glass substrate)/diffraction grating/transparent electrode (ITO)/hole transporting layer (TCTA)/light emitting layer (TCTA:7.0% by mass of Ir(ppy)$_3$)/electron transporting layer (TpBi)/cathode buffer layer made of metal-based material (LiF)/metal electrode (Al) stacked in this order was manufactured in the same manner as in Example 1, except that an organic EL element formation step 3 described later was conducted instead of the organic EL element formation step 1.

In addition, regarding a Fourier-transformed image of the diffraction grating obtained in Example 3, it was found, as in the case of Example 1, that the Fourier-transformed image showed a circular pattern substantially centered at an origin at which an absolute value of wavenumber was 0 μm$^{-1}$, and that, in the circular pattern, 90% or more of all the bright spots forming the Fourier-transformed image were present within a region where an absolute value of wavenumber was within a range of 10 μm$^{-1}$ or less. In addition, since the method for manufacturing the diffraction grating obtained in Example 3 was the same as that employed in Example 1, the diffraction grating obtained in Example 3 had characteristics such as the average value (m) of the depth distribution of the concavities and convexities, the standard deviation (σ) of the depth distribution of the concavities and convexities, the average height of the concavities and convexities of the diffraction grating, the average pitch of the concavities and convexities, the median (M) of the depth distribution of the concavities and convexities, and the kurtosis (k) of the concavities and convexities, which were the same as the characteristics in Example 1.

<Organic EL Element Formation Step 3>

By using the glass substrate on which the diffraction grating was stacked, a transparent electrode [ITO, thickness: 120 nm], a hole transporting layer [TCTA (Tg: 149° C.), thickness: 35 nm], a light emitting layer [a layer of TCTA (Tg: 149° C.) containing 7.0% by mass of Ir(ppy)$_3$, thickness: 15 nm], an electron transporting layer [TPBi (Tg: 124° C.), thickness: 65 nm], a cathode buffer layer made of a metal-based material [lithium fluoride (LiF), thickness: 1.5 nm], and a metal electrode [aluminum, thickness: 50 nm] were stacked on the surface of the diffraction grating on the glass substrate, while being formed into such shapes that the shape of the first concavities and convexities formed on the surface of the diffraction grating was maintained. Thus, a laminate for an organic EL element in which glass substrate/diffraction grating/transparent electrode/hole transporting layer/light emitting layer/electron transporting layer/cathode buffer layer (inorganic layer) made of metal-based material/metal electrode were stacked in this order was obtained (in the element, the organic layer had a layered structure of hole transporting layer/light emitting layer/electron transporting layer). Note that steps of stacking these layers were as follows. Specifically, first, the transparent electrode was stacked by a sputtering method. Meanwhile, after a film of the transparent electrode was formed, the transparent electrode was exposed to an oxygen plasma to increase the work function (radical treatment). In addition, the hole transporting layer was stacked by a vacuum vapor deposition method. Moreover, the light emitting layer was stacked by a co-vapor deposition method using TCTA and Ir(ppy)$_3$, with the amount of Ir(ppy)$_3$ introduced into the layer being adjusted to 7% by mass. In addition, each of the electron transporting layer, the cathode buffer layer (lithium fluoride layer), and the metal electrode was stacked by a vacuum vapor deposition method. After each of the transparent electrode, the hole transporting layer, the light emitting layer, and the electron transporting layer was formed, characteristics of the concavity and convexity shape on the surface, on the side opposite to the surface facing to the diffraction grating, of the layer were measured during the stacking of the layers as described above. Thus, the standard deviation ($\sigma$) of the depth of the concavities and convexities of each of the layers and the ratio of the change in the standard deviation of the depth of the concavities and convexities of the layer relative to the standard deviation of the first concavities and convexities formed on the surface of the diffraction grating were determined. In addition, the standard deviation ($\sigma$) of the depth of the concavities and convexities, on the surface facing to the diffraction grating, of the metal electrode and the ratio of the change in the standard deviation of the depth of the concavities and convexities relative to the standard deviation of the first concavities and convexities formed on the surface of the diffraction grating were also determined. Note that the ratio of the change in the standard deviation of the depth of the concavities and convexities of each of the layers was determined by calculation according to the following formula:

[Ratio of change]={([Standard deviation of depth distribution of concavities and convexities of layer]−[Standard deviation of depth distribution of first concavities and convexities])/[Standard deviation of depth distribution of first concavities and convexities]}×100.

Table 9 shows the obtained values.

TABLE 9

| | Standard deviation of depth of concavities and convexities (Unit: nm) | Ratio of change in standard deviation of depth of concavities and convexities of each layer relative to standard deviation of first concavities and convexities |
|---|---|---|
| Diffraction grating (first concavities and convexities) | 19.32 | — |
| Transparent electrode (ITO) | 20.25 | 4.8% |
| Hole transporting layer (TCTA) | 20.22 | 4.7% |
| Light emitting layer (TCTA: Ir(ppy)$_3$) | 20.14 | 4.2% |
| Electron transporting layer (TPBi) | 19.93 | 3.1% |
| Metal electrode (Al: Second concavities and convexities on surface facing to diffraction grating) | 20.02 | 3.6% |

As is apparent from the results shown in Table 9, it was found that, in the organic EL element obtained in Example 3, the standard deviations ($\sigma$) of the depths of the concavities and convexities formed on each of the transparent electrode, the hole transporting layer, the light emitting layer, and the electron transporting layer (the concavities and convexities formed on the surface on the side opposite to the surface facing to the diffraction grating), and the concavities and convexities formed on the surface, facing to the diffraction grating, of the metal electrode were each within a range from 15 to 100 nm (moreover, within a range from 15 to 50 nm), and the ratio of the change in the standard deviation of the depth of the concavities and convexities of each of the layers relative to the standard deviation of the first concavities and convexities was within a range from +15% to −15%, indicating that the uniformity of the film thickness of each layer was extremely high. From these results, it was found that the organic EL element obtained in Example 3 satisfied the above-described conditions (A) to (C).

Comparative Example 5

A laminate for an organic EL element in which glass substrate/transparent electrode (ITO)/hole transporting layer (TCTA)/light emitting layer (TCTA:7.0% by mass of Ir(ppy)$_3$)/electron transporting layer (TPBi)/cathode buffer layer made of metal-based material (LiF)/metal electrode (Al) were stacked in this order was obtained in the same manner as in Example 3, except that no diffraction grating was formed, and a glass substrate, as it was, was used in the organic EL element formation step 3, instead of the glass substrate on which the diffraction grating was stacked.

[Measurement of Light Emission Efficiencies of Organic EL Elements Obtained in Example 3 and Comparative Example 5]

The light emission efficiencies of the organic EL elements obtained in Example 3 and Comparative Example 5 were measured in the same manner as in the method employed for measuring the light emission efficiencies of the organic EL elements obtained in Example 1 and Comparative Examples 1 to 3 described above, to determine the current efficiency (CE) and the power efficiency (PE) of each of the organic EL elements obtained in Example 3 and Comparative Example 5. Table 8 shows the obtained results. In addition, Table 10 also shows calculation results of the improvement ratios (times) of the current efficiency (CE) and the power efficiency (PE) of the organic EL element obtained in Example 3 relative to the current efficiency (CE) and the power efficiency (PE) of the organic EL element obtained in Comparative Example 5.

TABLE 10

| | Example 3 (diffraction grating: present) | Comparative Example 5 (diffraction grating: absent) |
|---|---|---|
| Current efficiency (CE) | 67.7 | 43.5 |
| Power efficiency (PE) | 59.0 | 31.0 |
| Improvement ratio of current efficiency (CE) ([Example 3]/[Comparative Example 5]) | 1.56 times | — |
| Improvement ratio of power efficiency (PE) ([Example 3]/[Comparative Example 5]) | 1.90 times | — |

As is apparent from the results shown in Table 10, a comparison of the organic EL element obtained in Example 3 with the organic EL element obtained in Comparative Example 5 has shown that the use of a diffraction grating sufficiently improves the light emission efficiencies. In addition, as is apparent from the results shown in Table 10, it was found that the improvement ratios of the current efficiency (CE) and the power efficiency (PE) of the organic EL element obtained in Example 3 were sufficiently high.

Moreover, from a comparison of the current efficiency (CE) and the power efficiency (PE) between the organic EL element obtained in Example 3 and the organic EL element obtained in Comparative Example 2, it was found that the improvement ratios (times) of the current efficiency (CE) and the power efficiency (PE) of the organic EL element obtained in Example 3 were 1.90 times and 2.84 times, respectively, relative to those of the organic EL element obtained in Comparative Example 2. The values of the improvement ratios (times) of the current efficiency (CE) and the power efficiency (PE) relative to those of the organic EL element obtained in Comparative Example 2 were higher in Example 3 than in Example 1. Hence, it was found that when the material used as the material of the hole transporting layer and the material used as the host material of the light emitting layer were the same (TCTA), the light emission efficiencies were further improved.

From the results of Examples and Comparative Examples described above, it has been found that a sufficient diffraction effect can be obtained by using a diffraction grating satisfying the condition (A). In addition, it was found that, in each of the organic EL elements obtained in Examples 1 to 3 in which the glass transition temperatures of the organic materials forming the layers in the organic layer other than the phosphorescent material were each 70° C. or above, the standard deviation (σ) of the depth of the concavities and convexities formed on the surface, on the side facing to the metal electrode, of each of the layers in the organic layer was within a range from 15 to 100 nm (moreover, within a range from 15 to 50 nm), and the ratio of the change in the standard deviation of the depth of the concavities and convexities relative to the standard deviation of the first concavities and convexities was within a range from +15% to −15%, indicating that the uniformity of the film thickness of each of the layers was extremely high (note that the characteristics of the concavity and convexity shape of the hole blocking layer (thickness: 5 nm) in Example 1 were not particularly evaluated; however, for the reason that the hole blocking layer in Example 1 was a layer having a sufficiently small thickness, the reason that the standard deviation of the concavities and convexities and the ratio of the change in the standard deviation of the electron transporting layer stacked on the hole blocking layer were within the above-described ranges, and the like, it is apparent that the standard deviation (σ) of the depth of the concavities and convexities formed on the surface, on the side facing to the metal electrode, of the hole blocking layer was within a range from 15 to 100 nm (moreover, within a range from 15 to 50 nm), and the ratio of the change in the standard deviation of the depth of the concavities and convexities relative to the standard deviation of the first concavities and convexities was within a range from +15% to −15%, and it can be seen that the hole blocking layer satisfied such conditions). In addition, it was found that, since the electrode buffer layer made of the metal material and the metal electrode were formed by a vapor deposition method on such an organic layer having a high conformity to the first concavities and convexities, the standard deviation (σ) of the depth of the concavities and convexities (second concavities and convexities) formed on the surface, on the side facing to the organic layer, of the metal electrode was within a range from 15 to 100 nm (moreover, within a range from 15 to 50 nm), and the ratio of the change in the standard deviation of the depth of the concavities and convexities relative to the standard deviation of the first concavities and convexities was within a range from +15% to −15%. From the results of Examples and Comparative Examples (especially, the results of the comparison between Example 1 and Comparative Example 1), it has been found that the light emission efficiencies can be improved to higher levels by an organic EL element comprising a metal electrode on which second concavities and convexities having a high conformity to the first concavities and convexities are formed. In addition, considering that Example 1 and Comparative Example 1 had basically the same structure, except that they were different from each other in terms of the kind of the host material of the light emitting layer, it has been found, from the results of the comparison between Example 1 and Comparative Example 1, that when an element satisfies the conditions (B) and (C), the effect of improving the light emission efficiencies obtained by using a diffraction grating can be achieved more stably.

Example 4

First, 2.5 g of tetraethoxysilane (TEOS) and 2.1 g of methyltriethoxysilane (MTES) were added dropwise to a liquid obtained by mixing 24.3 g of ethanol, 2.16 g of water, and 0.0094 g of concentrated hydrochloric acid, and the mixture was stirred at 23° C. and at a humidity of 45% for 2 hours. Thus, a sol was obtained. Subsequently, the sol was applied onto a glass substrate (made of soda lime) having a thickness of 0.7 mm with a bar coater. Thus, a coating film of the sol was formed on the glass substrate. Then, 60 seconds after the formation of the coating film, a diffraction grating (concavity and convexity layer) was formed on the glass substrate by employing a method described below, with the second mold (M-2) manufactured in Example 1 being pressed to the coating film on the glass substrate by using a heated pressing roll.

Specifically, first, the pressing roll used had a heater therein and an outer periphery covered with a heat-resistant silicone having a thickness of 4 mm. The diameter of the roll was 50 mm, and the length of the roll in the axial direction was 350 mm. Then, the surface of the second mold (M-2) on which the concavity and convexity pattern was formed was pressed to the coating film on the glass substrate, while the pressing roll heated at 80° C. was rotated from one end to the other end of the glass substrate. After completion of the pressing of the second mold (M-2) as described above, the second mold (M-2) was peeled by the hand from the one end to the other end at a peeling angle of approximately 30°. Then, after the second mold was peeled off, the glass substrate provided with a curable coating film having concavities and convexities formed thereon and originated from the concavities and convexities of the second mold was heated at 300° C. for 60 minutes by using an oven. Thus, the glass substrate on which a diffraction grating (concavity and convexity layer) made of an inorganic layer was stacked was obtained. Note that the thickness of the inorganic layer was 0.3 μm.

As in the case of Example 1, it was found that a Fourier-transformed image of the thus obtained diffraction grating (inorganic layer) showed a circular pattern substantially centered at an origin at which an absolute value of wavenumber was 0 $\mu m^{-1}$, and that, in the circular pattern, 90% or more of all the bright spots forming the Fourier-transformed image were present within a region where an absolute value of wavenumber was within a range of 10 $\mu m^{-1}$ or less.

In addition, since the same mold as in Example 1 was used for the diffraction grating obtained in Example 4, the diffraction grating obtained in Example 4 had characteristics such as the average value (m) of the depth distribution of the concavities and convexities, the standard deviation (σ) of the depth distribution of the concavities and convexities, the average height of the concavities and convexities of the diffraction grating, the average pitch of the concavities and convexities, the median (M) of the depth distribution of the concavities and convexities, and the kurtosis (k) of the concavities and convexities, which were the same as the characteristics in Example 1.

Next, a transparent electrode [ITO, thickness: 120 nm], a hole transporting layer [TCTA (Tg: 149° C.), thickness: 35 nm], a first light emitting layer [a layer of TCTA (Tg: 149° C.) containing 7.0% by mass of Ir(ppy)$_3$, thickness: 15 nm], a second light emitting layer [a layer of TPBi (1,3,5-tris(N-phenylbenzimidazolyl)benzene, Tg: 124° C.) containing 7.0% by mass of Ir(ppy)$_3$, thickness: 15 nm], an electron transporting layer [TPBi (Tg: 124° C.), thickness: 50 nm], a cathode buffer layer made of a metal-based material [lithium fluoride (LiF), thickness: 1.5 nm], and a metal electrode [aluminum, thickness: 50 nm] were stacked on the surface of the diffraction grating on the glass substrate formed as described above, while being formed into such shapes that the shape of the first concavities and convexities formed on the surface of the diffraction grating was maintained. Thus, a laminate for an organic EL element in which glass substrate/diffraction grating/transparent electrode/hole transporting layer/first light emitting layer/second light emitting layer/electron transporting layer/cathode buffer layer made of metal-based material/metal electrode were stacked in this order was obtained (in the element, the organic layer had a layered structure of hole transporting layer/first light emitting layer/second light emitting layer/electron transporting layer). Note that steps of stacking these layers were as follows. Specifically, first, the transparent electrode was stacked by a sputtering method. Meanwhile, after a film of the transparent electrode was formed, the transparent electrode was exposed to an oxygen plasma to increase the work function (radical treatment). In addition, the hole transporting layer was stacked by a vacuum vapor deposition method. Moreover, the first light emitting layer was stacked by a co-vapor deposition method using TCTA and Ir(ppy)$_3$, with the amount of Ir(ppy)$_3$ introduced into the layer being adjusted to 7% by mass. Meanwhile, the second light emitting layer was stacked by a co-vapor deposition method using TPBi and Ir(ppy)$_3$, with the amount of Ir(ppy)$_3$ introduced into the layer being adjusted to 7% by mass. In addition, each of the electron transporting layer, the cathode buffer layer (lithium fluoride layer), and the metal electrode was stacked by a vacuum vapor deposition method. After the formation of the metal electrode, the standard deviation (σ) of the depth of the concavities and convexities, on the surface facing to the diffraction grating, of the metal electrode and the ratio of the change in the standard deviation of the depth of the concavities and convexities relative to the standard deviation of the first concavities and convexities formed on the surface of the diffraction grating were also determined. Table 11 shows the obtained values.

TABLE 11

| | Standard deviation of depth of concavities and convexities (Unit: nm) | Ratio of change in standard deviation of depth of concavities and convexities of each layer relative to standard deviation of first concavities and convexities |
|---|---|---|
| Diffraction grating (first concavities and convexities) | 19.32 | — |
| Transparent electrode (ITO) | 20.25 | 4.8% |

TABLE 11-continued

| | Standard deviation of depth of concavities and convexities (Unit: nm) | Ratio of change in standard deviation of depth of concavities and convexities of each layer relative to standard deviation of first concavities and convexities |
|---|---|---|
| Hole transporting layer (TCTA) | — | — |
| Light emitting layer (TCTA: Ir(ppy)$_3$) | — | — |
| Electron transporting layer (TPBi) | — | — |
| Metal electrode (Al: Second concavities and convexities on surface facing to diffraction grating) | 18.84 | −2.5% |

As is apparent from the results shown in Table 11, it was found that, in the organic EL element obtained in Example 4, the standard deviation (σ) of the depth of the concavities and convexities formed on the surface, facing to the diffraction grating, of the metal electrode was within a range from 15 to 100 nm (moreover, within a range from 15 to 50 nm), and the ratio of the change in the standard deviation of the depth of the concavities and convexities, on the surface facing to the diffraction grating, of the metal electrode relative to the standard deviation of the first concavities and convexities was within a range from +15% to −15%, indicating that the uniformity of the film thickness of each layer was extremely high. From these results, it was found that the organic EL element obtained in Example 3 satisfied the above-described conditions (A) to (C).

In addition, the light emission efficiencies of the organic EL elements obtained in Example 4 and Comparative Example 4 were measured in the same manner as in the method employed for measuring the light emission efficiencies of the above-described organic EL elements, to determine the current efficiency (CE) and the power efficiency (PE) of each of the organic EL elements obtained in Example 4 and Comparative Example 4. Table 12 shows the obtained results.

TABLE 12

| | Example 4 (diffraction grating: present) | Comparative Example 4 (diffraction grating: absent) |
|---|---|---|
| Current efficiency (CE) | 95.8 | 66.3 |
| Power efficiency (PE) | 84.2 | 49.5 |
| Improvement ratio of current efficiency (CE) ([Example 4]/[Comparative Example 4]) | 1.44 times | — |
| Improvement ratio of power efficiency (PE) ([Example 4]/[Comparative Example 4]) | 1.70 times | — |

As is apparent from the results shown in Table 12, a comparison of the organic EL element obtained in Example 4 with the organic EL element obtained in Comparative Example 4 has shown that the use of a diffraction grating sufficiently improves the light emission efficiencies. In addition, as is apparent from the results shown in Table 12, it has been found that when the above-described conditions (A) to (C) are satisfied, the light emission efficiencies are improved sufficiently. In addition, as is apparent from the results shown in Table 12, it was found that the improvement ratios of the current efficiency (CE) and the power efficiency (PE) of the organic EL element obtained in Example 4 were sufficiently high.

Example 5

A diffract ion grating (concavity and convexity layer) was manufactured on a glass substrate by employing the same method as in the diffraction grating formation step employed in Example 1. Subsequently, an organic EL element having a structure shown in FIG. 14 (a structure of optical member 15 (hemispherical lens)/transparent supporting substrate 10/diffraction grating 11/transparent electrode 12/hole transporting layer 131/first light emitting layer 132(a)/second light emitting layer 132(b)/electron transporting layer 133/cathode buffer layer 16/metal electrode 14 stacked in this order) was manufactured in the same manner as in Example 1, except that the above-described organic EL element formation step 2 (see Example 2) was conducted instead of the organic EL element formation step 1, and a hemispherical lens was disposed on the other surface of the glass substrate (the surface on the side opposite to the surface on which the diffraction grating was formed) as an optical member. Note that FIG. 14 shows an element of an embodiment in which multiple optical members are disposed. However, the element in this example had a structure in which a single hemispherical lens having a bottom surface area larger than the area of the light emission pixel was disposed as the optical member 15.

In addition, as a method for disposing the hemispherical lens serving as the optical member 15 on the other surface of the glass substrate (the surface on the side opposite to the surface on which the diffraction grating was formed), a method was employed in which a hemispherical lens (manufactured by Edmund) having a diameter of 5 mm was stacked on the surface of the glass substrate by using an uncured ultraviolet ray-curable epoxy resin (manufactured by Norland under the trade name of "NOA81") as an adhesive agent. The hemispherical lens was disposed with the central portion of the light emission pixel and the central portion of the bottom surface of the hemispherical lens coinciding with each other.

In addition, as in the case of Example 1, it was found that a Fourier-transformed image of the diffraction grating obtained in Example 5 showed a circular pattern substantially centered at an origin at which an absolute value of wavenumber was 0 µm$^{-1}$, and that, in the circular pattern, 90% or more of all the bright spots forming the Fourier-transformed image were present within a region where an absolute value of wavenumber was within a range of 10 µm$^{-1}$ or less. In addition, since the method for manufacturing the diffraction grating obtained in Example 5 was the same as that employed in Example 1, the diffraction grating obtained in Example 5 had characteristics such as the average value (m) of the depth distribution of the concavities and convexities, the standard deviation (σ) of the depth distribution of the concavities and convexities, the average height of the concavities and convexities of the diffraction grating, the average pitch of the concavities and convexities, the median (M) of the depth distribution of the concavities and convexities, and the kurtosis (k) of the concavities and convexities, which were the same as the characteristics in Example 1.

Note that, in the organic EL element formation step 2, after each of the transparent electrode, the hole transporting layer, the first light emitting layer, the second light emitting layer, and the electron transporting layer was formed, characteristics of the concavity and convexity shape on the surface, on the side opposite to the surface facing to the diffraction grating, of the layer were measured during the stacking of the layers. Thus, the standard deviation (σ) of the depth of the concavities and convexities of each of the layers and the ratio of the change in the standard deviation of the depth of the concavities and convexities of the layer relative to the standard deviation of the first concavities and convexities formed on the surface of the diffraction grating were determined. In addition, in the same manner as in Example 1, the standard deviation (σ) of the depth of the concavities and convexities, on the surface facing to the diffraction grating, of the metal electrode and the ratio of the change in the standard deviation of the depth of the concavities and convexities relative to the standard deviation of the first concavities and convexities formed on the surface of the diffraction grating were also determined. Note that the ratio of the change in the standard deviation of the depth of the concavities and convexities of each of the layers was determined by calculation according to the following formula:

[Ratio of change]={([Standard deviation of depth distribution of concavities and convexities of layer]–[Standard deviation of depth distribution of first concavities and convexities])/[Standard deviation of depth distribution of first concavities and convexities]}×100.

The obtained results were the same as those shown in Table 7. Specifically, in the organic EL element obtained in Example 5, the standard deviation (unit: nm) of the depth of the concavities and convexities of each of the layers was as follows: 19.32 (diffraction grating [first concavities and convexities]), 20.25 (transparent electrode [ITO]), 20.12 (hole transporting layer [TCTA]), 19.18 (first light emitting layer [TCTA:Ir(ppy)$_3$]), 19.50 (second light emitting layer [TPBi:Ir(ppy)$_3$]), 19.66 (electron transporting layer [TPBi]), and 19.54 (metal electrode [Al, second concavities and convexities on surface facing to diffraction grating]). Meanwhile, the ratio of the change in the standard deviation of the depth of the concavities and convexities of each of the layers relative to the standard deviation of the first concavities and convexities was as follows: 4.8% (transparent electrode), 4.1% (hole transporting layer), –0.7% (first light emitting layer), 0.9% (second light emitting layer), 1.8% (electron transporting layer), and 1.1% (metal electrode [second concavities and convexities on surface facing to diffraction grating]). Note that the organic EL element thus obtained in Example 5 was an organic EL element obtained in the same manner as in Example 2, except that the step of disposing a hemispherical lens was conducted (the organic EL element obtained in Example 5 was the same as the organic EL element obtained in Example 2, except that the hemispherical lens was further provided).

As is apparent from these results, it was found that, in the organic EL element obtained in Example 5, the standard deviations (σ) of the depths of the concavities and convexities formed on each of the transparent electrode, the hole transporting layer, the first light emitting layer, the second light emitting layer, and the electron transporting layer (the concavities and convexities formed on the surface on the side opposite to the surface facing to the diffraction grating) and the concavities and convexities formed on the surface, facing to the diffraction grating, of the metal electrode were each within a range from 15 to 100 nm (moreover, within a range from 15 to 50 nm), and the ratio of the change in the standard deviation of the depth of the concavities and convexities of each of the layers relative to the standard deviation of the first concavities and convexities was within a range from +15% to −15%, indicating that the uniformity of the film thickness of each of the layers was extremely high. From these results, it was found that the organic EL element obtained in Example 5 satisfied the above-described conditions (A) to (C).

Comparative Example 6

An organic EL element in which optical member (hemispherical lens)/glass substrate/transparent electrode (ITO)/hole transporting layer (TCTA)/first light emitting layer (TCTA: 7.0% by mass of Ir(ppy)$_3$)/second light emitting layer (TPBi: 7.0% by mass of Ir(ppy)$_3$)/electron transporting layer (TPBi)/cathode buffer layer (LiF)/metal electrode (Al) were stacked in this order was obtained in the same manner as in Example 5, except that no diffraction grating was formed, and a glass substrate, as it was, was used in the organic EL element formation step 2, instead of the glass substrate on which the diffraction grating was stacked.

[Measurement of Light Emission Efficiencies of Organic EL Elements Obtained in Examples 2 and 5 and Comparative Examples 4 and 6]

The light emission efficiencies of the organic EL elements obtained in Example 5 and Comparative Example 6 were measured in the same manner as in the method employed for measuring the light emission efficiencies of the organic EL elements obtained in Example 1 and Comparative Examples 1 to 3 described above, to determine the current efficiency (CE) and the power efficiency (PE) of each of the organic EL elements obtained in Example 5 and Comparative Example 6. Table 13 shows the obtained results. Note that Table 13 also shows the current efficiency (CE) and the power efficiency (PE) of each of the organic EL elements obtained in Example 2 and Comparative Example 4. In addition, Table 13 also shows calculation results of the improvement ratios (times) of the current efficiency (CE) and the power efficiency (PE) of the organic EL element obtained in Example 5 relative to the current efficiency (CE) and the power efficiency (PE) of each of the organic EL elements obtained in Example 2, Comparative Example 4, and Comparative Example 6.

and 5 with the organic EL element obtained in Comparative Example 4 shows that the organic EL elements (Examples 2 and 5) each using a diffraction grating satisfying the above-described condition (A) had sufficiently improved light emission efficiencies as compared with the organic EL element (Comparative Example 4) using no diffraction grating. In addition, as is apparent from the results shown in Table 13, a comparison of the organic EL element satisfying the conditions (A) to (C) obtained in Example 5 with the organic EL element obtained in Comparative Example 6 in which no diffraction grating was used but only the hemispherical lens was used has shown that a higher level of light emission efficiency can be achieved when the conditions (A) to (C) are satisfied. Moreover, considering that the difference between the organic EL elements obtained in Examples 2 and 5 is only the presence or absence of the hemispherical lens, it has been found that when the above-described conditions (A) to (C) are satisfied, and a hemispherical lens is provided on the light-extraction surface side of a glass substrate, the improvement ratios of the current efficiency (CE) and the power efficiency (PE) are achieved at higher levels. As described above, from the results shown in Table 13, it has been found that when the above-described conditions (A) to (C) are satisfied, and an optical member such as a hemispherical lens is provided on the light-extraction surface side of a glass substrate, the light emission efficiency of an organic EL element is improved to a higher level.

Example 6

A diffraction grating (concavity and convexity layer) was manufactured on a glass substrate by employing the same method as in the diffraction grating formation step employed in Example 1. Subsequently, an organic EL element having a structure of optical member (hemispherical lens)/transparent supporting substrate (glass substrate)/diffraction grating/transparent electrode (ITO)/hole transporting layer (TCTA)/light emitting layer (TCTA: 7.0% by mass of Ir(ppy)$_3$)/electron transporting layer (TpBi)/cathode buffer layer (LiF)/metal electrode (Al) stacked in this order was manufactured in the same manner as in Example 1, except that the above-

TABLE 13

|  | Example 5 | Comparative Example 6 | Example 2 | Comparative Example 4 |
|---|---|---|---|---|
| The presence or absence of diffraction grating and lens | Diffraction grating: present Lens: present | Diffraction grating: absent Lens: present | Diffraction grating: present Lens: absent | Diffraction grating: absent Lens: absent |
| Current efficiency (CE) | 146.5 | 112.8 | 89.7 | 66.3 |
| Power efficiency (PE) | 138.7 | 92.6 | 81.3 | 49.5 |
| Improvement ratio of current efficiency (CE) ([Example]/[Comparative Example or Example]) | Example 2: 1.63 times Comparative Example 6: 1.30 times Comparative Example 4: 2.21 times | — | — | — |
| Improvement ratio of power efficiency (PE) ([Example]/[Comparative Example or Example]) | Example 2: 1.71 times Comparative Example 6: 1.49 times Comparative Example 4: 2.80 times | — | — | — |

As is apparent from the results shown in Table 13, a comparison of the organic EL elements obtained in Examples 2 described organic EL element formation step 3 (see Example 3) was conducted instead of the organic EL element formation step 1, and a hemispherical lens was disposed as an optical member on the other surface of the glass substrate (the surface on the side opposite to the surface on which the diffraction grating was formed).

Note that as a method for disposing the hemispherical lens as the optical member 15 on the other surface of the glass substrate (the surface on the side opposite to the surface on which the diffraction grating was formed), a method was employed in which a hemispherical lens (manufactured by Edmund) having a diameter of 5 mm was stacked on the surface of the glass substrate by using an uncured ultraviolet ray-curable epoxy resin (manufactured by Norland under the trade name of "NOA81") as an adhesive agent. The hemispherical lens was disposed, with the central portion of the light emission pixel (3 mm in length×3 mm in width, 9 mm$^2$) and the central portion of the bottom surface of the hemispherical lens coinciding with each other.

In addition, as in the case of Example 1, it was found that a Fourier-transformed image of the diffraction grating obtained in Example 6 showed a circular pattern substantially centered at an origin at which an absolute value of wavenumber was 0 μm$^{-1}$, and that, in the circular pattern, 90% or more of all the bright spots forming the Fourier-transformed image were present within a region where an absolute value of wavenumber was within a range of 10 μm$^{-1}$ or less. In addition, since the method for manufacturing the diffraction grating obtained in Example 6 was the same as that employed in Example 1, the diffraction grating obtained in Example 6 had characteristics such as the average value (m) of the depth distribution of the concavities and convexities, the standard deviation (σ) of the depth distribution of the concavities and convexities, the average height of the concavities and convexities of the diffraction grating, the average pitch of the concavities and convexities, the median (M) of the depth distribution of the concavities and convexities, and the kurtosis (k) of the concavities and convexities, which were the same as the characteristics in Example 1.

Note that, in the organic EL element formation step 3, after each of the transparent electrode, the hole transporting layer, the light emitting layer, and the electron transporting layer was formed, characteristics of the concavity and convexity shape on the surface, on the side opposite to the surface facing to the diffraction grating, of the layer were measured during the stacking of the layers. Thus, the standard deviation (σ) of the depth of the concavities and convexities of each of the layers and the ratio of the change in the standard deviation of the depth of the concavities and convexities of the layer relative to the standard deviation of the first concavities and convexities formed on the surface of the diffraction grating were determined. In addition, the standard deviation (σ) of the depth of the concavities and convexities, on the surface facing to the diffraction grating, of the metal electrode and the ratio of the change in the standard deviation of the depth of the concavities and convexities relative to the standard deviation of the first concavities and convexities formed on the surface of the diffraction grating were also determined. Note that the ratio of the change in the standard deviation of the depth of the concavities and convexities of each of the layers was determined by calculation according to the following formula:

[Ratio of change]={([Standard deviation of depth distribution of concavities and convexities of layer]−[Standard deviation of depth distribution of first concavities and convexities])/[Standard deviation of depth distribution of first concavities and convexities]}×100.

The obtained results were the same as those shown in Table 9. Specifically, in the organic EL element obtained in Example 6, the standard deviation (unit: nm) of the depth of the concavities and convexities of each of the layers was as follows: 19.32 (diffraction grating [first concavities and convexities]), 20.25 (transparent electrode [ITO]), 20.22 (hole transporting layer [TCTA]), 20.14 (light emitting layer [TCTA:Ir(ppy)$_3$]), 19.93 (electron transporting layer [TPBi]), and 20.02 (metal electrode [Al, second concavities and convexities on surface facing to diffraction grating]). Meanwhile, the ratio of the change in the standard deviation of the depth of the concavities and convexities of each of the layers relative to the standard deviation of the first concavities and convexities was as follows: 4.8% (transparent electrode), 4.7% (hole transporting layer), 4.2% (light emitting layer), 3.1% (electron transporting layer), and 3.6% (metal electrode [second concavities and convexities on surface facing to diffraction grating]). Note that the organic EL element thus obtained in Example 6 was an organic EL element obtained in the same manner as in Example 3, except that the step of disposing the hemispherical lens was conducted (the organic EL element obtained in Example 6 was the same as the organic EL element obtained in Example 3, except that the hemispherical lens was further provided).

As is apparent from these results, it was found that, in the organic EL element obtained in Example 6, the standard deviations (σ) of the depths of the concavities and convexities formed on each of the transparent electrode, the hole transporting layer, the light emitting layer, and the electron transporting layer (the concavities and convexities formed on the surface on the side opposite to the surface facing to the diffraction grating) and the concavities and convexities formed on the surface, facing to the diffraction grating, of the metal electrode were each within a range from 15 to 100 nm (moreover, within a range from 15 to 50 nm), and the ratio of the change in the standard deviation of the depth of the concavities and convexities of each of the layers relative to the standard deviation of the first concavities and convexities was within a range from +15% to −15%, indicating that the uniformity of the film thickness of each of the layers was extremely high. From these results, it was found that the organic EL element obtained in Example 6 satisfied the above-described conditions (A) to (C).

Comparative Example 7

An organic EL element in which optical member (hemispherical lens)/glass substrate/transparent electrode (ITO)/hole transporting layer (TCTA)/light emitting layer (TCTA: 7.0% by mass of Ir(ppy)$_3$)/electron transporting layer (TPBi)/cathode buffer layer (LiF)/metal electrode (Al) were stacked in this order was obtained in the same manner as in Example 6, except that no diffraction grating was formed, and a glass substrate, as it was, was used in the organic EL element formation step 3, instead of the glass substrate on which the diffraction grating was stacked.

[Measurement of Light Emission Efficiencies of Organic EL Elements Obtained in Examples 3 and 6 and Comparative Examples 5 and 7]

The light emission efficiencies of the organic EL elements obtained in Example 6 and Comparative Example 7 were measured in the same manner as in the method employed for measuring the light emission efficiencies of the organic EL elements obtained in Example 1 and Comparative Examples 1 to 3 described above, to determine the current efficiency (CE) and the power efficiency (PE) of each of the organic EL elements obtained in Example 6 and Comparative Example 7. Table 14 shows the obtained results. Note that Table 14 also shows the current efficiency (CE) and the power efficiency (PE) of each of the organic EL elements obtained in Example 3 and Comparative Example 5. In addition, Table 14 also shows calculation results of the improvement ratios (times) of the current efficiency (CE) and the power efficiency (PE) of the organic EL element obtained in Example 6 relative to the current efficiency (CE) and the power efficiency (PE) of each of the organic EL elements obtained in Example 3 and Comparative Examples 5 and 7.

TABLE 14

|  | Example 6 | Comparative Example 7 | Example 3 | Comparative Example 5 |
|---|---|---|---|---|
| The presence or absence of diffraction grating and lens | Diffraction grating: present Lens: present | Diffraction grating: absent Lens: present | Diffraction grating: present Lens: absent | Diffraction grating: absent Lens: absent |
| Current efficiency (CE) | 113.5 | 66.4 | 67.7 | 43.5 |
| Power efficiency (PE) | 94.9 | 49.4 | 59.0 | 31.0 |
| Improvement ratio of current efficiency (CE) ([Example]/[Comparative Example or Example]) | Example 3: 1.68 times Comparative Example 7: 1.71 times Comparative Example 5: 2.61 times | — | — | — |
| Improvement ratio of power efficiency (PE) ([Example]/[Comparative Example or Example]) | Example 3: 1.61 times Comparative Example 7: 1.92 times Comparative Example 5: 3.06 times | — | — | — |

As is apparent from the results shown in Table 14, a comparison of the organic EL elements obtained in Example 3 and 6 with the organic EL element obtained in Comparative Example 5 shows that the organic EL elements (Examples 6 and 3) each using a diffraction grating satisfying the above-described condition (A) had sufficiently improved light emission efficiencies as compared with the organic EL element (Comparative Example 5) using no diffraction grating. In addition, a comparison of the organic EL element satisfying the conditions (A) to (C) obtained in Example 6 with the organic EL element obtained in Comparative Example 7 in which no diffraction grating was used but only the hemispherical lens was used has shown that light emission efficiencies can be achieved at higher levels, when the conditions (A) to (C) are satisfied. Note that, as is apparent from the results shown in Table 14, it is apparent from a comparison between the organic EL elements obtained in Example 3 and Comparative Example 5 that light emission efficiencies can be achieved at higher levels, when the conditions (A) to (C) are satisfied. Moreover, considering that the difference between the organic EL elements obtained in Examples 3 and 6 was only the presence or absence of the hemispherical lens, it has been found that when the above-described conditions (A) to (C) are satisfied, and a hemispherical lens is provided on the light-extraction surface side of a glass substrate, the improvement ratios of the current efficiency (CE) and the power efficiency (PE) are achieved at higher levels. As described above, it has been found from the results shown in Tables 10 and 14 that when the above-described conditions (A) to (C) are satisfied, and an optical member such as a hemispherical lens is provided on the light-extraction surface side of the glass substrate, the light emission efficiencies of an organic EL element are improved to higher levels.

From the results described above, first, it has been found that a sufficient diffraction effect can be obtained by using a diffraction grating satisfying the condition (A). Moreover, it was found that, in the organic EL elements obtained in Examples 1 to 3, 5, and 6 in which each of the organic materials forming the layers in the organic layer other than the phosphorescent material had a glass transition temperature of 70° C. or above, the standard deviation ($\sigma$) of the depth of the concavities and convexities formed on the surface, on the side facing to the metal electrode, of each of the layers in the organic layer was within a range from 15 to 100 nm (moreover, within a range from 15 to 50 nm), and the ratio of the change in the standard deviation of the depth of the concavities and convexities relative to the standard deviation of the first concavities and convexities was within a range from +15% to −15%, indicating that the uniformity of the film thickness of each of the layers was extremely high (note that, as described above, the characteristics of the concavity and convexity shape of the hole blocking layer (thickness: 5 nm) in Example 1 were not particularly evaluated; however, for the reason that the hole blocking layer in Example 1 was a layer having a sufficiently small thickness, the reason that the standard deviation of the concavities and convexities and the ratio of the change in the standard deviation of the electron transporting layer stacked on the hole blocking layer were within the above-described ranges, and the like, it is apparent that the standard deviation ($\sigma$) of the depth of the concavities and convexities formed on the surface, on the side facing to the metal electrode, of the hole blocking layer was within a range from 15 to 100 nm (moreover, within a range from 15 to 50 nm), and the ratio of the change in the standard deviation of the depth of the concavities and convexities relative to the standard deviation of the first concavities and convexities was within a range from +15% to −15%, and it can be seen that the hole blocking layer satisfied such conditions). In addition, it was found that, since the electrode buffer layer made of the metal material and the metal electrode were formed on such an organic layer having a high conformity to the first concavities and convexities by a vapor deposition method, the standard deviation ($\sigma$) of the depth of the concavities and convexities (second concavities and convexities) formed on the surface, on the side facing to the organic layer, of the metal electrode was within a range from 15 to 100 nm (moreover, within a range from 15 to 50 nm), and the ratio of the change in the standard deviation of the depth of the concavities and convexities relative to the standard deviation of the first concavities and convexities was within a range from +15% to −15% in each of the organic EL elements obtained Examples 1 to 3, 5, and 6. In addition, from the results described above, it has been found that an organic EL element of the present invention which comprises an optical member for extracting light to the outside on the light-extraction surface side of the glass substrate, and which satisfies the conditions (A) to (C) makes it possible to stably obtain a light extraction effect at a higher level because of the optical member and the diffraction grating.

Note that, as is apparent from the above-described results of Examples and Comparative Examples (the results shown in Tables 13 and 14, and the like), it has been found that an organic EL element (an organic EL element of the present invention) which satisfies all the conditions (A) to (C) and which has a structure further comprising an optical member such as a hemispherical lens on the light-extraction surface side of the transparent supporting substrate of the element can achieve a light extraction efficiency at an extremely high level. For this reason, it can be understood that if an optical member such as a hemispherical lens is disposed on the light-extraction surface side of the glass substrate of an organic EL element satisfying the above-described conditions (A) to (C) as obtained in Example 4, the organic EL element can also achieve a light emission efficiency at a higher level.

[Industrial Applicability]

As described above, according to the present invention, it is possible to provide an organic EL element which can achieve improvement in the light extraction efficiency thereof at a higher level and can achieve a light emission efficiency at a sufficiently high level.

Accordingly, the organic EL element of the present invention is particularly useful as an organic EL element used for illumination apparatuses etc., and the like.

[Reference Signs List]
10: transparent supporting substrate,
11: diffraction grating,
11': diffraction grating formation material,
12: transparent electrode,
13: organic layer,
13A and 13B: any layer in organic layer,
131: hole transporting layer,
132: light emitting layer,
132(a): first light emitting layer,
132(b): second light emitting layer,
133: electron transporting layer,
134: hole blocking layer,
14: metal electrode,
15: optical member,
16: cathode buffer layer (electron injection layer),
20: base member,
21: concavity and convexity layer made of first polymer segment,
22: seed layer,
23: metal layer (electroplating layer),
30: master member for transfer,
31: master block (mold) for forming diffraction grating,
P1 and P2: lowermost points of concave portions,
P3 and P4: vertices of convex portions,
X: thickness between concave portions,
Y: thickness between convex portions.

The invention claimed is:

1. An organic EL element comprising:
a transparent supporting substrate;
a diffraction grating which comprises a concavity and convexity layer having first concavities and convexities formed on a surface thereof and which is disposed on the transparent supporting substrate; and
a transparent electrode, an organic layer, and a metal electrode which are stacked in this order on the diffraction grating and formed into such shapes that a shape of the first concavities and convexities formed on the surface of the diffraction grating is maintained, the organic layer comprising at least a light emitting layer, wherein
the organic EL element satisfies the following conditions (A) to (C):
(A) when a Fourier-transformed image is obtained by performing two-dimensional fast Fourier transform processing on a concavity and convexity analysis image obtained by analyzing the shape of the first concavities and convexities by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 10 $\mu m^{-1}$ or less,
(B) standard deviations of depth distributions of the first concavities and convexities and second concavities and convexities are each 15 to 100 nm, the second concavities and convexities being formed on a surface, on a side facing to the organic layer, of the metal electrode, each of the standard deviations being determined on the basis of a concavity and convexity analysis image obtained by analyzing a shape of the corresponding concavities and convexities by use of an atomic force microscope, and
(C) a ratio of a change in the standard deviation of the depth distribution of the second concavities and convexities relative to the standard deviation of the depth distribution of the first concavities and convexities is +15% to −15%.

2. The organic EL element according to claim 1, wherein the diffraction grating is disposed on one surface side of the transparent supporting substrate, and
the organic EL element further comprises an optical member disposed on another surface side of the transparent supporting substrate.

3. The organic EL element according to claim 2, wherein the optical member comprises a lens member.

4. The organic EL element according to claims 1, wherein standard deviations of depth distributions of concavities and convexities formed on surfaces, on a side facing to the metal electrode, of the transparent electrode and each layer which is included in the organic layer and which has a thickness of 10 nm or more are each 15 to 100 nm, and
a ratio of a change in each of the standard deviations of the depth distributions of the concavities and convexities relative to the standard deviation of the depth distribution of the first concavities and convexities is +15% to −15%.

5. The organic EL element according to claims 1, wherein standard deviations of depth distributions of concavities and convexities formed on surfaces, on a side facing to the metal electrode, of the transparent electrode and each layer in the organic layer are each 15 to 100 nm, and
a ratio of a change in each of the standard deviations of the depth distributions of the concavities and convexities relative to the standard deviation of the depth distribution of the first concavities and convexities is +15% to −15%.

6. The organic EL element according to claims 1, wherein a material constituting the organic layer is an organic material having a glass transition temperature of 70° C. to 300° C.

7. The organic EL element according to claims 1, wherein the organic layer further comprises a hole transporting layer and an electron transporting layer, and the light emitting layer is a layer containing a phosphorescent material and a host material.

8. The organic EL element according to claim 7, wherein the light emitting layer has a two-layer structure of a first light emitting layer and a second light emitting layer, and the first light emitting layer and the second light emitting layer contain different host materials.

9. The organic EL element according to claim 8, wherein a material constituting the hole transporting layer and the host material of the first light emitting layer are the same, and a material constituting the electron transporting layer and the host material of the second light emitting layer are the same.

10. The organic EL element according to claim 7, wherein a material constituting the hole transporting layer and the host material of the light emitting layer are the same.

11. The organic EL element according to claims 7, wherein the host material in the light emitting layer is an organic material having a glass transition temperature of 100° C. to 300° C.

12. The organic EL element according to claims 1, wherein an average height of the first concavities and convexities is in a range from 20 to 400 nm.

13. The organic EL element according to claims 1, wherein an average pitch of the first concavities and convexities is in a range from 100 to 1500 nm.

14. The organic EL element according to claims 1, wherein the concavity and convexity layer of the diffraction grating is an inorganic layer.

* * * * *